(12) United States Patent
Hwang et al.

(10) Patent No.: US 12,408,325 B2
(45) Date of Patent: Sep. 2, 2025

(54) SEMICONDUCTOR DEVICE AND DATA STORAGE SYSTEM INCLUDING THE SAME

(71) Applicant: SAMSUNG ELECTRONICS CO., LTD., Suwon-si (KR)

(72) Inventors: Sungmin Hwang, Hwaseong-si (KR); Taewon Kang, Seoul (KR); Dongsung Woo, Suwon-si (KR); Taegon Lee, Seoul (KR); Bongtae Park, Seoul (KR); Jaejoo Shim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 427 days.

(21) Appl. No.: 17/709,803

(22) Filed: Mar. 31, 2022

(65) Prior Publication Data
US 2023/0026774 A1    Jan. 26, 2023

(30) Foreign Application Priority Data
Jul. 23, 2021 (KR) .......................... 10-2021-0096984

(51) Int. Cl.
*H01L 23/528* (2006.01)
*H01L 23/522* (2006.01)
(Continued)

(52) U.S. Cl.
CPC .......... *H10B 12/395* (2023.02); *H10B 12/50* (2023.02); *H01L 25/0657* (2013.01)

(58) Field of Classification Search
CPC ............ H01L 29/7808; H01L 29/7802; H01L 29/66712; H01L 29/788; H01L 29/42324; H01L 29/66825; H01L 29/792; H01L 2924/13081; H01L 2924/13085; H01L 29/6684; H01L 29/78391; H01L 29/4236; H01L 23/5226; H01L 23/5283; H01L 21/76816; H01L 21/76865; H01L 21/76877; H01L 21/76831; H10B 41/00; H10B 41/35; H10B 41/41; H10B 43/35;
(Continued)

(56) References Cited

U.S. PATENT DOCUMENTS

| | | | |
|---|---|---|---|
| 9,773,546 | B2 | 9/2017 | Lee et al. |
| 9,786,673 | B1 | 10/2017 | Cho et al. |

(Continued)

FOREIGN PATENT DOCUMENTS

| | | | | |
|---|---|---|---|---|
| CN | 115589725 A | * | 1/2023 | ......... H01L 23/5226 |
| CN | 115696918 A | * | 2/2023 | ....... H01L 27/10841 |

(Continued)

*Primary Examiner* — Ajay Ojha
*Assistant Examiner* — Tsz K Chiu
(74) *Attorney, Agent, or Firm* — Muir Patent Law, PLLC

(57) ABSTRACT

A semiconductor device and a data storage system including the same, the semiconductor device including a substrate structure; a stack structure; a vertical memory structure; a vertical dummy structure; and an upper separation pattern, wherein hen viewed on a plane at a first height level, higher than a height level of a lowermost end of the upper separation pattern, the dummy channel layer includes a first dummy channel region facing the dummy data storage layer and a second dummy channel region facing the dummy data storage layer, the first dummy channel region having a thickness different from a thickness of the second dummy channel region.

20 Claims, 40 Drawing Sheets

(51) Int. Cl.
*H01L 27/115* (2017.01)
*H10B 12/00* (2023.01)
*H01L 25/065* (2023.01)

(58) Field of Classification Search
CPC ........ H10B 43/40; H10B 43/10; H10B 43/50; H10B 20/40–65; H10B 53/20; H10B 41/20–27; H10B 43/20–27; H10B 51/20; H10B 63/84–845
See application file for complete search history.

(56) References Cited

U.S. PATENT DOCUMENTS

| | | | | |
|---|---|---|---|---|
| 10,050,057 | B2* | 8/2018 | Lee | ............... H10B 43/35 |
| 10,763,278 | B2* | 9/2020 | Yun | ............... H01L 23/535 |
| 11,744,082 | B2* | 8/2023 | Cho | ............... H10B 51/20 |
| | | | | 257/295 |
| 2013/0207182 | A1 | 8/2013 | Lee et al. | |
| 2015/0145014 | A1 | 5/2015 | Shin et al. | |
| 2016/0043100 | A1* | 2/2016 | Lee | ............... H01L 23/535 |
| | | | | 257/324 |
| 2017/0221813 | A1* | 8/2017 | Kim | ............... H01L 23/5226 |
| 2018/0102378 | A1* | 4/2018 | Lee | ............... H10B 43/40 |
| 2018/0151672 | A1* | 5/2018 | Choi | ............... H01L 29/7827 |
| 2019/0172840 | A1* | 6/2019 | Song | ............... H10B 43/10 |
| 2019/0312054 | A1* | 10/2019 | Yun | ............... H10B 43/10 |
| 2019/0355740 | A1* | 11/2019 | Hong | ............... H01L 21/76877 |
| 2020/0227435 | A1 | 7/2020 | Hwang et al. | |
| 2020/0273881 | A1* | 8/2020 | Kim | ............... H01L 23/5226 |
| 2020/0395375 | A1 | 12/2020 | Huo et al. | |
| 2021/0066337 | A1 | 3/2021 | Xia et al. | |
| 2021/0090994 | A1 | 3/2021 | Noh et al. | |
| 2021/0183885 | A1* | 6/2021 | Woo | ............... G11C 8/14 |
| 2021/0193678 | A1* | 6/2021 | Noh | ............... H10B 41/10 |
| 2021/0233928 | A1* | 7/2021 | Lee | ............... G11C 8/14 |
| 2021/0313427 | A1* | 10/2021 | Kim | ............... H01L 25/074 |
| 2022/0077129 | A1* | 3/2022 | Sung | ............... H01L 25/0657 |
| 2022/0399273 | A1* | 12/2022 | Yu | ............... H10B 41/10 |
| 2023/0058328 | A1* | 2/2023 | Lee | ............... H10B 43/27 |
| 2023/0117682 | A1* | 4/2023 | Roh | ............... H10B 41/40 |
| | | | | 257/314 |
| 2023/0171965 | A1* | 6/2023 | Lee | ............... H10B 41/40 |
| | | | | 257/314 |
| 2024/0090228 | A1* | 3/2024 | Choi | ............... H10B 41/27 |

FOREIGN PATENT DOCUMENTS

| | | |
|---|---|---|
| KR | 10-2013-0091949 A | 8/2013 |
| KR | 1020170031290 A | 3/2017 |
| KR | 1020180061554 A | 6/2018 |

\* cited by examiner

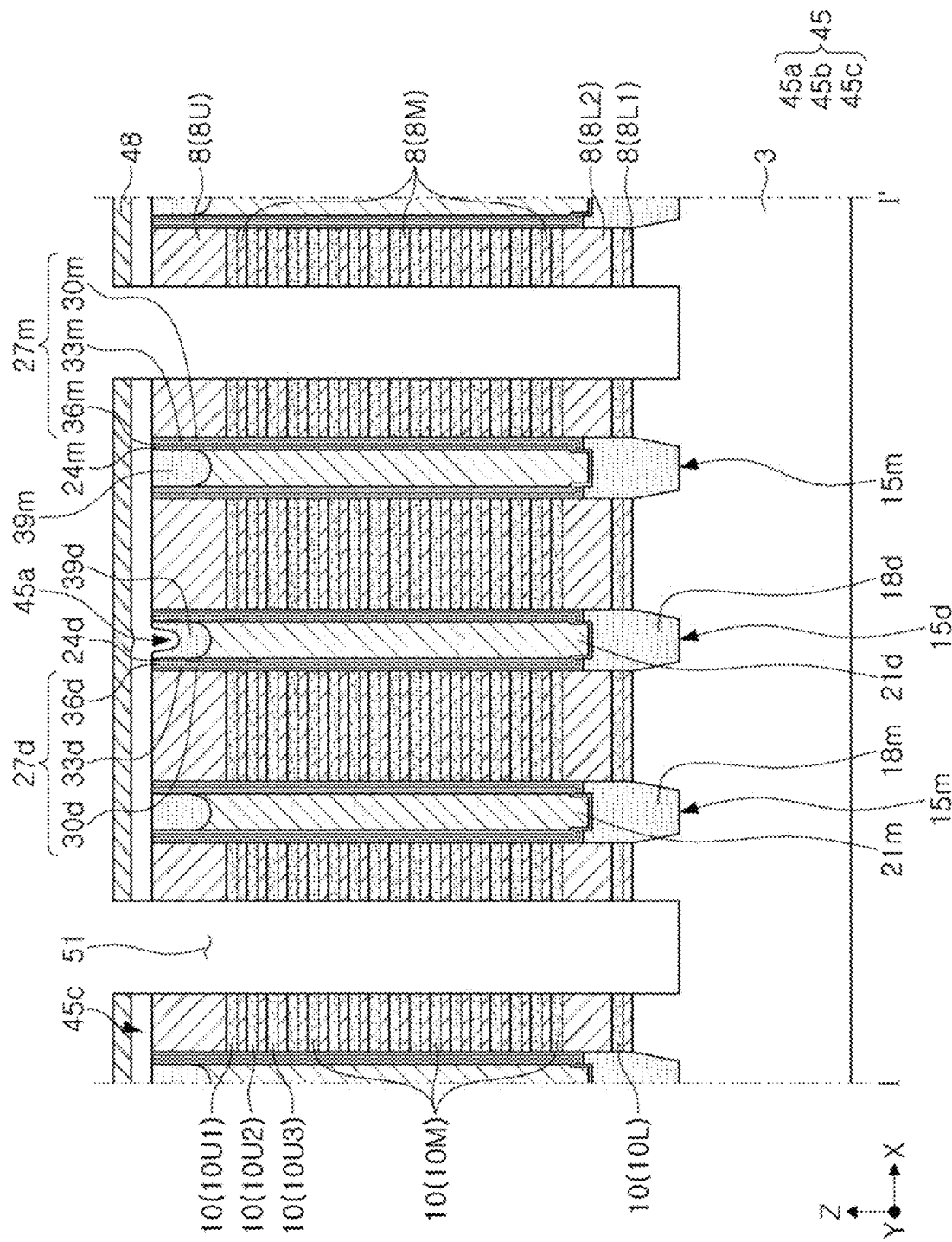

SEMICONDUCTOR DEVICE AND DATA STORAGE SYSTEM INCLUDING THE SAME

CROSS-REFERENCE TO RELATED APPLICATION

This application claims benefit of priority to Korean Patent Application No. 10-2021-0096984 filed on Jul. 23, 2021, in the Korean Intellectual Property Office, the disclosure of which is incorporated herein by reference in its entirety.

BACKGROUND

1. Field

Embodiments relate to a semiconductor device and a data storage system including the same.

2. Description of the Related Art

A semiconductor device for storing high-capacity data in an electronic system requiring data storage has been considered. Accordingly, measures for increasing the data storage capacity of a semiconductor device have been considered. For example, as one method for increasing data storage capacity of a semiconductor device, a semiconductor device including memory cells arranged three-dimensionally, rather than memory cells arranged two-dimensionally, has been considered.

SUMMARY

The embodiments may be realized by providing a semiconductor device including a substrate structure; a stack structure on the substrate structure and including interlayer insulating layers and gate electrodes alternately and repeatedly stacked in a vertical direction that is perpendicular to an upper surface of the substrate structure; a vertical memory structure penetrating through the stack structure in the vertical direction; a vertical dummy structure penetrating through the stack structure in the vertical direction; and an upper separation pattern on the stack structure, the upper separation pattern including a first portion and a second portion extending in a first direction, parallel to the upper surface of the substrate structure, the first portion intersecting the vertical dummy structure and the second portion extending from the first portion and penetrating through a portion of the stack structure, wherein the second portion of the upper separation pattern penetrates through a plurality of the gate electrodes, the vertical memory structure includes an insulating region, a channel layer on a side surface of the insulating region, a first dielectric layer on an external side surface of the channel layer, a data storage layer on an external side surface of the first dielectric layer, a second dielectric layer on an external side surface of the data storage layer, and a pad pattern on the insulating region, the vertical dummy structure includes a dummy insulating region, a dummy channel layer on a side surface of the dummy insulating region, a first dummy dielectric layer on an external side surface of the dummy channel layer, a dummy data storage layer on an external side surface of the first dummy dielectric layer, a second dummy dielectric layer on an external side surface of the dummy data storage layer, and a dummy pad pattern on the dummy insulating region, and when viewed on a plane at a first height level, higher than a height level of a lowermost end of the upper separation pattern, the dummy channel layer includes a first dummy channel region facing the dummy data storage layer and a second dummy channel region facing the dummy data storage layer, the first dummy channel region having a thickness different from a thickness of the second dummy channel region.

The embodiments may be realized by providing a semiconductor device including a substrate structure; a stack structure on the substrate structure and including interlayer insulating layers and gate electrodes alternately and repeatedly stacked in a vertical direction that is perpendicular to an upper surface of the substrate structure; a vertical memory structure penetrating through the stack structure in the vertical direction; a vertical dummy structure penetrating through the stack structure in the vertical direction; an upper separation pattern on the stack structure, the upper separation pattern including a first portion and a second portion extending in a first direction, parallel to the upper surface of the substrate structure, the first portion intersecting the vertical dummy structure and the second portion extending from the first portion and penetrating through a portion of the stack structure; a contact plug in contact with the vertical memory structure and on the vertical memory structure; and a bitline electrically connected to the contact plug and on the contact plug, wherein the second portion of the upper separation pattern penetrates through a plurality of upper gate electrodes of the gate electrodes, the vertical memory structure includes an insulating region, a channel layer on a side surface of the insulating region, a first dielectric layer on an external side surface of the channel layer, a data storage layer on an external side surface of the first dielectric layer, a second dielectric layer on an external side surface of the data storage layer, and a pad pattern on the insulating region, the vertical dummy structure includes a dummy insulating region, a dummy channel layer on a side surface of the dummy insulating region, a first dummy dielectric layer on an external side surface of the dummy channel layer, a dummy data storage layer on an external side surface of the first dummy dielectric layer, a second dummy dielectric layer on an external side surface of the dummy data storage layer, and a dummy pad pattern on the dummy insulating region, and when viewed on a plane at a first height level that higher than a height level of a lowermost surface of a lowermost one of the plurality of upper gate electrodes, and lower than a height level of a lowermost surface of the pad pattern, a thickness of the dummy channel layer of the vertical dummy structure is smaller than a thickness of the channel layer of the vertical memory structure.

The embodiments may be realized by providing a data storage system including a semiconductor device including an input/output pad; and a controller electrically connected to the semiconductor device through the input/output pad and configured to control the semiconductor device, wherein the semiconductor device includes a substrate structure, a stack structure on the substrate structure and including interlayer insulating layers and gate electrodes alternately and repeatedly stacked in a vertical direction, perpendicular to an upper surface of the substrate structure, a vertical memory structure penetrating through the stack structure in the vertical direction, a vertical dummy structure penetrating through the stack structure in the vertical direction, an upper separation pattern on the stack structure, the upper separation pattern including a first portion and a second portion extending in a first direction, parallel to the upper surface of the substrate structure, the first portion intersecting the vertical dummy structure and the second portion extending from the first portion and penetrating through a portion of the stack structure, a contact plug in contact with the vertical memory structure and on the vertical memory structure, and a bitline electrically connected to the contact plug and on the contact plug, the second portion of the upper separation pattern penetrates through a plurality of upper gate electrodes of the gate electrodes, the vertical memory structure includes an insulating region, a channel layer on a side surface of the insulating region, a first dielectric layer on an external side surface of the channel layer, a data storage layer on an external side surface of the first dielectric layer, a second dielectric layer on an external side surface of the data storage layer, and a pad pattern on the insulating region, the vertical dummy structure includes a dummy insulating region, a dummy channel layer on a side surface of the dummy insulating region, a first dummy dielectric layer on an external side surface of the dummy channel layer, a dummy data storage layer on an external side surface of the first dummy dielectric layer, a second dummy dielectric layer on an external side surface of the dummy data storage layer, and a dummy pad pattern on the dummy insulating region, when viewed on a plane at a first height level that is higher than a height level of a lowermost surface of a lowermost one of the plurality of upper gate electrodes, and lower than a height level of a lowermost surface of the pad pattern, the dummy channel layer of the vertical dummy structure includes a first dummy channel region having a first minimum thickness and a second dummy channel region having a first maximum thickness, when viewed on the plane at the first height level, the channel layer has a substantially uniform thickness, and the first maximum thickness of the second dummy channel region is smaller than the thickness of the channel layer of the vertical memory structure.

BRIEF DESCRIPTION OF DRAWINGS

Features will be apparent to those of skill in the art by describing in detail exemplary embodiments with reference to the attached drawings in which:

FIGS. 18A, 18B, 18C, 19A, 19B, 19C, 20A, 20B, 20C, 21A, 21B, 21C, 22A, 22B, and 22C are schematic cross-sectional views of stages in a method of fabricating a semiconductor device according to an example embodiment.

DETAILED DESCRIPTION

Hereinafter, terms such as "up," "upper portion," "upper surface," "down," "lower portion", "lower surface," "side surface," etc., may be understood as being referred to based on the drawings. Terms such as "upper'", "middle" and "lower" may be replaced with other terms, e.g., "first," "second" and "third," etc. to be used to describe elements of the specification. Terms such as "first" and "second" may be used to describe various elements, but the elements are not limited by the terms, e.g., the terms are merely for differentiation and are not intended to imply or require sequential inclusion, and a "first element" may be referred to as a "second element."

Figure 1:
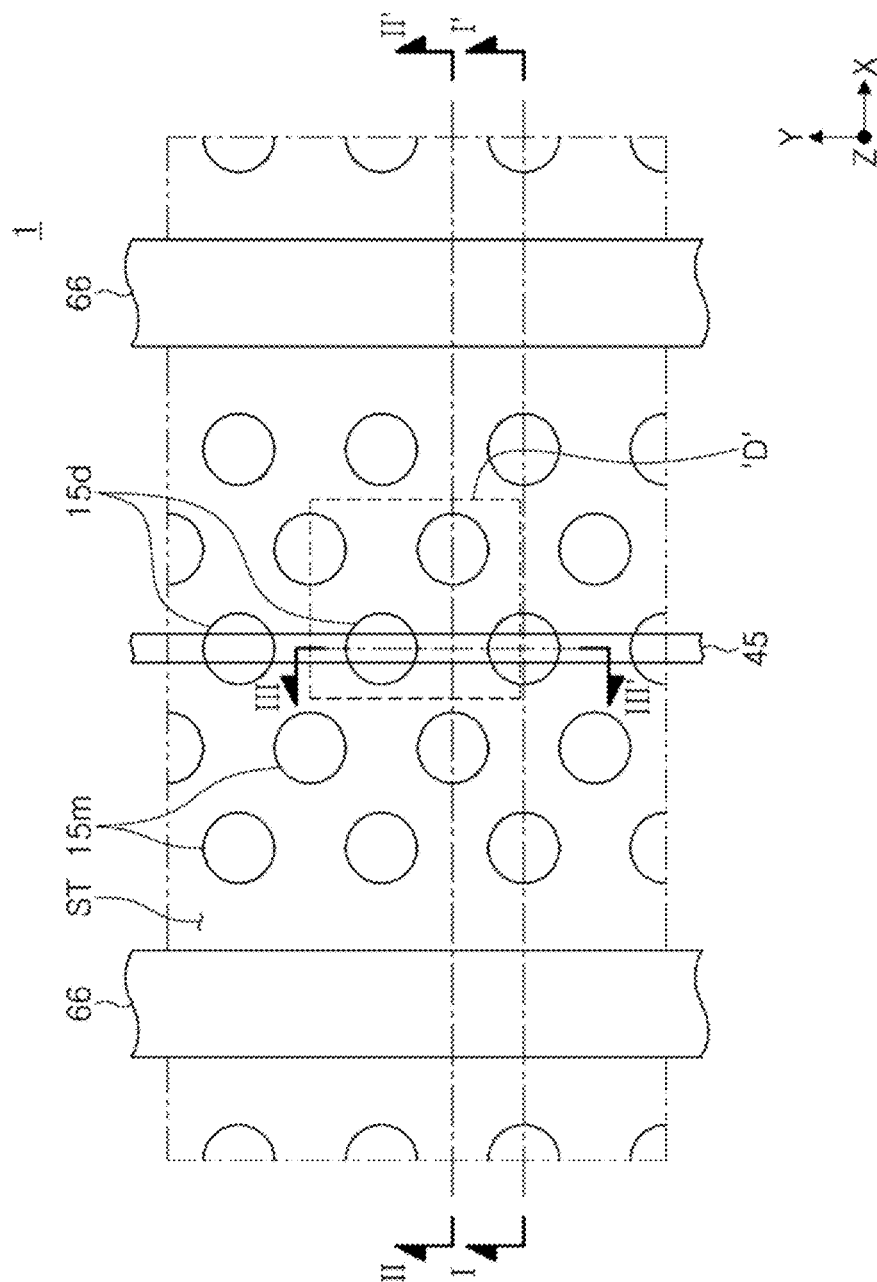
FIG. 1 is a schematic plan view of a semiconductor device according to example embodiments.
Figure 2:
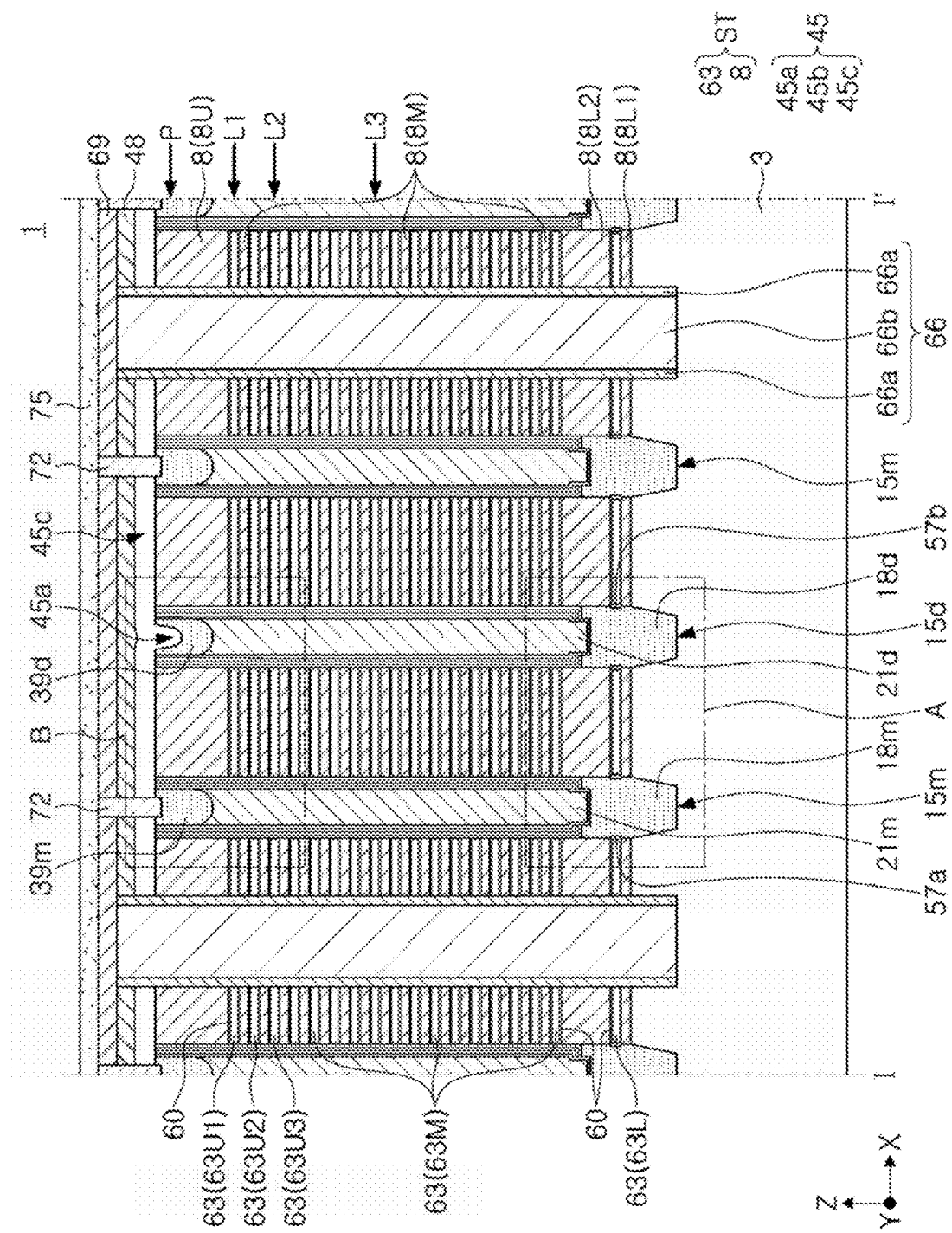
FIGS. 2, 3A, 3B, 4, 5, and 6 are schematic diagrams of a semiconductor device according to an example embodiment.
Figure 3A:
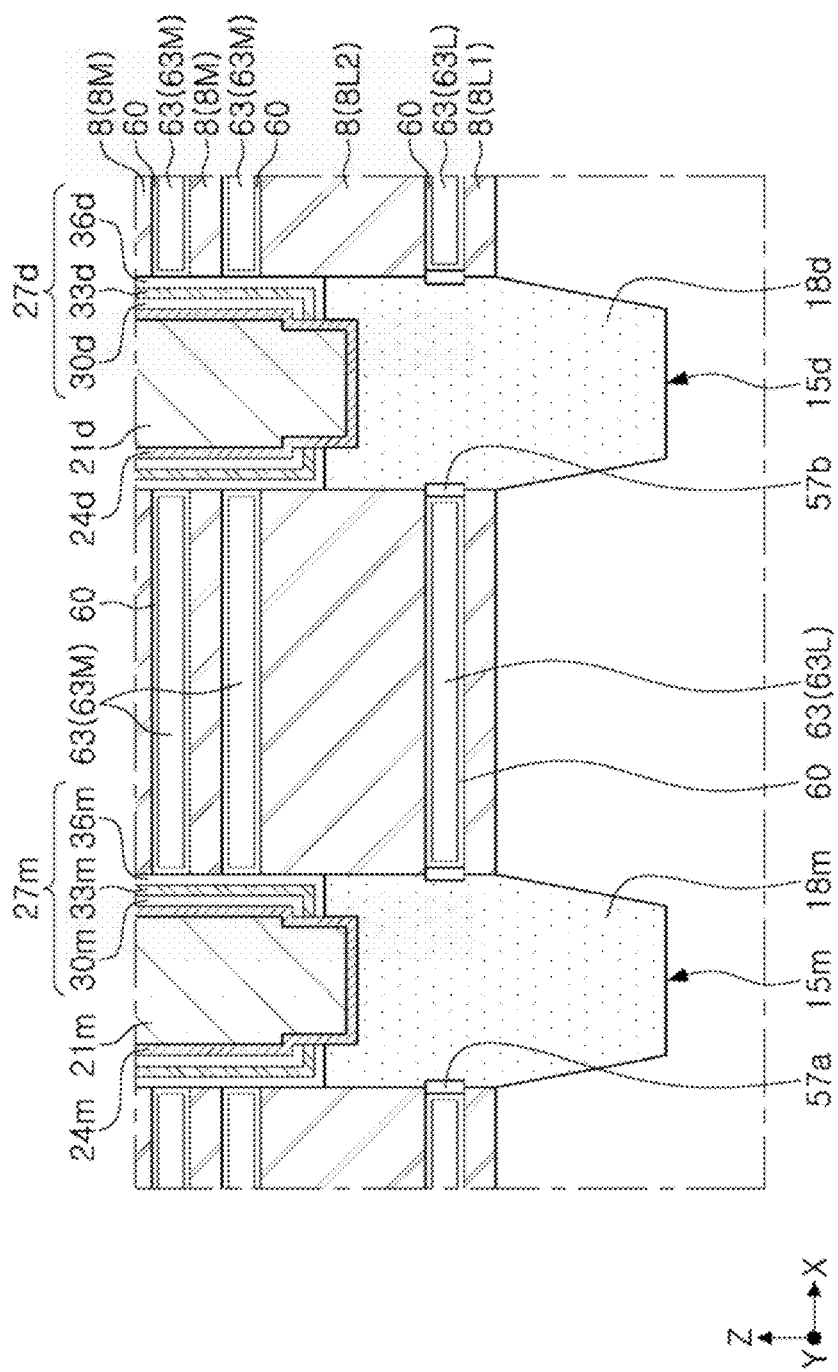
Figure 3B:
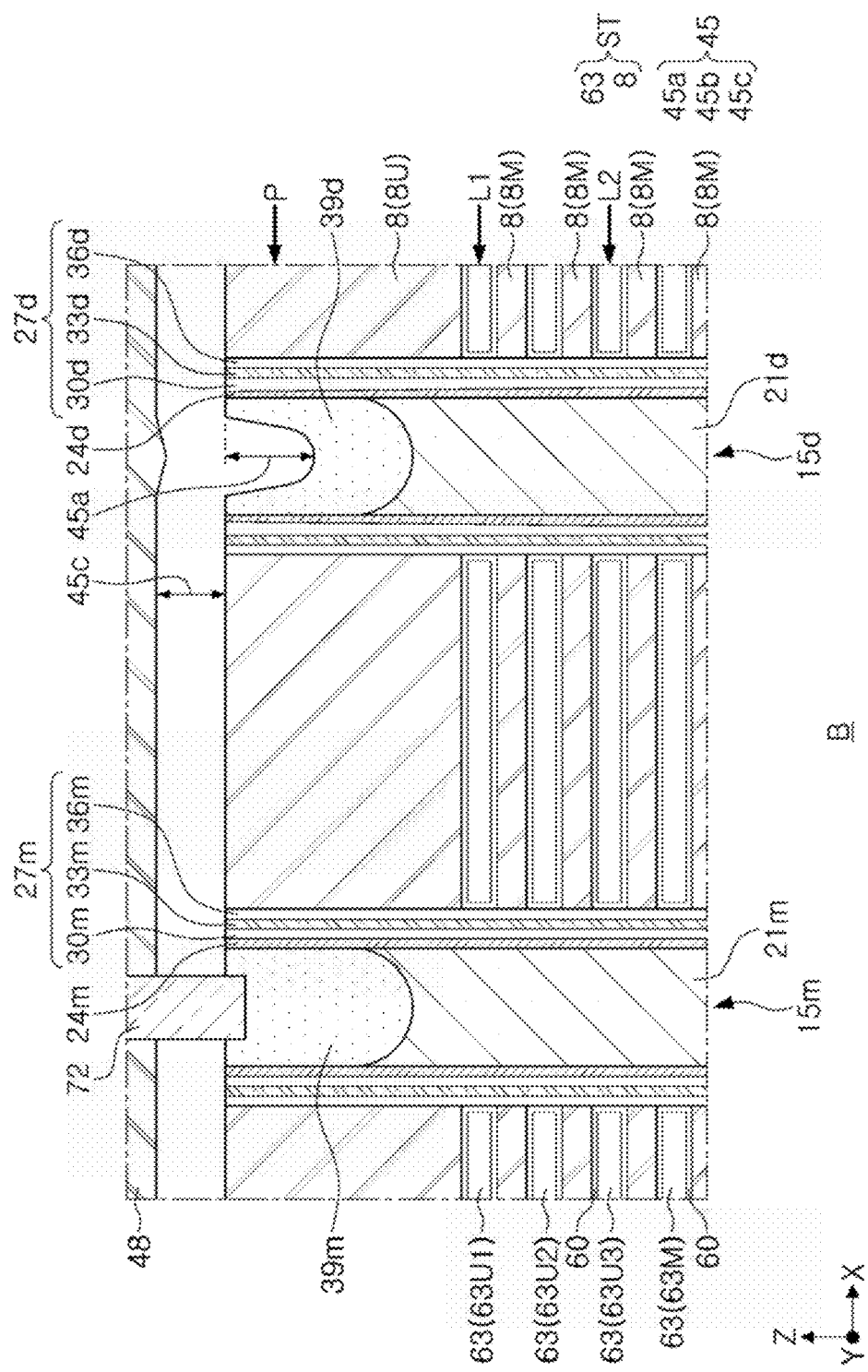
Figure 4:
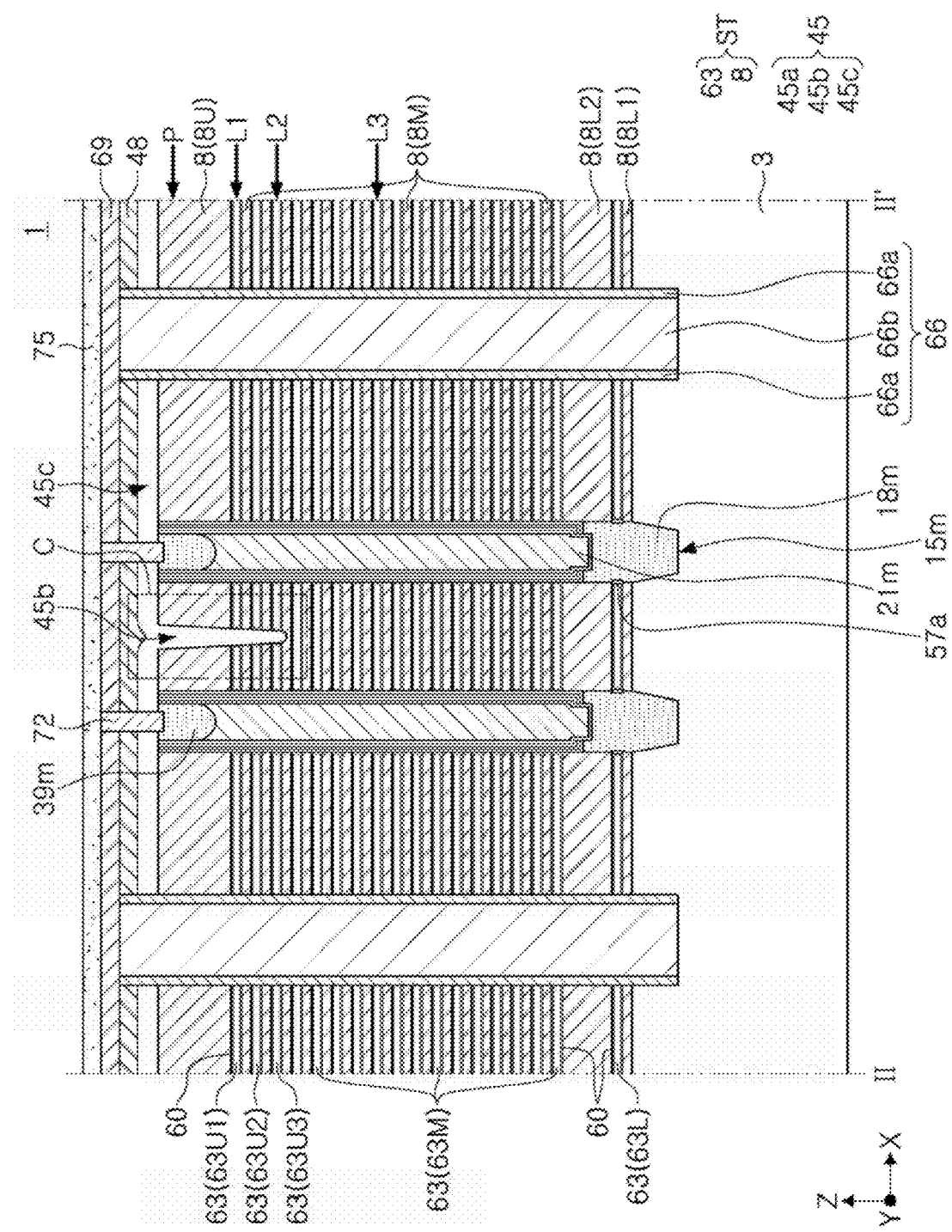
Figure 5:
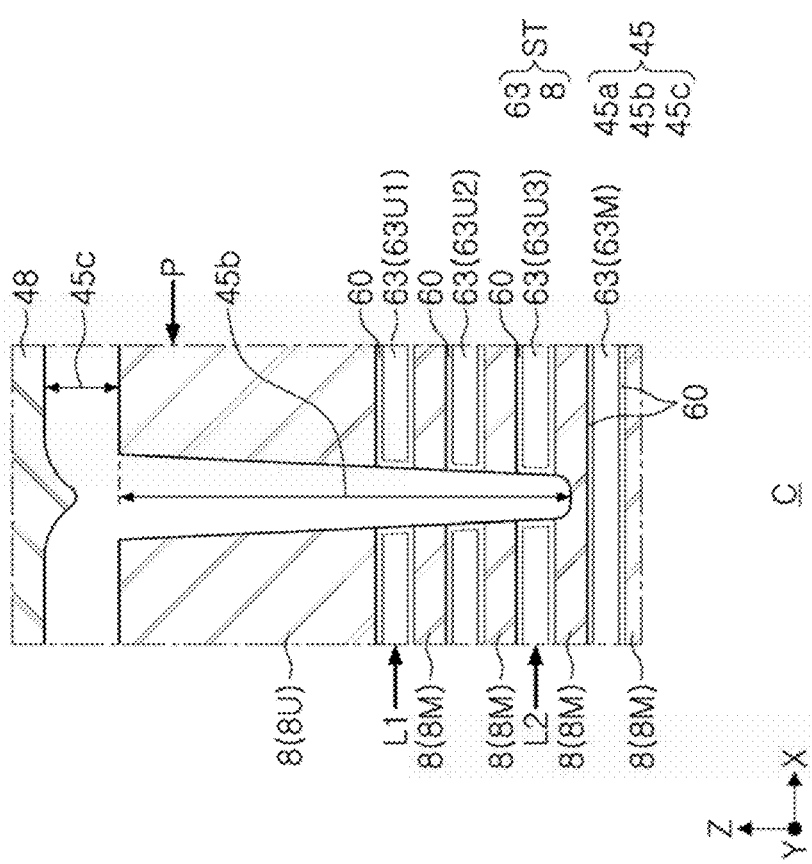
Figure 6:
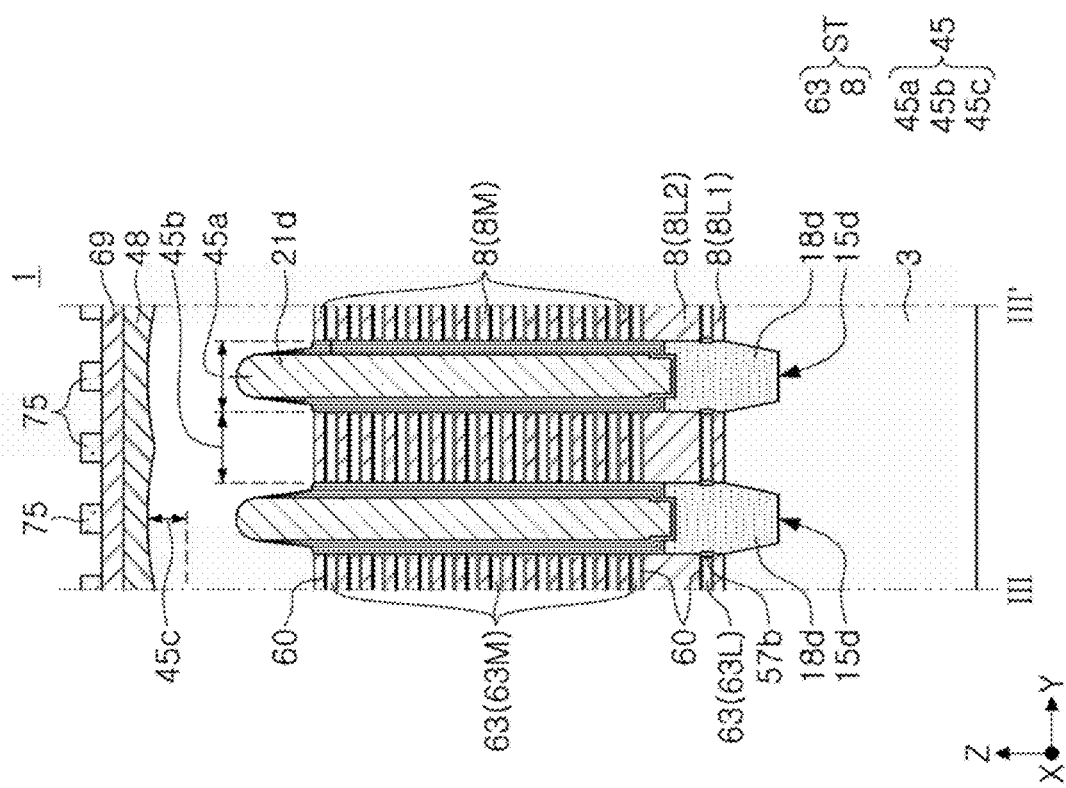

An example of a semiconductor device according to example embodiments will be described with reference to FIGS. 1 to 6. FIG. 1 is a schematic plan view of a semiconductor device according to example embodiments, and FIG. 2 is a cross-sectional view, taken along line I-I' of FIG. 1, of an example of a semiconductor device according to an example embodiment, FIG. 3A is a partially enlarged view of region "A" of FIG. 2, FIG. 3B is a partially enlarged view of region "B" of FIG. 2, FIG. 4 is a cross-sectional view, taken along line II-II' of FIG. 1, of an example of a semiconductor device according to an example embodiment, FIG. 5 is a partially enlarged view of region "C" of FIG. 4, and FIG. 6 is a cross-sectional view, taken along line III-III' of FIG. 1, of an example of a semiconductor device according to an example embodiment.

Referring to FIGS. 1 to 6, a semiconductor device 1 according to an example embodiment may include a substrate structure 3, a stack structure ST, vertical memory structures 15m, vertical dummy structures 15d, and an upper separation pattern 45.

The semiconductor device 1 may further include separation structures 66, upper insulating layers 48 and 69, contact plugs 72, and bitlines 75.

The substrate structure 3 may be a semiconductor substrate. The substrate structure 3 may be a silicon substrate. In an implementation, the substrate structure 3 may be a single-crystalline silicon substrate. At least a portion of the substrate structure 3 may be a region doped with an impurity, e.g., a doped region having N-type conductivity type or P-type conductivity type.

The stack structure ST may be on the substrate structure 3. The stack structure ST may include interlayer insulating layers 8 and gate electrodes 63 alternately and repeatedly stacked in a vertical direction Z, perpendicular to an upper surface of the substrate structure 3.

The interlayer insulating layers 8, which may be spaced apart from each other in the vertical direction Z, may include a lowermost interlayer insulating layer 8L1, a next lowermost interlayer insulating layer 8L2, an uppermost interlayer insulating layer 8U, and middle interlayer insulating layers 8M between the next lowermost interlayer insulating layer 8L2 and the uppermost interlayer insulating layer 8U. The next lowermost interlayer insulating layer 8L2 may have a thickness greater than a thickness of each of the lowermost interlayer insulating layer 8L1 and the middle interlayer insulating layers 8M. The uppermost interlayer insulating layer 8U may have a thickness greater than a thickness of each of the lowermost interlayer insulating layer 8L1 and the middle interlayer insulating layers 8M.

The gate electrodes 63 may include a lower gate electrode 63L, upper gate electrodes 63U1, 63U2, and 63U3, and middle gate electrodes 63M between the lower gate electrode 63L and the upper gate electrodes 63U1, 63U2, and 63U3.

The lower gate electrode 63L may be a lower select gate electrode. At least some of the upper gate electrodes 63U1, 63U2, and 63U3 may be upper select gate electrodes. At least a plurality of the middle gate electrodes 63M may be wordlines.

The upper gate electrodes 63U1, 63U2, and 63U3 may include a first upper gate electrode 63U1 in or at an uppermost portion, a second upper gate electrode 63U2 below the first upper gate electrode 63U1, and a third upper gate electrode 63U3 below the second upper gate electrode 63U2.

The interlayer insulating layers 8 may be formed of silicon oxide. The gate electrodes 63 may include, e.g., a doped silicon layer, a metal layer, a metal nitride layer, or a metal-semiconductor compound layer. In an implementation, the gate electrodes 63 may include, e.g., doped silicon, tungsten (W), ruthenium (Ru), molybdenum (Mo), nickel (Ni), nickel silicon (NiSi), cobalt (Co), cobalt silicon (CoSi), titanium (Ti), titanium nitride (TiN), or tungsten nitride (WN). As used herein, the term "or" is not an exclusive term, e.g., "A or B" would include A, B, or A and B.

The vertical memory structure 15m may include a plurality of vertical memory structures 15m. Hereinafter, one of the plurality of vertical memory structures 15m will be mainly described.

The vertical memory structure 15m may penetrate through the stack structure ST. The vertical memory structure 15m may penetrate through the stack structure ST and may be in contact with the substrate structure 3.

The vertical memory structure 15m may include an insulating region 21m, a channel layer 24m on a side surface of the insulating region 21m, a dielectric structure 27m on an external side surface of the channel layer 24m, and a pad pattern 39m on the insulating region 21m. The dielectric structure 27m may include a first dielectric layer 30m on the external side surface of the channel layer 24m, a data storage layer 33m on an external side surface of the first dielectric layer 30m, and a second dielectric layer 36m on an external side surface of the data storage layer 33m. The data storage layer 33m may be between the first dielectric layer 30m and the second dielectric layer 36m. The first dielectric layer 30m may be in contact with the channel layer 24m. The pad pattern 39m may be on or at a level higher (e.g., farther from the substrate structure 3 in the Z direction) than a level (e.g., distance from the substrate structure 3 in the Z direction) of an uppermost gate electrode (e.g., 63U1) of the gate electrodes 63.

The channel layer 24m may cover a side surface of the pad pattern 39m. The channel layer 24m may be in contact with the pad pattern 39m. The dielectric structure 27m may include a portion on or at the same height level as the pad pattern 39m.

The channel layer 24m may include a silicon layer. The insulating region 21m may include silicon oxide. The first dielectric layer 30m may include silicon oxide or silicon oxide doped with impurities. The second dielectric layer 36m may include silicon oxide or a high-k dielectric material. The data storage layer 33m may include a material trapping charges to store data, e.g., silicon nitride. The data storage layer 33m may include regions, storing data, in a semiconductor device such as a flash memory device. The pad pattern 39m may include doped polysilicon, a metal nitride (e.g., titanium nitride (TiN), or the like), a metal (e.g., tungsten (W), or the like), or a metal-semiconductor compound (e.g., TiSi (titanium silicon), or the like).

The vertical memory structure 15m may further include a channel pattern 18m.

The channel pattern 18m may be in contact with the substrate structure 3, may penetrate through the lowermost interlayer insulating layer 8L1 and the lowermost gate electrode 63L, and may extend inwardly of or relative to the lower interlayer insulating layer 8L2. The channel pattern 18m may include a portion buried in the substrate structure 3. The channel pattern 18m may be formed of an epitaxial material layer epitaxially grown from the substrate structure 3, e.g., an epitaxial silicon layer. An upper surface of the channel pattern 18m may be on a level higher than a level of the lowermost gate electrode 63L, and may be on a level lower than a level of an upper surface of the lower interlayer insulating layer 8L2.

The dielectric structure 27m, the channel layer 24m, and the insulating region 21m may be on the channel pattern 18m. The channel layer 24m may cover an external surface of the insulating region 21m and may cover a bottom surface of the insulating region 21m. The channel layer 24m may be in contact with the channel pattern 18m.

The vertical dummy structure 15d may include a plurality of the vertical dummy structures 15d. In an implementation, a plurality of vertical dummy structures 15d may be spaced apart from each other in a first direction Y, parallel to the upper surface of the substrate structure 3. Hereinafter, one of the plurality of vertical dummy structure 15d will be mainly described.

The vertical dummy structure 15d may penetrate through the stack structure ST. The vertical dummy structure 15d may penetrate through the stack structure ST and be in contact with the substrate structure 3.

The vertical dummy structure 15d may include a dummy insulating region 21d, a dummy channel layer 24d on a side surface of the dummy insulating region 21d, a dummy dielectric structure 27d on an external side surface of the dummy channel layer 24d, and a dummy pad pattern 39d on the dummy insulating region 21d. The dummy dielectric structure 27d may include a first dummy dielectric layer 30d on an external side surface of the dummy channel layer 24d, a dummy data storage layer 33d on an external side surface of the first dummy dielectric layer 30d, and a second dummy dielectric layer 36d on an external side surface of the dummy data storage layer 33d. The dummy data storage layer 33d may be between the first dummy dielectric layer 30d and the second dummy dielectric layer 36d. The first dummy dielectric layer 30d may be in contact with the dummy channel layer 24d. The dummy pad pattern 39d may be on a level higher than a level of an uppermost gate electrode (e.g., 63U1), among the gate electrodes 63.

The dummy channel layer 24d may cover a side surface of the dummy pad pattern 39d. The dummy channel layer 24d may be in contact with the dummy pad pattern 39d. The dummy dielectric structure 27d may include a portion on the same height level as the dummy pad pattern 39d.

The vertical dummy structure 15d may further include a dummy channel pattern 18d. The dummy channel pattern 18d may be in contact with the substrate structure 3, may penetrate through a lowermost interlayer insulating layer 8L1 and a lowermost gate electrode 63L, and may extend inwardly of or with respect to a lowermost interlayer insulating layer 8L2.

In an implementation, the vertical dummy structure 15d may be formed at the same time as the vertical memory structure 15m, and may include the same material layers as the vertical memory structure 15m. The dummy insulating region 21d, the dummy channel layer 24d, the dummy dielectric structure 27d, the dummy pad pattern 39d, and the dummy channel pattern 18d of the vertical dummy structure 15d may correspond to the insulating region 21m, the channel layer 24m, the dielectric structure 27m, the pad pattern 39m, and the channel pattern 18m of the vertical memory structure 15m, respectively. In an implementation, the dummy insulating region 21d may be formed of the same material as the insulating region 21m, the dummy channel layer 24d may be formed of the same material as the channel layer 24m, the dummy dielectric structure 27d may be formed of the same material as the dielectric structure 27m, the dummy pad pattern 39d may be formed of the same material as the pad pattern 39m, and the dummy channel pattern 18d may be formed of the same material as the channel pattern 18m.

The semiconductor device 1 may further include a first oxide layer 57a in contact with the channel pattern 18m between the lowermost gate electrode 63L and the channel pattern 18m, and a second oxide layer 57b in contact with the dummy channel pattern 18d between the lowermost gate electrode 63L and the dummy channel pattern 18d.

The upper separation pattern 45 may extend (e.g., lengthwise) in the first direction Y, parallel to the upper surface of the substrate structure 3, and may include a first portion 45a intersecting the vertical dummy structure 15d and a second portion 45b extending from the first portion 45a and penetrating through a portion of the stack structure ST. The upper separation pattern 45 may further include an upper portion 45c covering the upper surface of the stack structure ST. In the upper separation pattern 45, the first portion 45a, the second portion 45b, and the upper portion 45c may be integrated with each other (e.g., may have a one-piece, monolithic structure).

The second portion 45b of the upper separation pattern 45 may penetrate through the upper gate electrodes 63U1, 63U2, and 63U3. In an implementation, as illustrated in FIGS. 4 and 5, the second portion 45b of the upper separation pattern 45 may penetrate through the three upper gate electrodes 63U1, 63U2, and 63U3. In an implementation, the second portion 45b of the upper separation pattern 45 may penetrate through more than three upper gate electrodes.

The semiconductor device 1 may further include a gate dielectric layer 60 covering an upper surface and a lower surface of each of the gate electrodes 63 and between the vertical memory structure 15m and the gate electrodes 63, between the vertical dummy structure 15d and the gate electrodes 63, and between the upper gate electrodes 63U1, 63U2, and 63U3 and the upper separation pattern 45. The gate dielectric layer 60 may include, e.g., silicon oxide or a high-k dielectric material.

The upper insulating layers 48 and 69 may include a first upper insulating layer 48 on the upper portion 45c of the upper separation pattern 45 and a second upper insulating layer 69 on the first upper insulating layer 48.

The separation structures 66 may penetrate through the first upper insulating layer 48 and the stack structure ST. When viewed in a plan view, the separation structures 66 may have a linear shape extending in the first direction Y.

Each of the separation structures 66 may include a separation pattern 66b and a separation spacers 66a on side surfaces of the separation pattern 66b. The separation spacer 66a may be formed of an insulating material. The separation pattern 66b may be formed of a conductive material. In an implementation, the separation pattern 66b may be formed of an insulating material.

The contact plug 72 may penetrate through the first and second upper insulating layers 48 and 69 and the upper portion 45c, and may be in contact with the pad pattern 39m of the vertical memory structure 15m.

The bitline 75 may be electrically connected to the contact plug 72 on the second upper insulating layer 69. The bitline 75 may have a linear shape, parallel to an upper surface of the substrate structure 3, and may extend in a second direction X, perpendicular to the first direction Y.

The data storage layer 33m and the dummy data storage layer 33d may have substantially the same thickness.

The second dielectric layer 30m and the first dummy dielectric layer 30d may have substantially the same thickness.

The first dielectric layer 36m and the second dummy dielectric layer 36d may have substantially the same thickness, e.g., as measured at or on the same height level as at least one of the middle gate electrodes 63M.

The channel layer 24m and the dummy channel layer 24d may have substantially the same thickness, e.g., as measured at or on the same height level as at least one of the middle gate electrodes 63M.

The dummy data storage layer 33d may be divided into dummy data storage portions spaced apart from each other in the second direction X by the upper separation pattern 45, at any one height level that is higher (e.g., farther from the substrate structure 3 in the Z direction) than that of a lower end of the upper separation pattern 45.

A portion of the dummy pad pattern 39d may be divided into pad portions, spaced apart from each other in the second direction X by the first portion 45a of the upper separation pattern 45, on any one height level, higher than that of a lower end of the upper separation pattern 45.

The dummy channel layer 24d may include a portion having a thickness different from a thickness of the channel layer 24m, as measured at or on a height level that is higher than a level of the lower end of the upper separation pattern 45. In an implementation, the channel layer 24m and the dummy channel layer 24d may have different thicknesses at the same height level as at least one of the upper gate electrodes 63U1, 63U2, and 63U3. In an implementation, the dummy channel layer 24d may have a thickness smaller than that of the channel layer 24m at the same height level as at least one of the upper gate electrodes 63U1, 63U2, and 63U3.

The dummy channel layer 24d may include a portion of which thickness is decreased at a point along the vertical direction Z from the lower end of the upper separation pattern 45 toward the upper end of the upper separation pattern 45. The channel layer 24*m* may have a substantially uniform thickness at a point along the vertical direction Z from the lower end of the upper separation pattern 45 toward the upper end of the upper separation pattern 45.

The second dummy dielectric layer 36*d* may include a portion having a thickness different from a thickness of the first dielectric layer 36*m* at a height level that is higher than a height level of the lower end of the upper separation pattern 45. In an implementation, the second dummy dielectric layer 36*d* and the first dielectric layer 36*m* may have different thicknesses at the same height level as at least one of the upper gate electrodes 63U1, 63U2, and 63U3. In an implementation, the thickness of the second dummy dielectric layer 36*d* may be greater than the thickness of the first dielectric layer 36*m*.

The second dummy dielectric layer 36*d* may include a portion of which thickness is increased at different points along the vertical direction Z from the lower end of the upper separation pattern 45 toward the upper end of the upper separation pattern 45. The first dielectric layer 36*m* may have a substantially uniform thickness at different points along the vertical direction Z from the lower end of the upper separation pattern 45 toward the upper end of the upper separation pattern 45.

The dummy channel layer 24*d* may include dummy channel regions having different thicknesses and the second dummy dielectric layer 36*d* may include dummy dielectric regions having different thicknesses at a height level, higher than the lower end of the upper separation pattern 45.

Figure 7A:
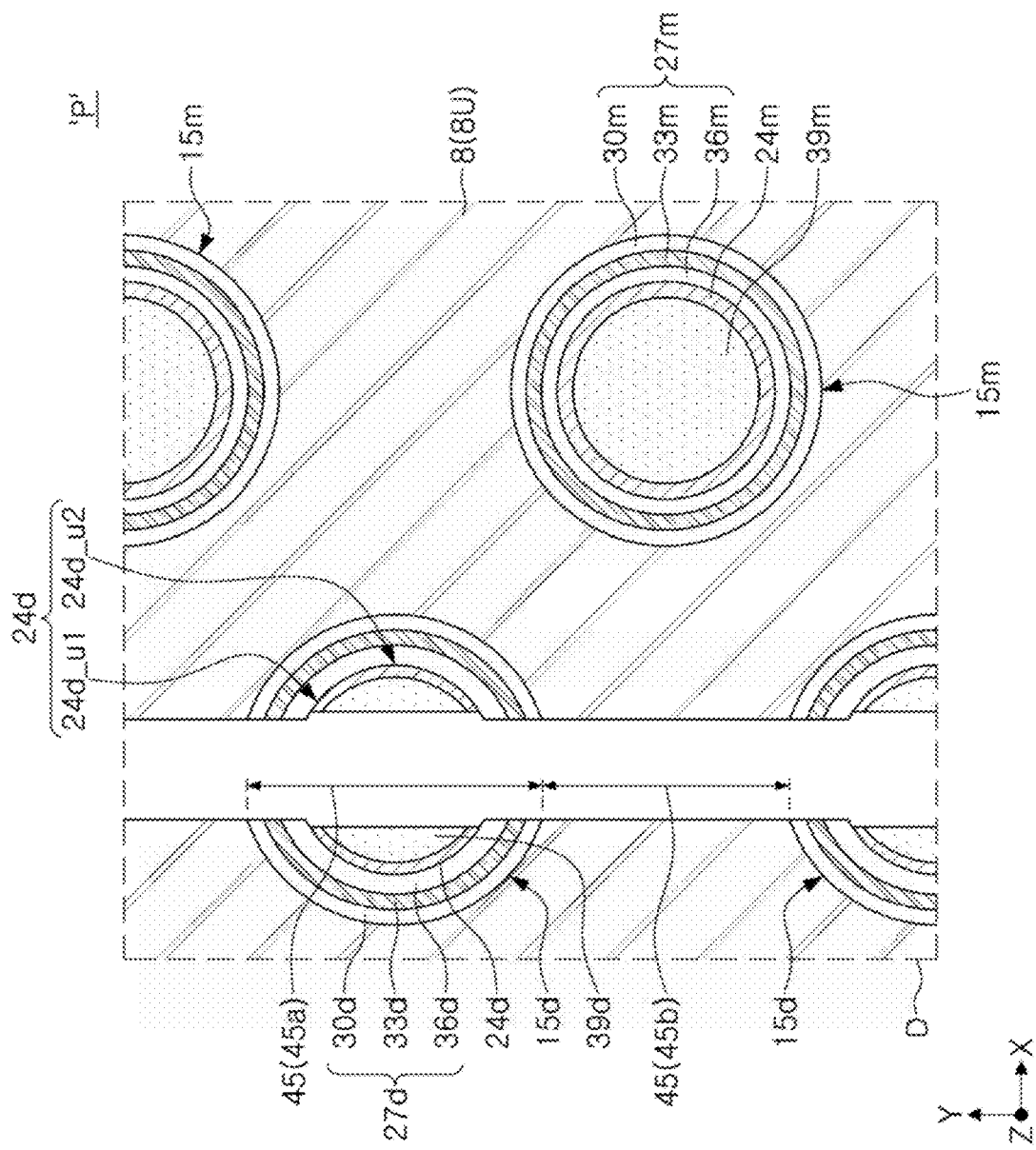
FIGS. 7A, 7B, 7C, and 7D are schematic plan views of a semiconductor device according to an example embodiment.
Figure 7B:
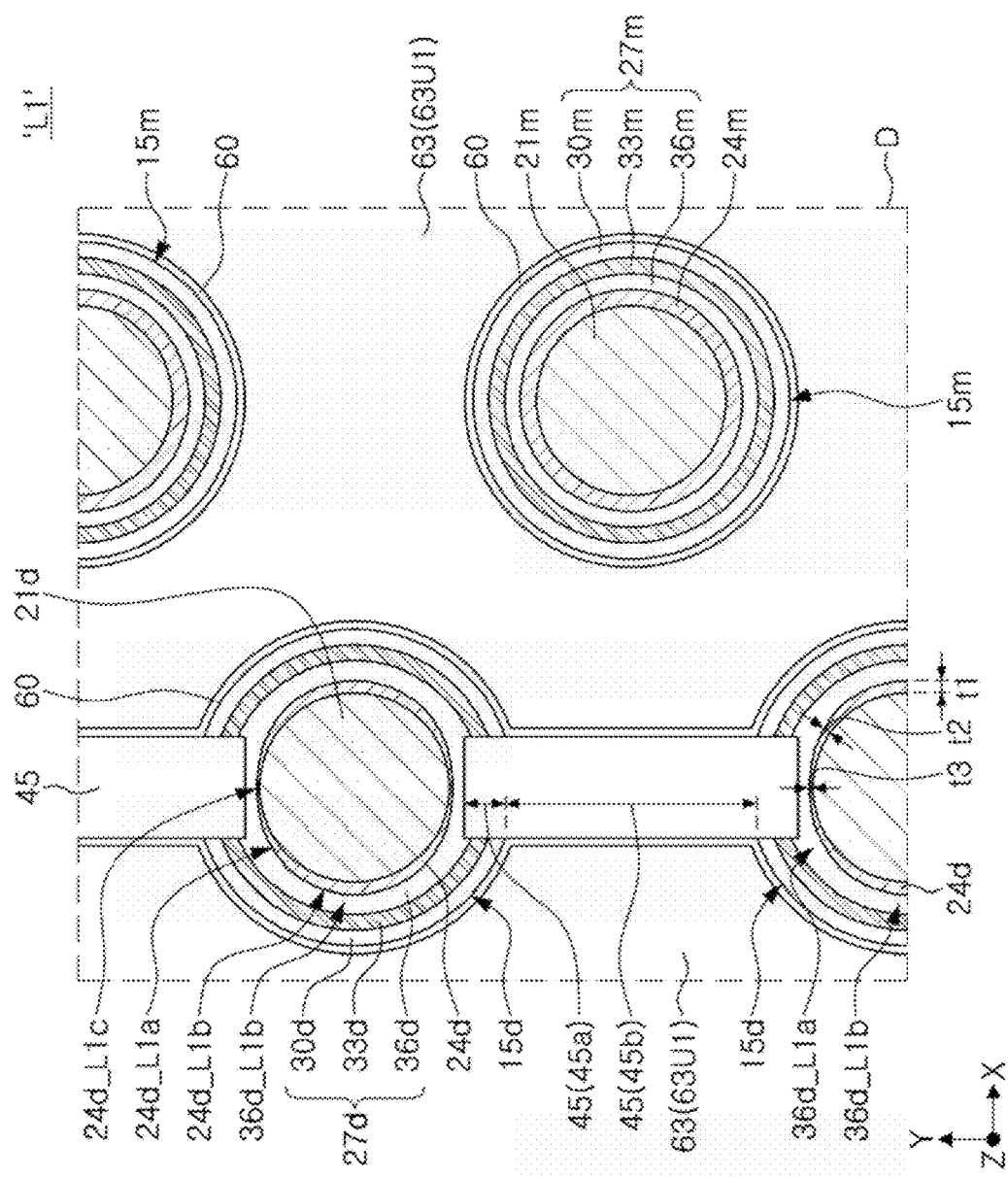
Figure 7C:
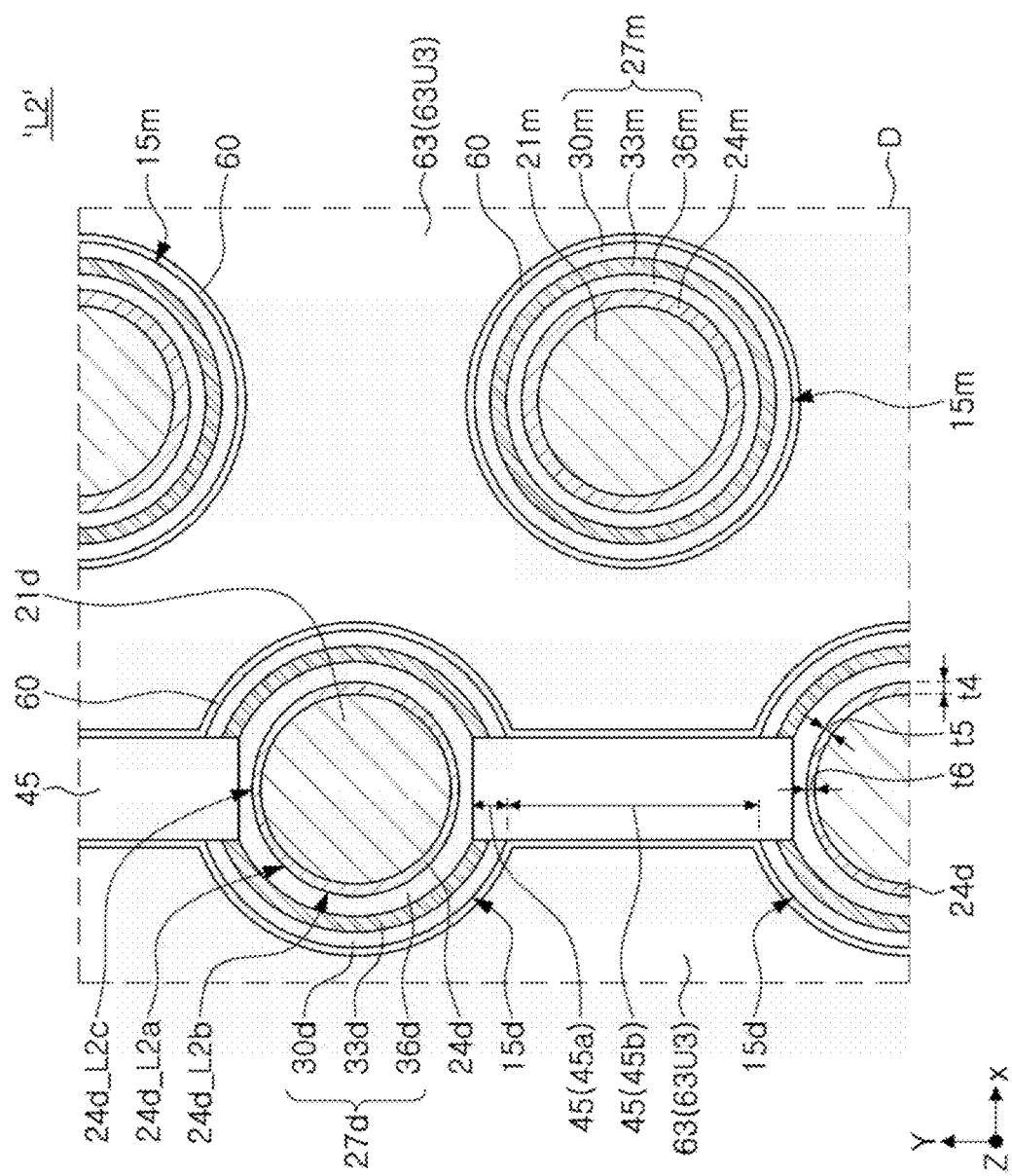
Figure 7D:
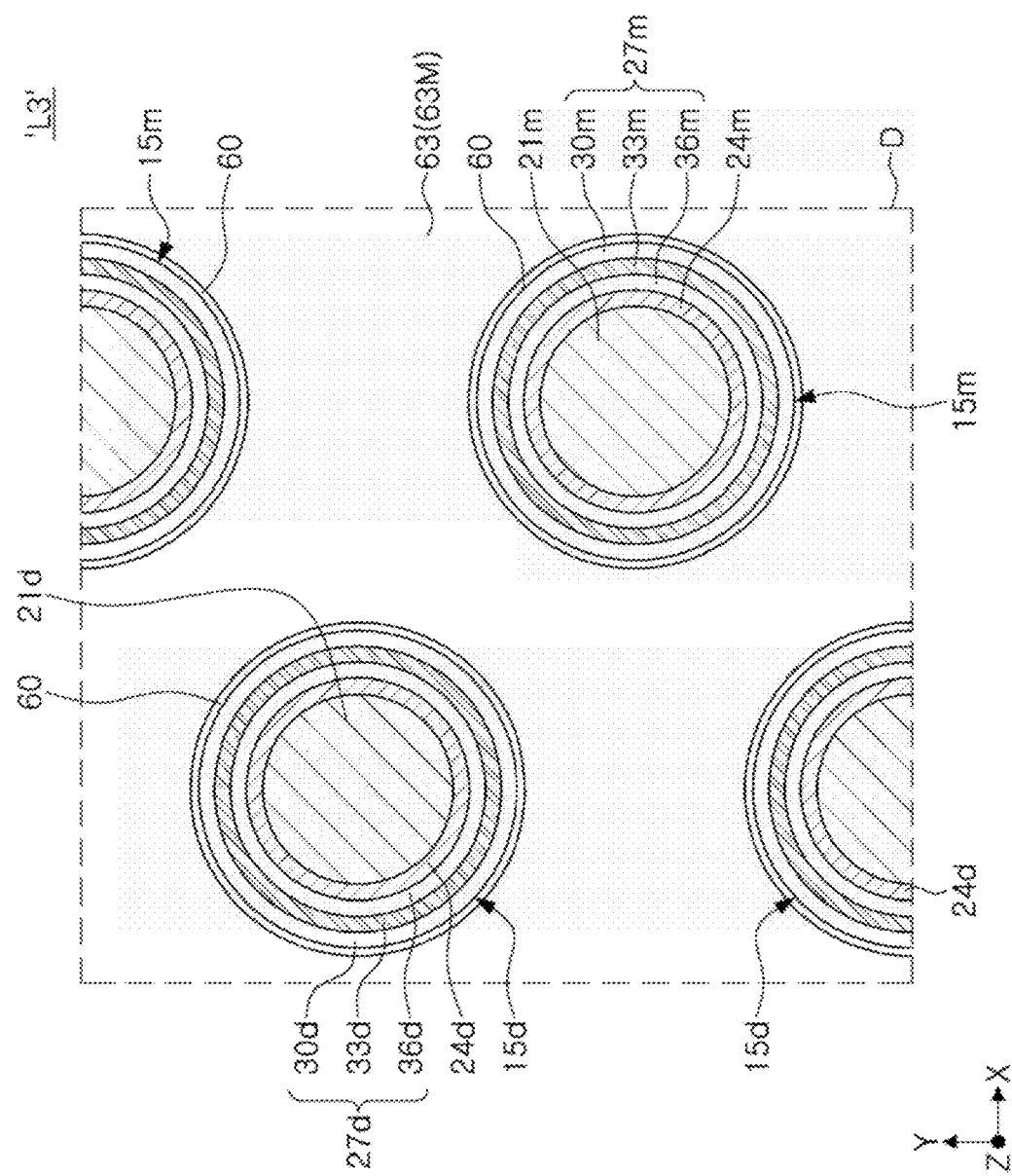

Next, planar shapes at different height levels of the semiconductor device according to an example embodiment will be described with reference to FIGS. 7A, 7B, 7C and 7D. FIGS. 7A, 7B, 7C, and 7D are plan views of planar shapes at different height levels in region "D" of FIG. 1. For example, FIG. 7A is a schematic plan view of region "D" of FIG. 1 at a height level P of the first portion 45*a* of the upper separation pattern 45, FIG. 7B is a schematic plan view of region "D" of FIG. 1 at a first height level L1 of the first upper gate electrode 63U1, FIG. 7C is a schematic plan view of region "D" of FIG. 1 at the second height level L2 of a third upper gate electrode 63U3, and FIG. 7D is a schematic plan view of region "D" of FIG. 1 at the third height level L3 of a middle gate electrode 63M.

Referring to FIG. 7A, when viewed in plan view, the vertical dummy structure 15*d* may be divided by the first portion 45*a* of the upper separation pattern 45 at a height level of the first portion 45*a* of the upper separation pattern 45, e.g., at a height level P between the upper end and the lower end of the first portion 45*a*. A maximum width of the first portion 45*a* in the second direction X may be greater than a maximum width of the second portion 45*b* in the second direction X, at the height level P.

When viewed in plan view, the dummy channel layer 24*d* may include dummy channel regions 24*d*_u1 and 24*d*_u2 having different thicknesses at the height level P. Among the dummy channel regions 24*d*_u1 and 24*d*_u2 having different thicknesses, a dummy channel region 24*d*_u1 having a relatively lower thickness may be adjacent to the first portion 45*a*.

When viewed in plan view, the dummy channel layer 24*d* may have a thickness smaller than that of the channel layer 24*m* at the height level P.

When viewed in plan view, the second dummy dielectric layer 36*d* may have a thickness greater than that of the first dielectric layer 36*m* at the height level P.

When viewed in plan view, the dummy data storage layer 33*d* may have substantially the same thickness as the data storage layer 33*m* at the height level P.

Referring to FIG. 7B, when viewed on a plane at a first height level L1 higher than the height level of the lower end of the upper separation pattern 45, the upper separation pattern 45 may divide each of the dummy data storage layer 33*d* and the first dummy dielectric layer 30*d*. In an implementation, the dummy data storage layer 33*d* may be divided into dummy data storage portions spaced apart from each other in the second direction X by the first portion 45*a* of the upper separation pattern 45.

In an implementation, the first height level L1 may be the same as the height level of the first upper gate electrode 63U1. In an implementation, the first height level L1 may be lower than the height level of the first upper gate electrode 63U1 or higher than the height level of the first upper gate electrode 63U1.

When viewed on a plane at the first height level L1, the gate dielectric layer 60 may be between the vertical memory structure 15*m* and the first upper gate electrode 63U1, between the vertical dummy structure 15*d* and the first upper gate electrode 63U1, and between the upper separation pattern 45 and the first upper gate electrode 63U1.

When viewed on the plane at the first height level L1, the first dummy data storage layer 33*d* may have a substantially uniform thickness.

When viewed on the plane on the first height level L1, the first dummy data storage layer 33*d* and the data storage layer 33*m* may have substantially the same thickness.

When viewed on the plane at the first height level L1, the dummy channel layer 24*d* may include a first dummy channel region 24*d*_L1*a* and a second dummy channel region 24*d*_L1*b* having different thicknesses (e.g., in a region facing or radially aligned with the dummy data storage layer 33*d*). A thickness t2 of the first dummy channel region 24*d*_L1*a* may be smaller than a thickness t1 of the second dummy channel region 24*d*_L1*b*. A distance between the first dummy channel region 24*d*_L1*a* and the upper separation pattern 45 may be less than a distance between the second dummy channel region 24*d*_L1*b* and the upper separation pattern 45.

When viewed on the plane at the first height level L1, the first dummy channel region 24*d*_L1*a* of the dummy channel layer 24*d* may include a portion having a gradually increased or increasing width.

When viewed on the plane at the first height level L1, the second dummy dielectric layer 36*d* may include a first dummy dielectric region 36*d*_L1*a* between the first dummy channel region 24*d*_L1*a* and the dummy data storage layer 33*d* and a second dummy dielectric region 36*d*_L1*b* between the second dummy channel region 24*d*_L1*b* and the dummy data storage layer 33*d*. A thickness of the first dummy dielectric region 36*d*_L1*a* may be greater than a thickness of the second dummy dielectric region 36*d*_L1*b*.

When viewed on the plane at the first height level L1, the dummy channel layer 24*d* may further include a dummy channel region 24*d*_L1*c* facing (e.g., radially aligned with) the upper separation pattern 45. The dummy channel region 24*d*_L1*c* may have a smallest thickness t3 in the dummy channel layer 24*d*. In an implementation, a thickness t3 of the dummy channel region 24*d*_L1*c* may be smaller than a thickness t2 of the first dummy channel region 24*d*_L1*a* and a thickness t1 of the second dummy channel region 24*d*_L1*b*.

When viewed on the plane at the first height level L1, the dummy channel layer 24*d* may have a ring shape.

When viewed on the plane at the first height level L1, a minimum thickness or a maximum thickness of the dummy channel layer 24d having a non-uniform thickness may be smaller than a thickness of the channel layer 24m having a substantially uniform thickness. In an implementation, when viewed on a plane at the first height level L1, the maximum thickness of the dummy channel layer 24d, e.g., the maximum thickness of the second dummy channel region 24d_L1b may be smaller than the thickness of the channel layer 24m.

When viewed on the plane at the first height level L1, a maximum thickness of the second dummy dielectric layer 36d may be greater than a thickness of the first dielectric layer 36m having a substantially uniform thickness.

When viewed on the plane at the first height level L1, the dummy channel layer 24d may have a ring shape and, in the dummy channel layer 24d, a thickness t3 of the dummy channel region 24d_L1c at a center of the vertical dummy structure 15d in the first direction Y may be smaller than a thickness t1 of the second dummy channel region 24d_L1b at the center of the vertical dummy structure 15d in the second direction X.

Referring to FIG. 7C, when viewed on a plane at a second height level L2 higher than the lower end of the upper separation pattern 45 and lower than the first height level L1, the upper separation pattern 45 may divide each of the dummy data storage layer 33d and the first dummy dielectric layer 30d. In an implementation, the dummy data storage layer 33d may be divided into first and second dummy data storage portions spaced apart from each other in the second direction X by the first portion 45a of the upper separation pattern 45.

In an implementation, the second height level L2 may be the same as the height level of the third upper gate electrode 63U3. In an implementation, the second height level L2 may be a height level at a position higher than the height level of the third upper gate electrode 63U3 and lower than the height level of the first upper gate electrode 63U1.

When viewed on a plane at the second height level L2, the gate dielectric layer 60 may be between the vertical memory structure 15m and the third upper gate electrode 63U3, between the vertical dummy structure 15d and the third upper gate electrode 63U3, and between the upper separation pattern 45 and the third upper gate electrode 63U3.

When viewed on the plane at the second height level L2, the first dummy data storage layer 33d may have a substantially uniform thickness.

When viewed on the plane at the second height level L2, the first dummy data storage layer 33d and the data storage layer 33m may have substantially the same thickness.

When viewed on the plane at the second height level L2, the dummy channel layer 24d may include a third dummy channel region 24d_L2a and a fourth dummy channel region 24d_L2b having different thicknesses (e.g., in regions facing or radially aligned with the dummy data storage layer 33d). A thickness t5 of the third dummy channel region 24d_L2a may be smaller than a thickness t4 of the fourth dummy channel region 24d L2b. A distance between the third dummy channel region 24d L2a and the upper separation pattern 45 may be smaller than a distance between the fourth dummy channel region 24d_L2b and the upper separation pattern 45.

When viewed on the plane at the second height level L2, in the second dummy dielectric layer 36d, a thickness between the third dummy channel region 24d L2a and the dummy data storage layer 33d may be greater than a thickness between the fourth dummy channel region 24d_L2b and the dummy data storage layer 33d.

When viewed on the plane at the second height level L2, the dummy channel layer 24d may further include a dummy channel region 24d_L2c facing the upper separation pattern 45. The dummy channel region 24d_L2c may have a smallest thickness in the dummy channel layer 24d, e.g., a minimum thickness t6. In an implementation, the thickness t6 of the dummy channel region 24d_L2c may be smaller than the thickness t5 of the third dummy channel region 24dL2a and the thickness t4 of the fourth dummy channel region 24d_L2b.

When viewed on the plane at the second height level L2, the dummy channel layer 24d may have a ring shape.

When viewed on the plane at the second height level L2, a minimum thickness or a maximum thickness of the dummy channel layer 24d may be smaller than a thickness of the channel layer 24m (e.g., which may have a substantially uniform thickness).

When viewed on the plane at the second height level L2, a maximum thickness of the second dummy dielectric layer 36d may be greater than a thickness of the first dielectric layer 36m (which may have a substantially uniform thickness).

The minimum thickness t6 of the dummy channel layer (24d of FIG. 7C) at the second height level L2 may be greater than the minimum thickness t3 of the dummy channel layer (24d of FIG. 7B) at the first height level L1.

The maximum thickness of the second dummy dielectric layer 36d at the second height level L2 may be smaller than the maximum thickness of the second dummy dielectric layer 36d at the first height level L1.

When viewed on the plane at the second height level L2, the dummy channel layer 24d may have a ring shape and, in the dummy channel layer 24d, the thickness t6 of the dummy channel region 24d_L2c at the center of the vertical dummy structure 15d in the first direction Y may be smaller than the thickness t4 of the fourth dummy channel region 24d_L2b at the center of the vertical dummy structure 15d in the second direction X.

Referring to FIG. 7D, at a height level lower than the height level of the lower end of the upper separation pattern 45, e.g., at a same height level L3 as one of the middle gate electrodes 63M, the dummy channel layer 24d and the channel layer 24m may have substantially the same thickness, the second dummy dielectric layer 36d and the first dielectric layer 36m may have substantially the same thickness, and the dummy data storage layer 33d and the data storage layer 33m may have substantially the same thickness.

Figure 8:
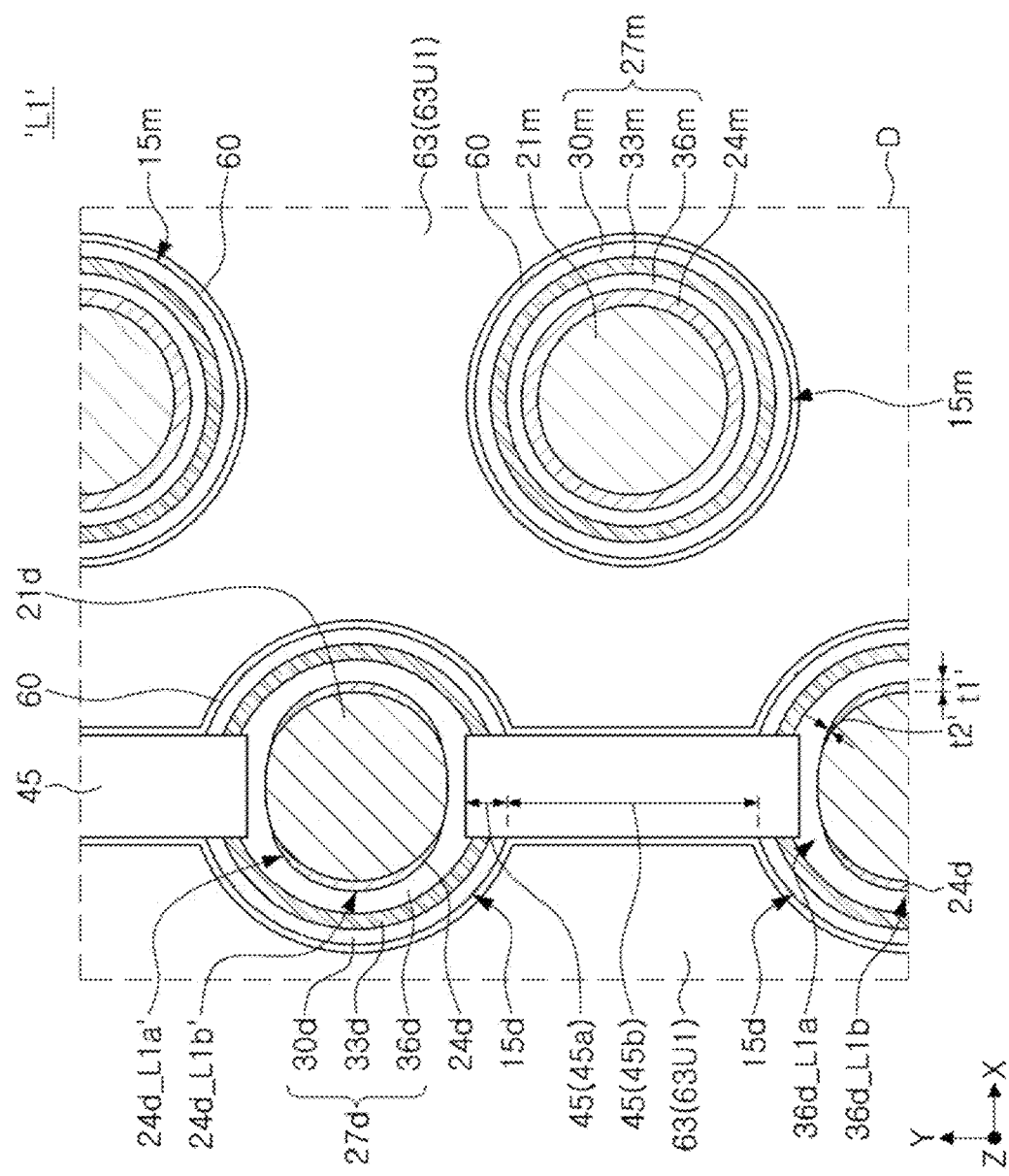
FIG. 8 is a schematic plan view of a modified example of a semiconductor device according to an example embodiment.

Next, a modified example of the semiconductor device according to an example embodiment will be described with reference to FIG. 8. FIG. 8 is a schematical plan view of region "D" of FIG. 1 at a first height level L1 of a first upper gate electrode 63U1.

Referring to FIG. 8, when viewed on the plane at the first height level L1 as described with reference to FIG. 7B, the dummy data storage layer 33d may include dummy data storage portions spaced apart from each other in the second direction X.

When viewed on the plane at the first height level L1, the dummy channel layer 24d may include dummy channel portions spaced apart from each other in the second direction X.

When viewed on the plane at the first height level L1, each of the dummy channel portions of the dummy channel layer 24d may include a first dummy channel region 24d_L1a' having a first thickness t2' and a second dummy channel region 24d_L1a' having a second thickness t1'. The second thickness t1' may be greater than the first thickness t2'.

When viewed on the plane at the first height level L1, the first thickness t2' may be a minimum thickness of the dummy channel layer 24d, and the second thickness t1' may be a maximum thickness of the dummy channel layer 24d.

When viewed on the plane at the first height level L1, at least one of the dummy channel portions of the dummy channel layer 24d may include a dummy channel region having a gradually increased width. In an implementation, the first dummy channel region 24d_L1a' may include a portion having a gradually increased or increasing width.

In an implementation, when viewed on the plane at the first height level L1, the ring-shaped dummy channel layer 24d as illustrated in FIG. 7B may not be present, but rather may include the dummy channel layer 24d including portions spaced apart from each other in the second direction X as illustrated in FIG. 8. In an implementation, when viewed in a partially enlarged cross-sectional view of FIG. 3B, in the dummy channel layer 24d as illustrated in FIG. 3B at a level higher than a level of the first height level L1 and lower than a level of a lower end of the dummy pad pattern 39d, a planar shape of the dummy channel layer 24d including portions spaced apart from each other in the second direction X may appear as illustrated in FIG. 8. In an implementation, the dummy channel layer 24d described with reference to FIGS. 1 to 6 may have the planar shape described with reference to FIG. 8, or the planar shape described with reference to FIGS. 7A to 7D.

Next, various modified example of the above-described semiconductor device 1 according to an example embodiment will be described. Hereinafter, in description of various modified examples of the above-described semiconductor device 1, modified or replaced components, among the components of the above-described semiconductor device 1, will be mainly described and descriptions of components substantially the same as the above-described components or components which can be easily understood from the contents or drawings may be omitted.

Figure 9:
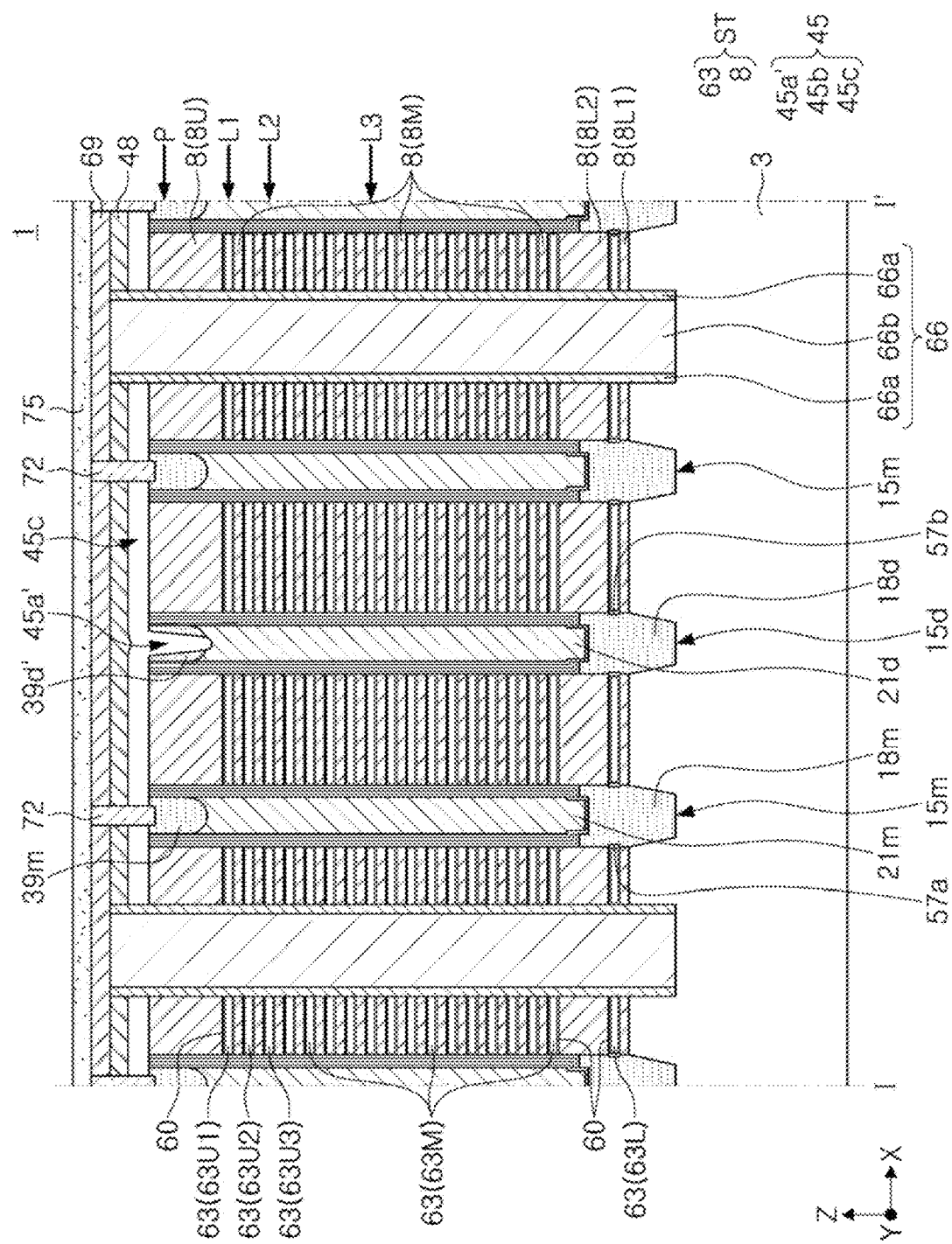
FIG. 9 is a schematic cross-sectional view of a modified example of a semiconductor device according to an example embodiment.

FIG. 9 is a cross-sectional view, taken along line I-I' of FIG. 1, of a modified example of the semiconductor device 1 according to an example embodiment.

In an implementation, referring to FIG. 9, the first portion 45a of the upper separation pattern 45 as described with reference to FIGS. 2 and 3B may divide the dummy pad pattern 39d into pad portions, spaced apart from each other in the second direction X, while penetrating through the dummy pad pattern 39d in the vertical direction Z, and may be replaced with a first portion 45a' having a lower surface at a level higher than that of the first upper gate electrode 63U1.

Figure 10:
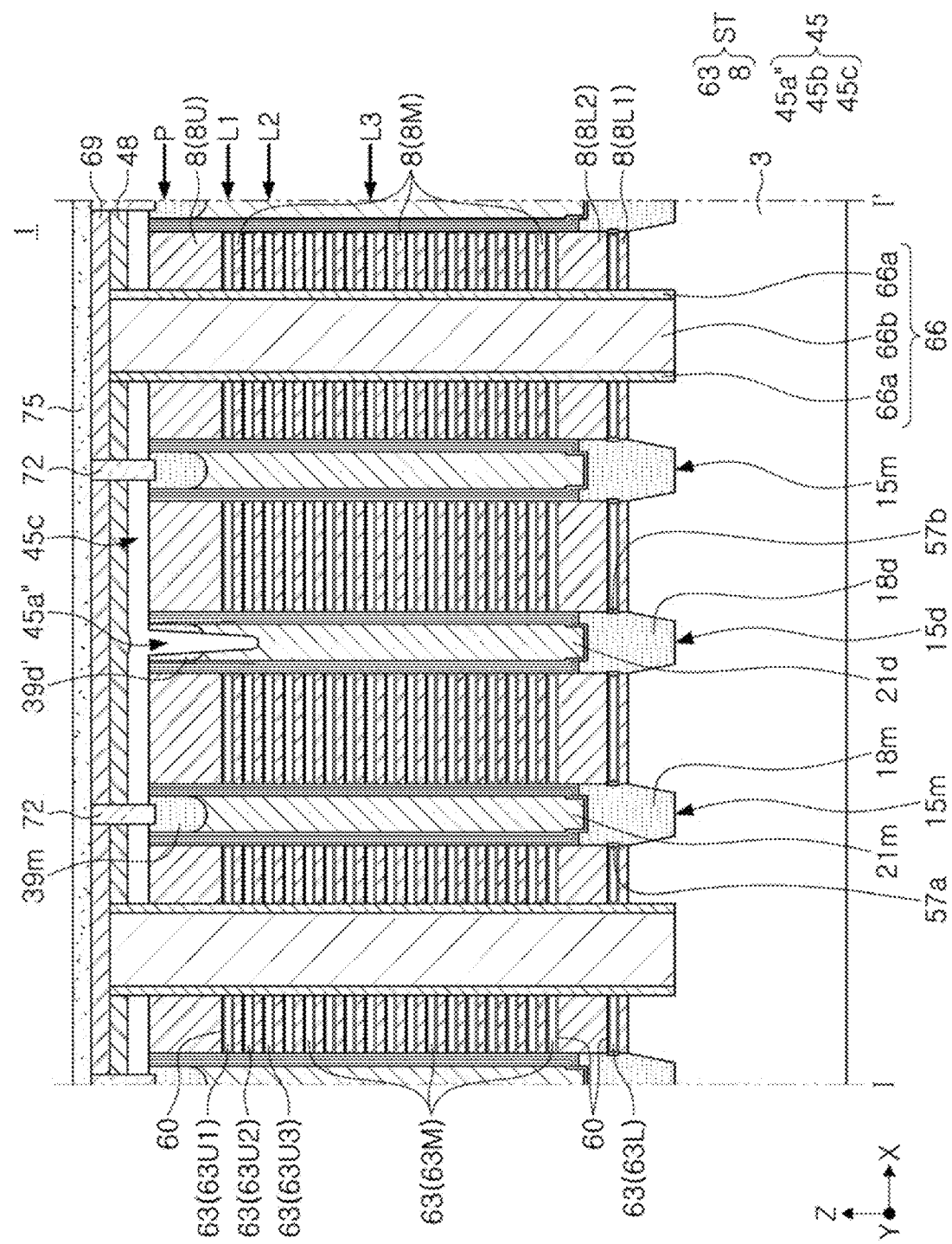
FIG. 10 is a schematic cross-sectional view of a modified example of a semiconductor device according to an example embodiment.

FIG. 10 is a cross-sectional view, taken along line I-I' of FIG. 1, of a modified example of the semiconductor device 1 according to an example embodiment.

In an implementation, referring to FIG. 10, the first portion 45a of the upper separation pattern 45 as described with reference to FIGS. 2 and 3B may divide the dummy pad pattern 39d into pad portions, spaced apart from each other in the second direction X, while penetrating through the dummy pad pattern 39d in the vertical direction, and may be replaced with a first portion 45a'' having a lower surface at a level the same or lower than a level of the first upper gate electrode 63U1 or the second upper gate electrode 63U2.

Figure 11:
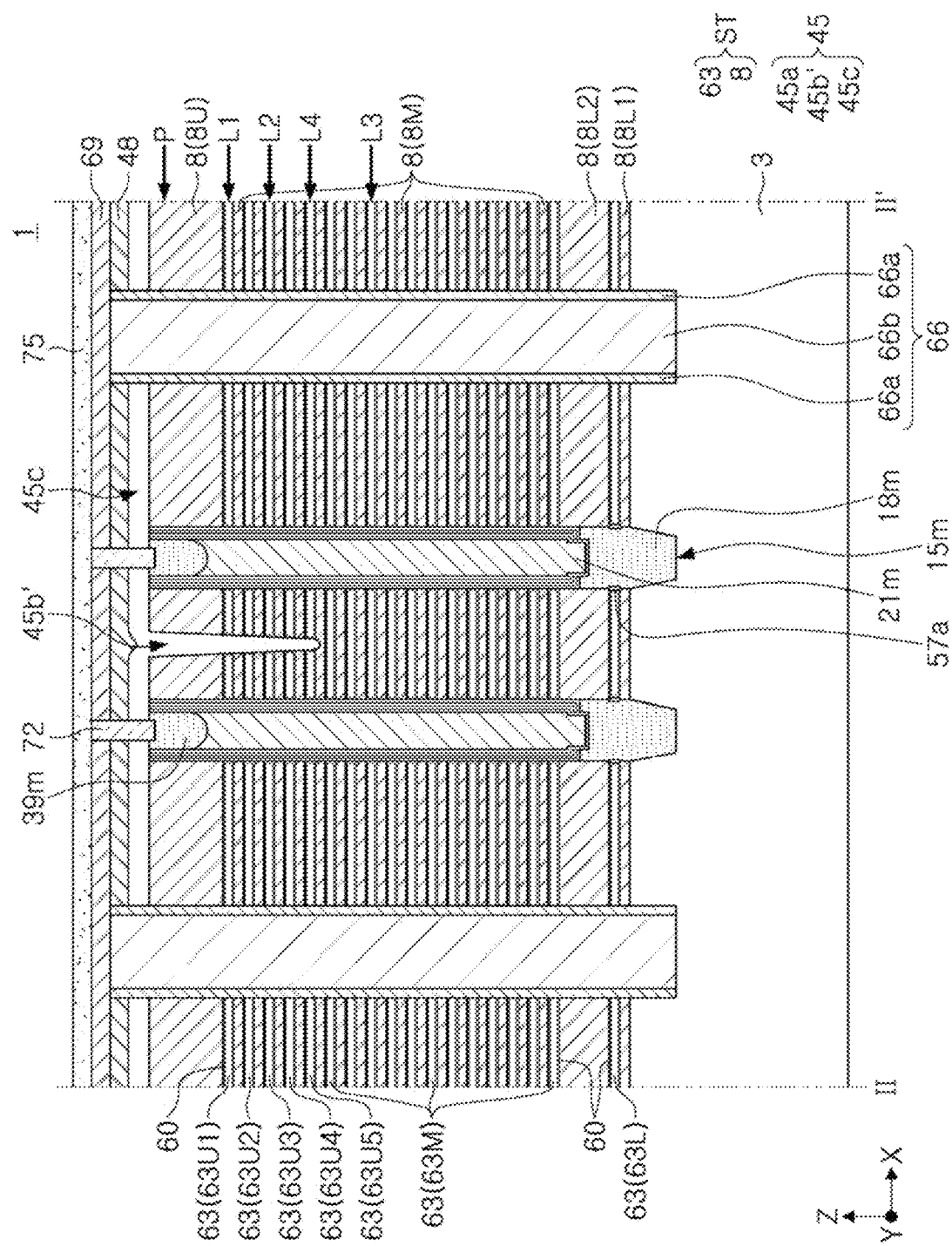
FIG. 11 is a schematic cross-sectional view of a modified example of a semiconductor device according to an example embodiment.

FIG. 11 is a cross-sectional view, taken along line II-II' of FIG. 1, of a modified example of the semiconductor device 1 according to an example embodiment.

In an implementation, referring to FIG. 11, the second portion 45b of the upper separation pattern 45 as described with reference to FIGS. 4 and 5 may be replaced with a second portion 45b' penetrating through a greater number of upper gate electrodes (e.g., 63U1, 63U2, 63U3, 63U4, and 63U5) than three gate electrodes, among the gate electrodes 63, in the vertical direction Z. Among the upper gate electrodes 63U1, 63U2, 63U3, 63U4, and 63U5 spaced apart from each other while being separated from each other in the second direction X by the second portion 45b of the upper separation pattern 45, a single or a plurality of upper gate electrodes 63U1 and 63U2 in a relatively upper portion may be erase control gate electrodes, and a single or a plurality of upper gate electrodes 63U3 and 63U4 at a relatively lower portion may be string select gate electrodes.

Figure 12:
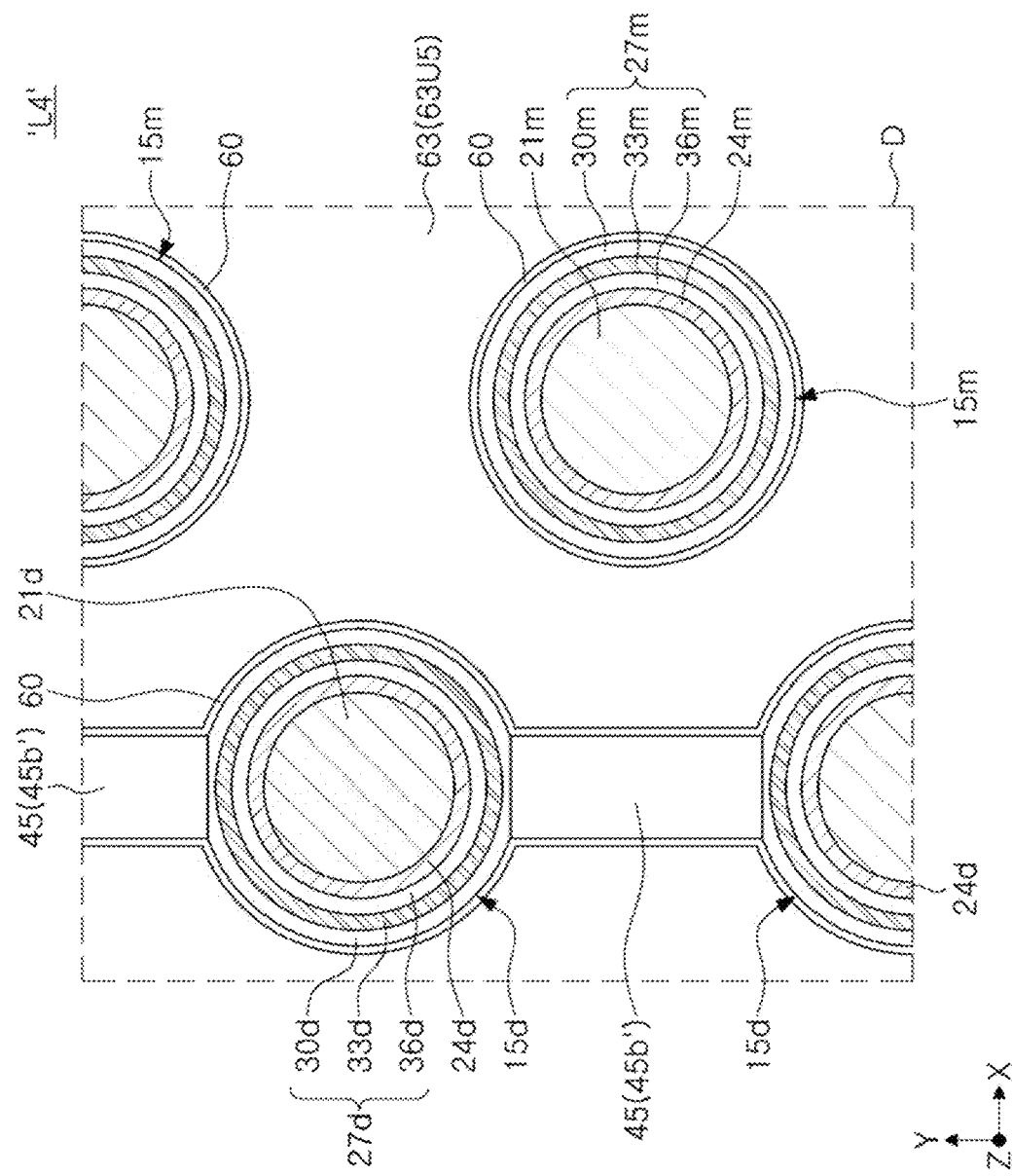
FIG. 12 is a schematic plan view of a modified example of a semiconductor device according to an example embodiment.

FIG. 12 is a schematic plan view of region "D" of FIG. 1 at a fourth height level having the same height as a fifth upper gate electrode 63U5 at a lowermost level, among the upper gate electrodes 63U1, 63U2, 63U3, 63U4, and 63U5 of FIG. 11.

Referring to FIGS. 11 and 12, when viewed on a plane at the fourth height level L4, the upper separation pattern 45 may be in contact with the first dummy dielectric layer 30d, and the dummy data storage layer 33d may have a ring shape.

When viewed on the plane at the fourth height level L4, the dummy channel layer 24d may have a substantially uniform thickness and the second dummy dielectric layer 36d may have a substantially uniform thickness.

When viewed on the plane at the fourth height level L4, the dummy channel layer 24d may have substantially the same thickness as the channel layer 24m.

In the above-described embodiments, the semiconductor device 1 may have the planar shape of the vertical dummy structure 15d of FIGS. 7A to 7D, the planar shape of the vertical dummy structure 15d of FIG. 8, or the planar shape of the vertical dummy structure 15d of FIG. 12.

Figure 13:
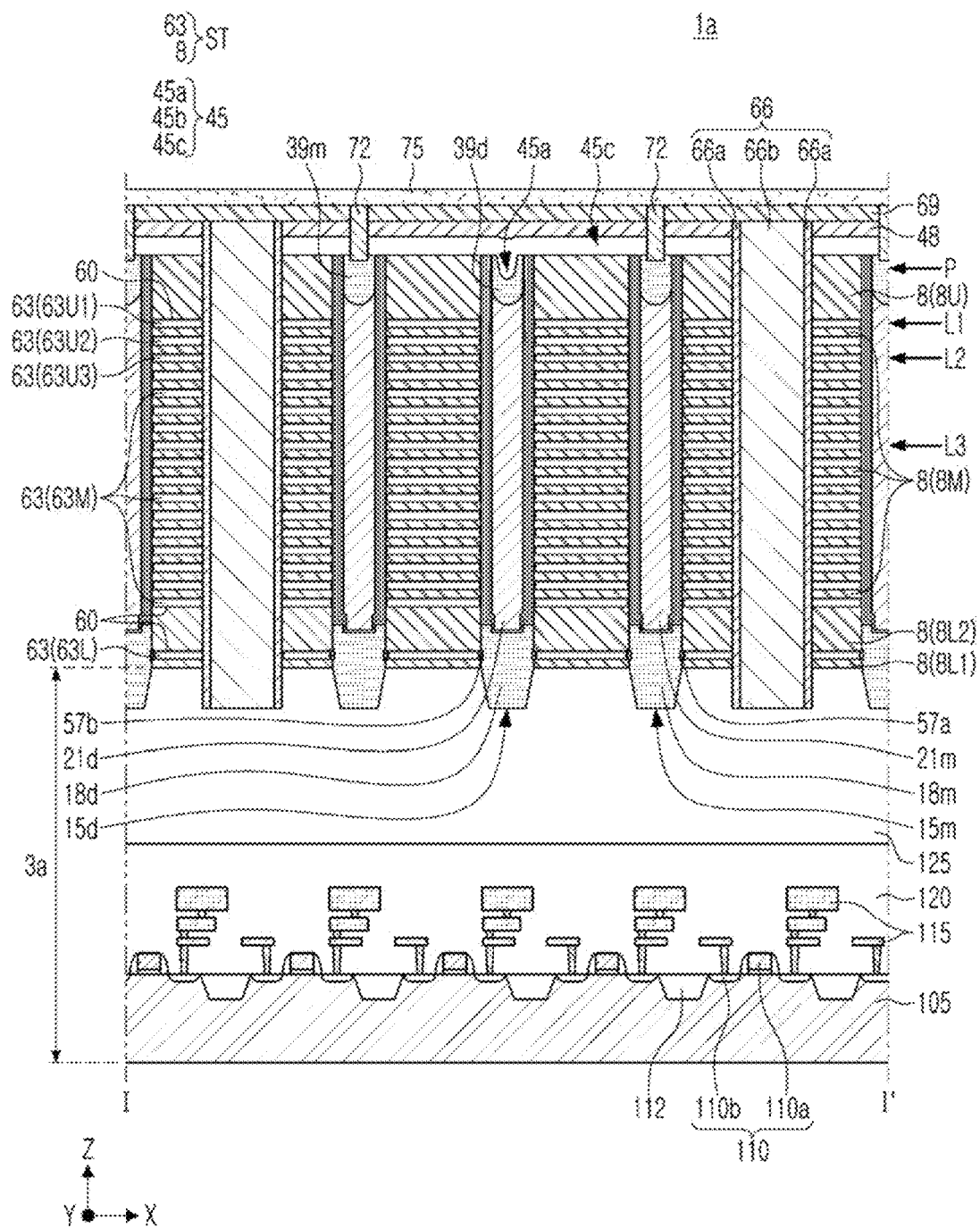
FIG. 13 is a schematic cross-sectional view of a modified example of a semiconductor device according to an example embodiment.

FIG. 13 is a cross-sectional view, taken along line II-II' of FIG. 1, of a semiconductor device 1a according to a modified example.

In an implementation, referring to FIG. 13, the above-described substrate structure (3 in FIGS. 2 to 6) may be replaced with a substrate structure 3a including a semiconductor substrate 105, peripheral circuit regions 110, 115, and 120 on the semiconductor substrate 105, and an upper substrate 125 on the peripheral circuit regions 110, 115, and 120.

The semiconductor substrate 105 may be a single-crystalline semiconductor substrate, e.g., a silicon substrate.

The peripheral circuit regions 110, 115, and 120 may include a peripheral circuit element 110 on the semiconductor substrate 105, peripheral interconnections 115 electrically connected to the peripheral circuit element 110, and a lower insulating layer 120 covering the peripheral circuit element 110 and the peripheral interconnections 115 on the semiconductor substrate 105. The peripheral circuit element 110 may include a peripheral transistor including a peripheral gate 110a, formed on an active region defined by a device isolation layer 112 on the semiconductor substrate 105, and a peripheral source/drain 110b in the active region.

The upper substrate 125 may include at least one silicon layer. The upper substrate 125 may include a polysilicon layer doped with impurities.

The stack structure ST, the vertical memory structures 15m, the vertical dummy structures 15d, and the upper separation pattern 45 described above may be on the upper substrate 125. The vertical memory structures 15*m* and the vertical dummy structures 15*d* may be in contact with the upper substrate 125.

Figure 14A:
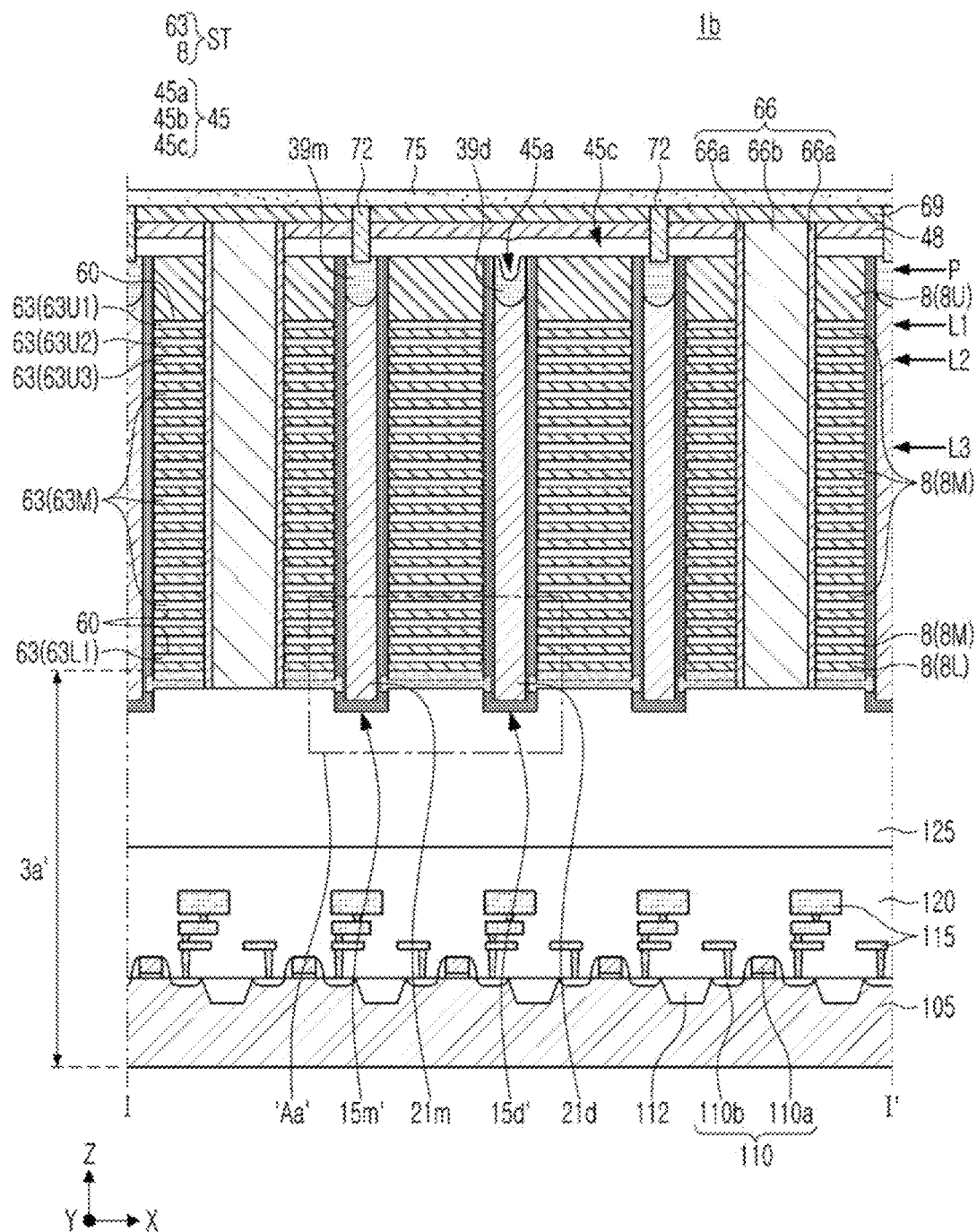
FIGS. 14A and 14B are schematic diagrams of a modified example of a semiconductor device according to an example embodiment.
Figure 14B:
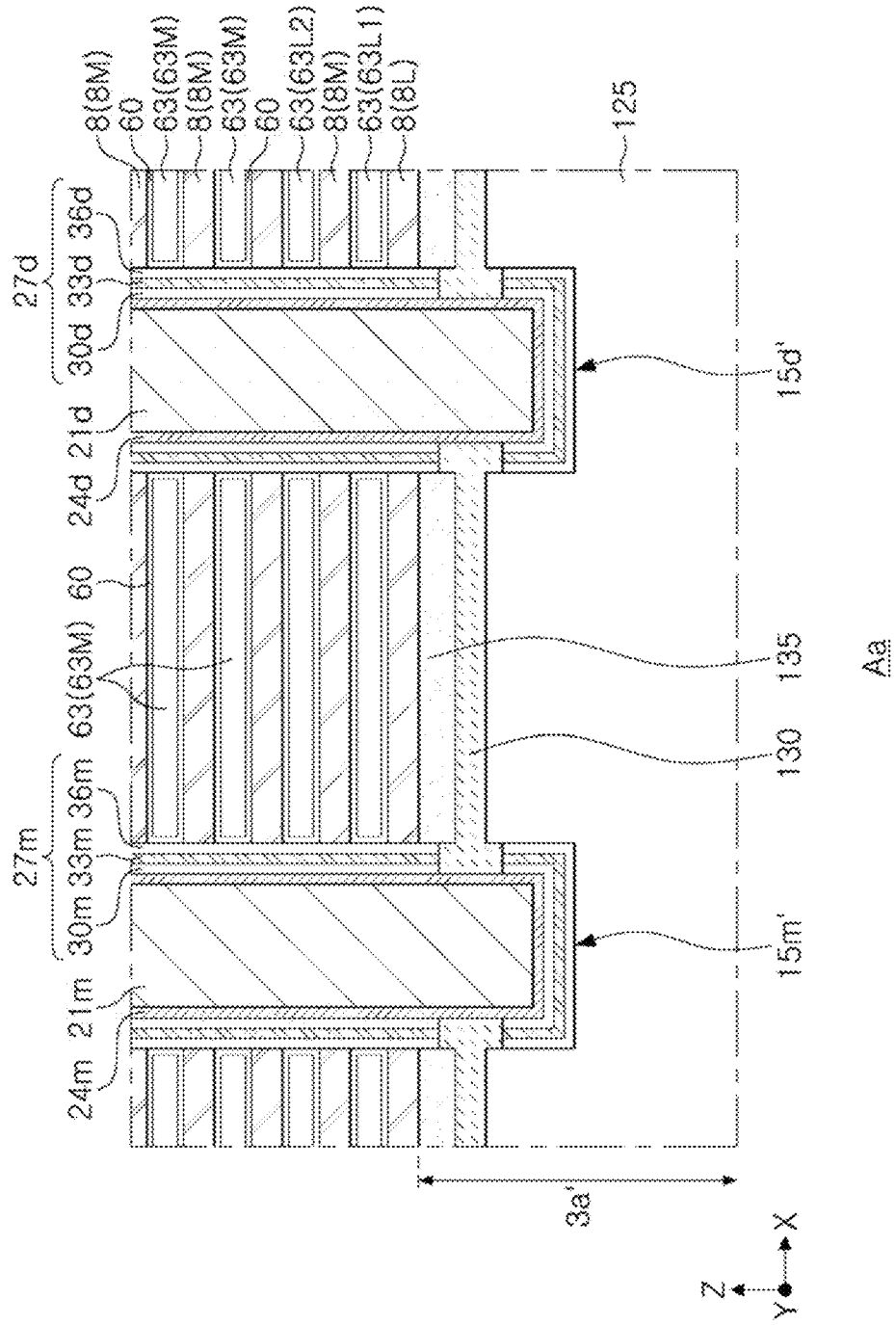

FIG. 14A is a cross-sectional view, taken along line I-I' of FIG. 1, illustrating a semiconductor device 1*b* according to a modified example, and FIG. 14B is a partially enlarged view of region "Aa" of FIG. 14A.

In an implementation, referring to FIGS. 14A and 14B, the above-described substrate structure (3 in FIGS. 2 to 6) may be replaced with a substrate structure 3*a'* including a semiconductor substrate 105, and peripheral circuit regions 110, 115, and 120 on the semiconductor substrate 105, an upper substrate 125 on the peripheral circuit regions 110, 115, and 120, and horizontal layers 130 and 135 on the upper substrate 125. The semiconductor substrate 105 and the peripheral circuit regions 110, 115, and 120 may be substantially the same as the semiconductor substrate 105 and the peripheral circuit regions 110, 115, and 120 described with reference to FIG. 13.

The horizontal layers 130 and 135 may include a first horizontal layer 130 and a second horizontal layer 135 on the first horizontal layer 135. The first and second horizontal layers 130 and 135 may be formed of a polysilicon layer having N-type conductivity. At least a portion of the upper substrate 125 may be formed of a polysilicon layer having N-type conductivity.

In the above-described stack structure ST, the gate electrodes 63 may include a plurality of lower gate electrodes 63L1 and 63L2 spaced apart from each other in the vertical direction Z, and the interlayer insulating layers 8 may include a middle interlayer insulating layers 8M on a lowermost interlayer insulating layer 8L.

Among the plurality of lower gate electrodes 63L1 and 63L2, a lower gate electrode 63L1 at a relatively lower portion may be a lower erase control gate electrode, and a lower gate electrode 63L2 at a relatively upper portion may be a lower select gate electrode.

In the lower region as illustrated in FIG. 14B, the above-described vertical memory structure 15*m* may be modified into a vertical memory structure 15*m'* including an insulating region 21*m* extending inwardly of the upper substrate 125, a channel layer 24*m* covering a side surface and a bottom surface of the insulating region 21*m*, and a dielectric structure 27*m* covering an external side surface and a bottom surface of the channel layer 24*m*.

In the lower region as illustrated in FIG. 14B, a vertical dummy structure 15*d'* may include a dummy insulating region 21*d* extending inwardly of the upper substrate 125, a dummy channel layer 24*d* covering an external side surface and a bottom surface of the dummy insulating region 21*d*, and a dummy dielectric structure 27*d* covering an external side surface and a bottom surface of the dummy channel layer 24*d*.

The first horizontal layer 130 may penetrate through the dielectric structure 27*m* and be in contact with the channel layer 24*m*, and may penetrate through the dummy dielectric structure 27*d* and be in contact with the dummy channel layer 24*d*.

Figure 15:
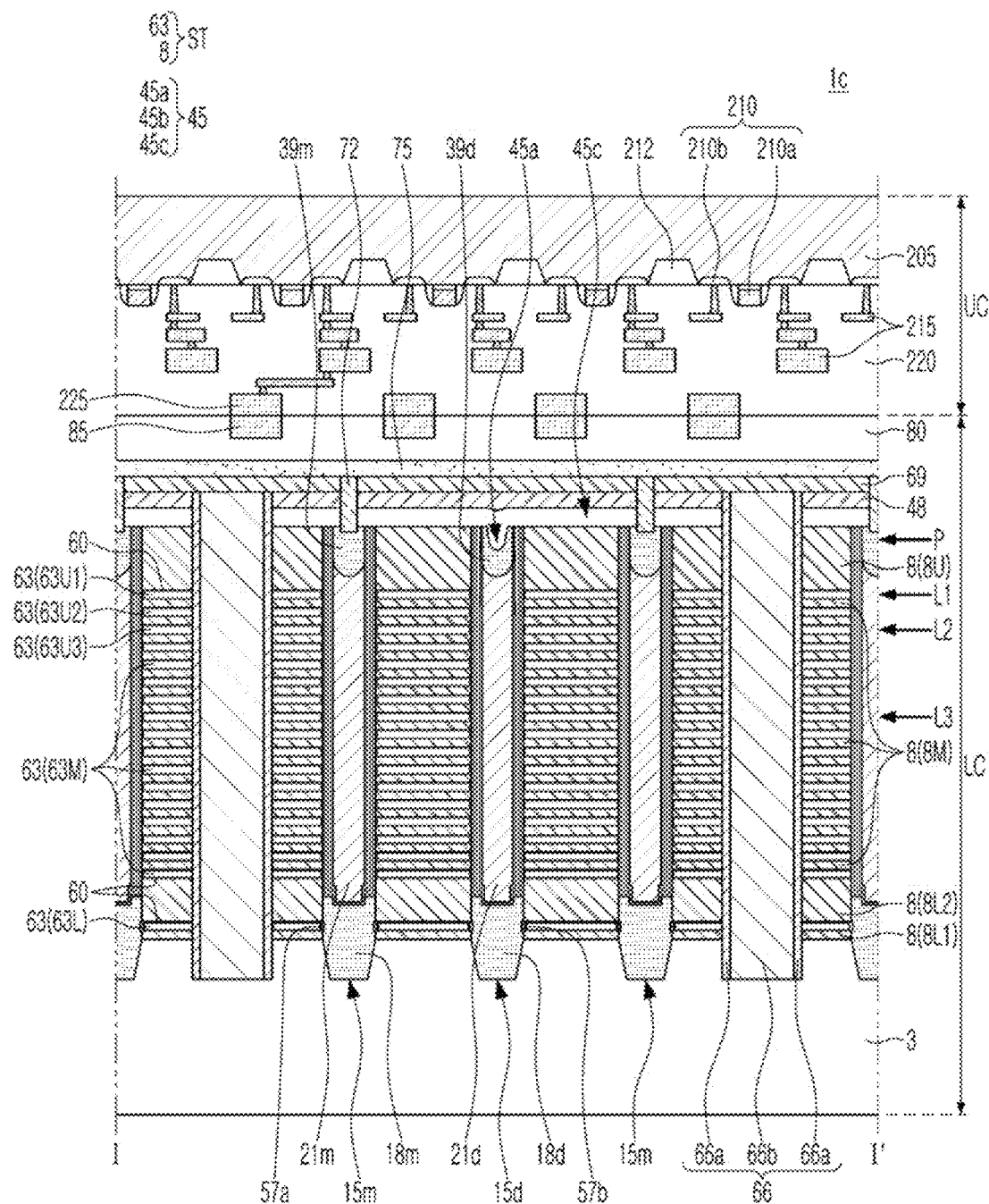
FIGS. 15 and 16 are schematic cross-sectional views of two different modified examples of a semiconductor device according to an example embodiments.

FIG. 15 is a cross-sectional view, taken along line I-I' of FIG. 1, illustrating a semiconductor device 1*c* according to a modified example.

In an implementation, referring to FIG. 15, the semiconductor device 1*c* according to a modified example may include a lower semiconductor chip LC and an upper semiconductor chip UC bonded to the lower semiconductor chip LC.

The lower semiconductor chip LC may include the semiconductor device 1 described with reference to FIGS. 1 to 11. In an implementation, the lower semiconductor chip LC may include the substrate structure 3, the stack structure ST, the vertical memory structures 15*m*, the vertical dummy structures 15*d*, and the upper separation pattern 45, the separation structures 66, the upper insulating layers 48 and 69, the contact plugs 72, and the bitlines 75.

The lower semiconductor chip LC may include a lower insulating layer 80, covering the bitlines 75 on the upper insulating layers 48 and 69, and a lower bonding pad 85 having an upper surface coplanar with an upper surface of the lower insulating layer 80 and buried in the lower insulating layer 80.

The upper semiconductor chip UC may include a semiconductor substrate 205, peripheral circuit regions 210, 215, and 220 below the semiconductor substrate 205, and an upper bonding pad 225 below the peripheral circuit region 210, 215, and 220.

The peripheral circuit regions 210, 215, and 220 may include a peripheral circuit element 210 below the semiconductor substrate 205, peripheral interconnections 215 electrically connected to the peripheral circuit element 210, and an upper insulating layer 220 covering the peripheral circuit element 210 and the peripheral interconnections 215 below the semiconductor substrate 205. The peripheral circuit device 210 may include a peripheral transistor including a peripheral gate 210*a*, below an active region defined by a device isolation layer 212 in the semiconductor substrate 205, and a peripheral source/drain 210*b* in the active region. The peripheral circuit regions 210, 215, and 220 may be between the semiconductor substrate 205 and the stack structure ST.

The upper bonding pad 225 may be buried in the upper insulating layer 220 and may be bonded to the lower bonding pad 85.

The lower and upper bonding pads 85 and 225 may be formed of conductive materials, which may be bonded to each other, e.g., copper (Cu).

Figure 16:
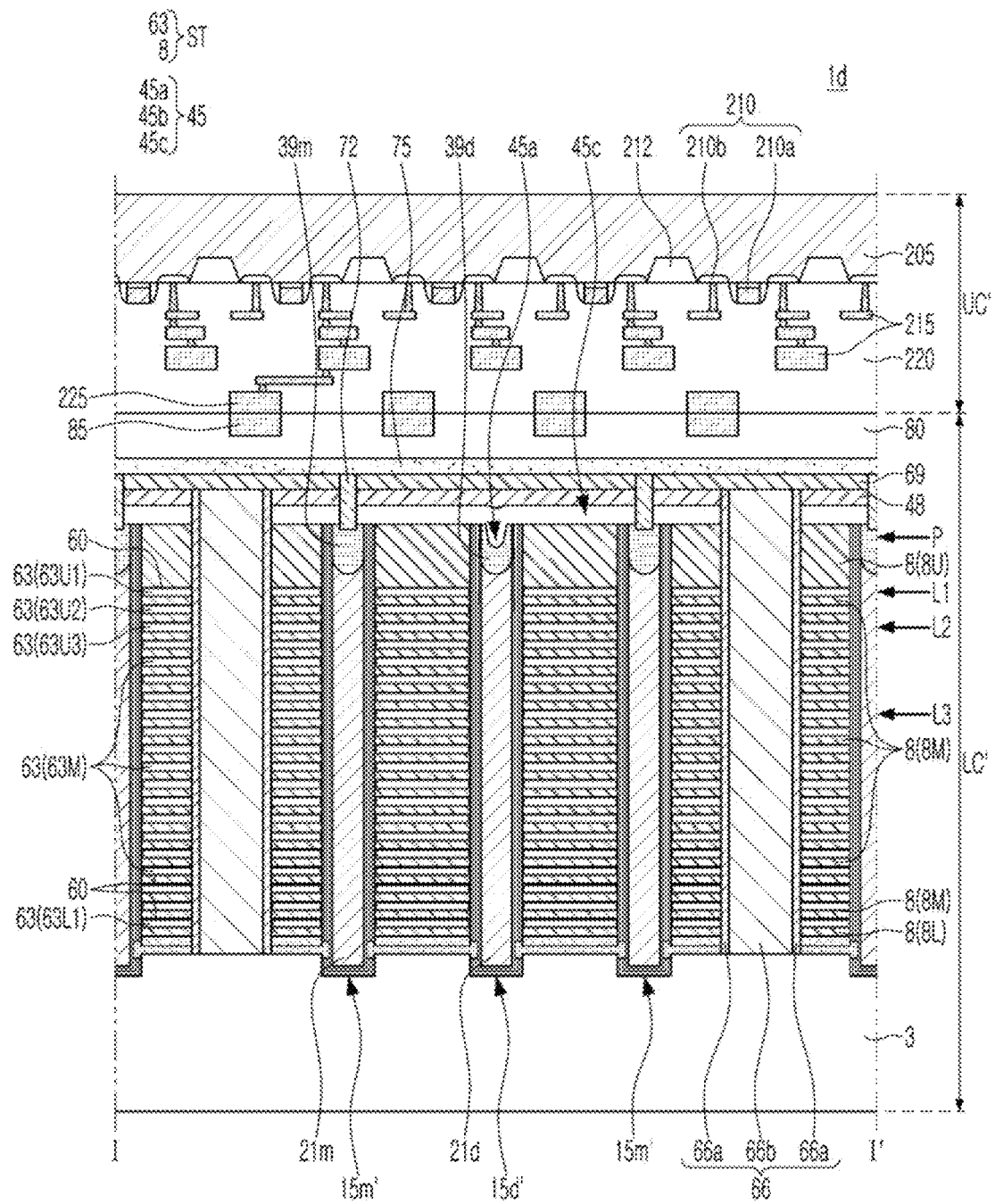

FIG. 16 is a cross-sectional view, taken along line I-I' of FIG. 1, of a semiconductor device 1*d* according to a modified example.

In an implementation, referring to FIG. 16, the semiconductor device 1*d* according to the modified example may include a lower semiconductor chip LC' and an upper semiconductor chip UC' bonded to the lower semiconductor chip LC'.

The upper semiconductor chip UC' may be substantially the same as the upper semiconductor chip UC described with reference to FIG. 15.

The lower semiconductor chip LC' may include the upper substrate 125, the horizontal layers 130 and 135, the stack structure ST, the vertical memory structure 15*m'*, and the vertical dummy structure 15*d'*, which are the same as described with reference to FIGS. 14A and 14B, and may include the upper separation pattern 45, the separation structures 66, the upper insulating layers 48 and 69, the contact plugs 72, and the bitlines 75, which are the same as described with reference to FIGS. 1 to 11.

The lower semiconductor chip LC' may further include the lower insulating layer 80 and the lower bonding pad 85 described with reference to FIG. 15. The lower and upper bonding pads 85 and 225 may be bonded to each other as described with reference to FIG. 15.

Figure 17:
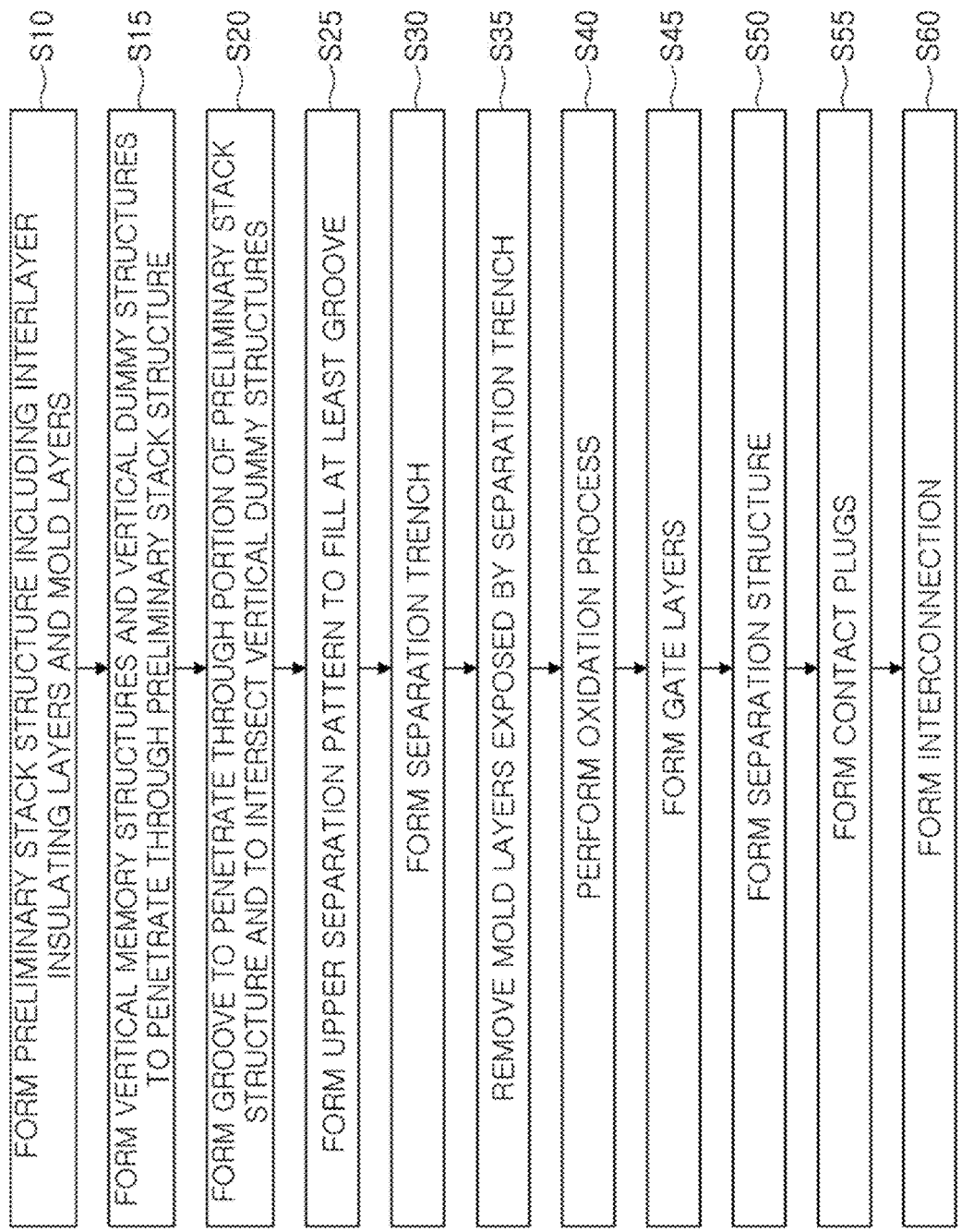
FIG. 17 is a flowchart of a method of fabricating a semiconductor device according to an example embodiment.
Figure 18A:
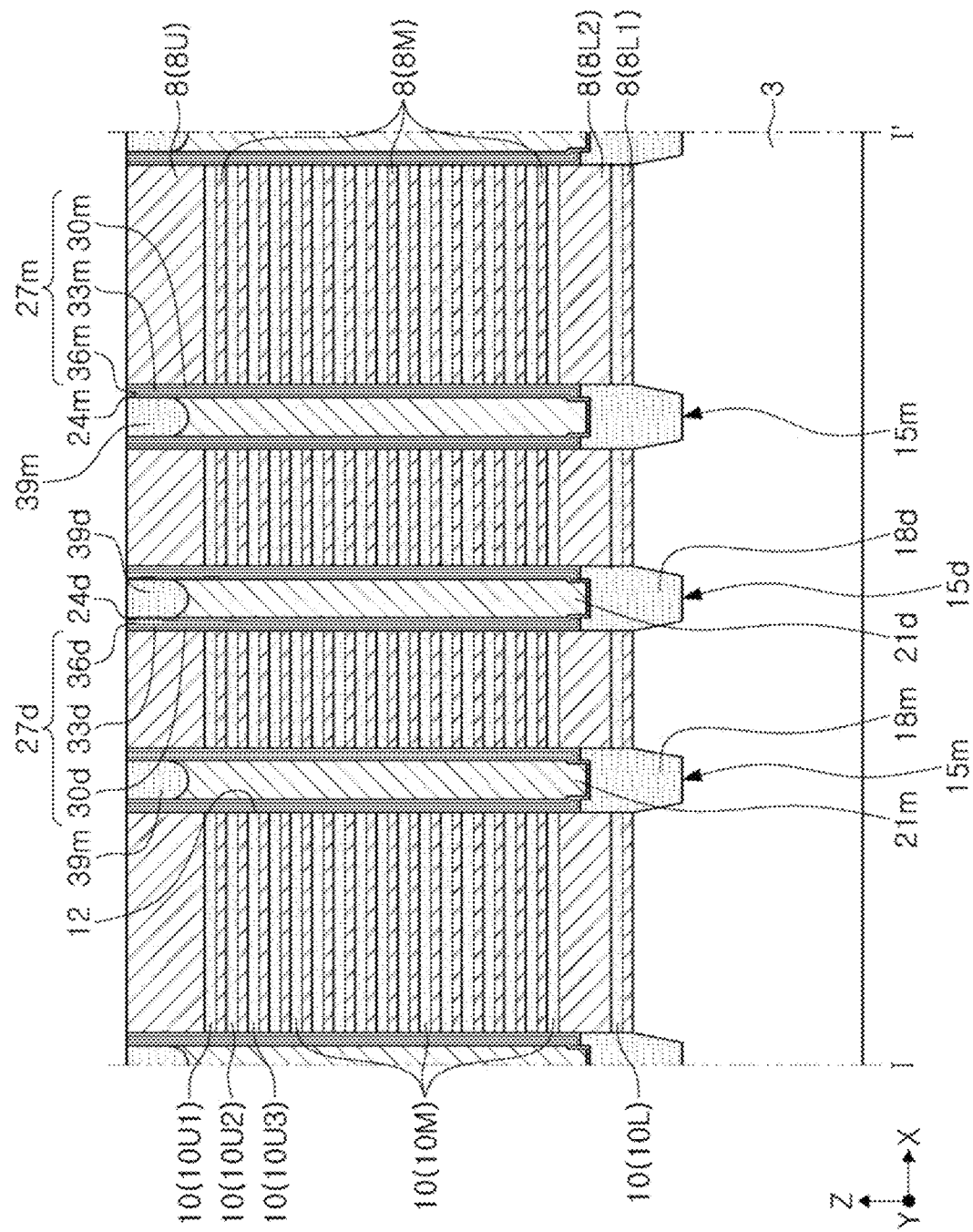
Figure 18B:
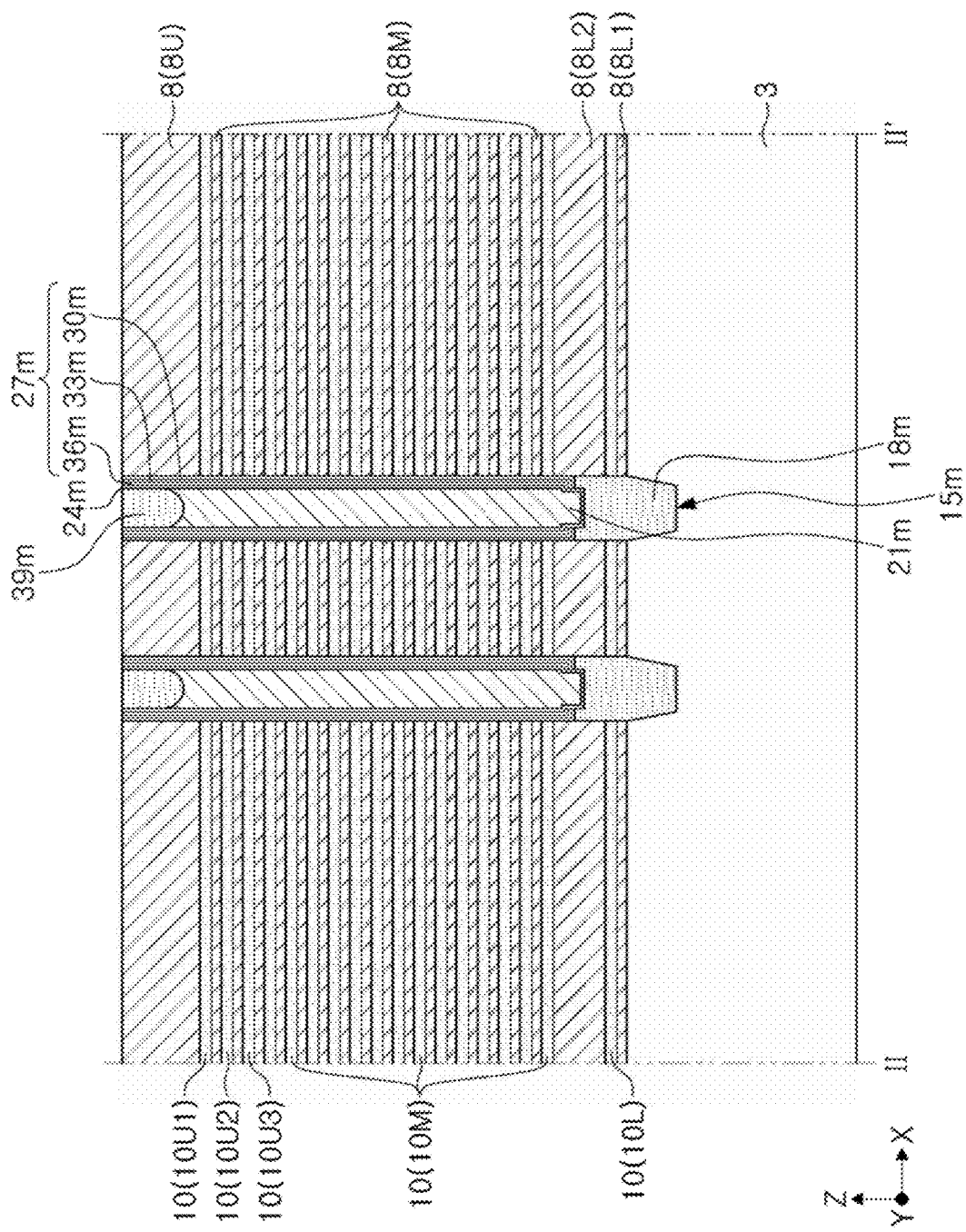
Figure 18C:
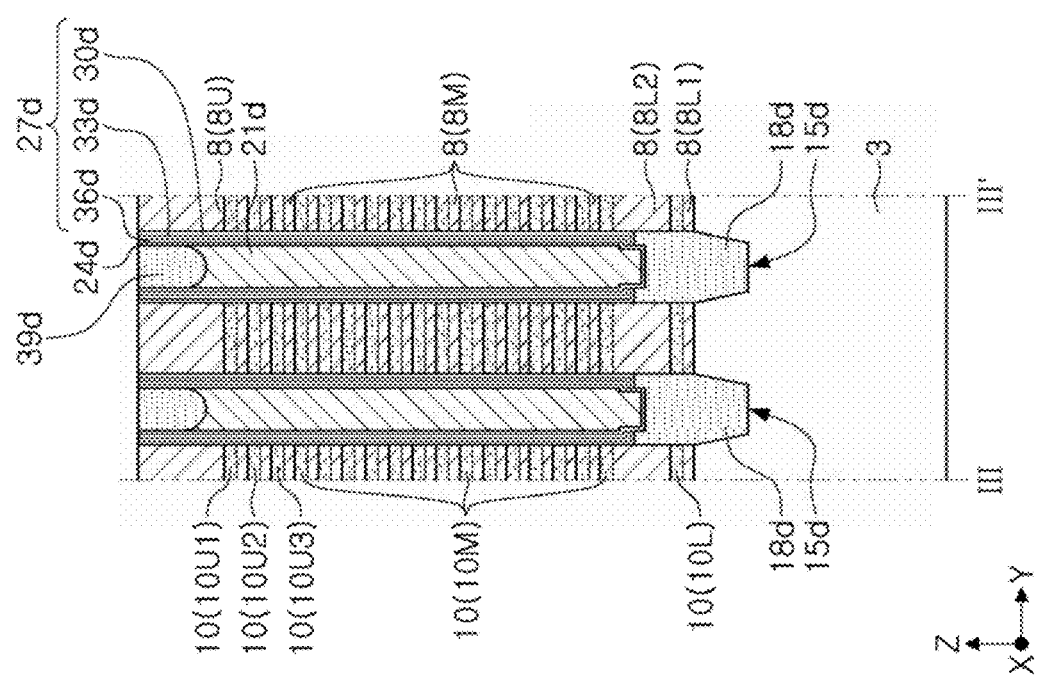

Next, an example of a method of fabricating a semiconductor device according to an example embodiment will be described with reference to FIGS. 17 to 22C. FIG. 17 is a flowchart of a method of fabricating a semiconductor device according to an example embodiment, FIGS. 18A, 19A, 20A, 21A and 22A are cross-sectional views taken along line I-I' of FIG. 1, FIG. 18B, FIG. 19B, FIG. 20B, FIG. 21B, and FIG. 22B are cross-sectional views taken along line II-II' of FIG. 1, and FIGS. 18C, FIG. 19C, FIG. 20C, FIG. 21C, and FIG. 22C are cross-sectional views taken along lines III-III' of FIG. 1.

Referring to FIGS. 17, 18A, 18B, and 18C, a substrate structure 3 may be formed. The substrate structure 3 may be a semiconductor substrate. In an implementation, the substrate structure 3 may be formed by being replaced with the substrate structure (3a of FIG. 13) as described with reference to FIG. 13. The substrate structure 3 may be a silicon substrate. At least a portion of the substrate structure 3 may be a region doped with impurities, e.g., a doped region having N-type conductivity type and/or P-type conductivity type.

In operation S10, preliminary stack structures 8 and 10 including interlayer insulating layers 8 and mold layers 10 may be formed. The preliminary stack structures 8 and 10 may be formed on the substrate structure 3.

The interlayer insulating layers 8 may be formed of silicon oxide. The mold layers 10 may be formed of a material different from that of the interlayer insulating layers 8. In an implementation, the mold layers 10 may be formed of silicon nitride or polysilicon.

The interlayer insulating layers 8 may include a lowermost interlayer insulating layer 8L1, a next lowermost interlayer insulating layer 8L2, an uppermost interlayer insulating layer 8U, and middle interlayer insulating layer 8M between the next lowermost interlayer insulating layer 8L2 and the uppermost insulating layer 8U. The next lowermost interlayer insulating layer 8L2 may be formed to have a thickness greater than a thickness of the lowermost interlayer insulating layer 8L1 and a thickness of the middle interlayer insulating layers 8M. The uppermost interlayer insulating layer 8U may be formed to have a thickness greater than the thickness of the lowermost interlayer insulating layer 8L1 and the thickness of the middle interlayer insulating layers 8M.

The mold layers 10 may include a lower mold layer 10L, a plurality of upper mold layers 10U1, 10U2, and 10U3, and a middle mold layer 10M between the lower mold layer 10L and the plurality of upper mold layers 10U1, 10U2, and 10U3.

In operation S15, vertical memory structures 15$m$ and vertical dummy structures 15$d$ may be formed to penetrate through the preliminary stack structures 8 and 10.

Forming the vertical memory structures 15$m$ and the vertical dummy structures 15$d$ may include forming holes 12 to penetrate through the preliminary stack structures 8 and 10 and to expose the substrate structure 3 and simultaneously forming the vertical memory structures 15$m$ and the vertical dummy structures 15$d$ in the holes. In an implementation, forming each of the vertical memory structures 15$m$ may include forming a channel pattern 18$m$ epitaxially grown from the substrate structure 3 exposed by the hole 12, forming a dielectric structure 27$m$ on a sidewall of the hole 12 on the channel pattern 18$m$, forming a channel layer 24$m$ to cover the dielectric structure 27$m$ and to be in contact with the channel pattern 18$m$, forming an insulating region 21$m$ to fill a portion of the hole 12 on the channel layer 24$m$, and forming a pad pattern 39$m$ to fill a remaining portion of the hole 12 on the insulating region 21$m$. Forming each of the vertical dummy structure 15$d$ may include forming a dummy channel pattern 18$d$ epitaxially grown from the substrate structure 3 exposed by the hole 12, forming a dummy dielectric structure 27$d$ on a sidewall of the hole 12 on the dummy channel pattern 18$d$, forming a dummy channel layer 24$d$ to cover the dummy dielectric structure 27$d$ and to be in contact with the dummy channel pattern 18$d$, forming a dummy insulating region 21$d$ to fill a portion of the hole 12 on the dummy channel layer 24$d$, and forming a dummy pad pattern 39$d$ to fill a remaining portion of the hole 12 on the dummy insulating region 21$d$.

Forming the dielectric structure 27$m$ may include sequentially forming a second dielectric layer 36$m$, the data storage layer 33$m$, and the first dielectric layer 30$m$. Forming the dummy dielectric structure 27$d$ may include sequentially forming a second dummy dielectric layer 36$d$, the dummy data storage layer 33$d$, and the first dummy dielectric layer 30$d$.

Referring to FIGS. 17, 19A, 19B, and 19C, in operation S20, a groove 42 may be formed to penetrate through a portion of the preliminary structures 8 and 10 and to intersect the vertical dummy structures 15$d$. The groove 42 may have a linear shape extending in the Y direction. The grooves 42 may intersect an upper portion of each of the vertical dummy structures 15$d$ while penetrating through a portion of each of the vertical dummy structures 15$d$. A width of the groove 42 in an X direction may be smaller than a width of each of the vertical dummy structure 15$d$ in the X direction.

The groove 42 may penetrate through the upper mold layers 10$u$1, 10$u$2, and 10$u$3, among the mold layers 10.

In an implementation, the grooves 42 may penetrate through a portion of the dummy pad pattern 39$d$ of each of the vertical dummy structures 15$d$.

In an implementation, the groove 42 may penetrate through the entire dummy pad pattern 39$d$ of each of the vertical dummy structures 15$d$.

Referring to FIGS. 17, 20A, 20B, and 20C, in operation S25, an upper separation pattern 45 may be formed to fill at least the groove 42. The upper separation pattern 45 may fill the groove 42 and may cover upper surfaces of the preliminary laminated structures 8 and 10. The upper separation pattern 45 may be formed of silicon oxide.

In the upper separation pattern 45, the portions intersecting the vertical dummy structures 15$d$ may be referred to as a first portion 45$a$, a portion penetrating through a portion of the preliminary lamination structures 8 and 10 may be referred to as a second portion 45$b$, and a portion covering the upper surfaces of the preliminary laminated structures 8 and 10 may be referred to as an upper portion 45$c$.

In the upper separation pattern 45, the first portion 45$a$ intersecting the vertical dummy structures 15$d$ may penetrate through a portion of the dummy data storage layer 33$d$ of each of the vertical dummy structures 15$d$ to divide a portion of the dummy data storage layer 33$d$.

A first upper insulating layer 48 may be formed on the upper separation pattern 45. The first upper insulating layer 48 may be formed of silicon oxide harder than the silicon oxide of the upper separation pattern 45. In an implementation, the first upper insulating layer 48 may be formed of silicon oxide formed at higher temperatures than the silicon oxide of the upper separation pattern 45.

In operation S30, separation trenches 51 may be formed. The separation trenches 51 may penetrate through the first upper insulating layer 48, the upper portion 45$c$ of the upper separation pattern 45, and the preliminary laminated structures 8 and 10. The separation trenches 51 may expose the mold layers 10 of the preliminary laminated structures 8 and 10.

Referring to FIGS. 17, 21A, 21B and FIG. 21C, in operation S35, the mold layers (10 of FIGS. 19A to 19C) exposed by the separation trenches 51 may be removed.

As the mold layers (10 of FIGS. 19A to 19C) are removed, empty space 54 may be formed to expose the vertical memory structures 15m, the vertical dummy structures 15d, and the upper separation pattern 45.

Figure 19A:
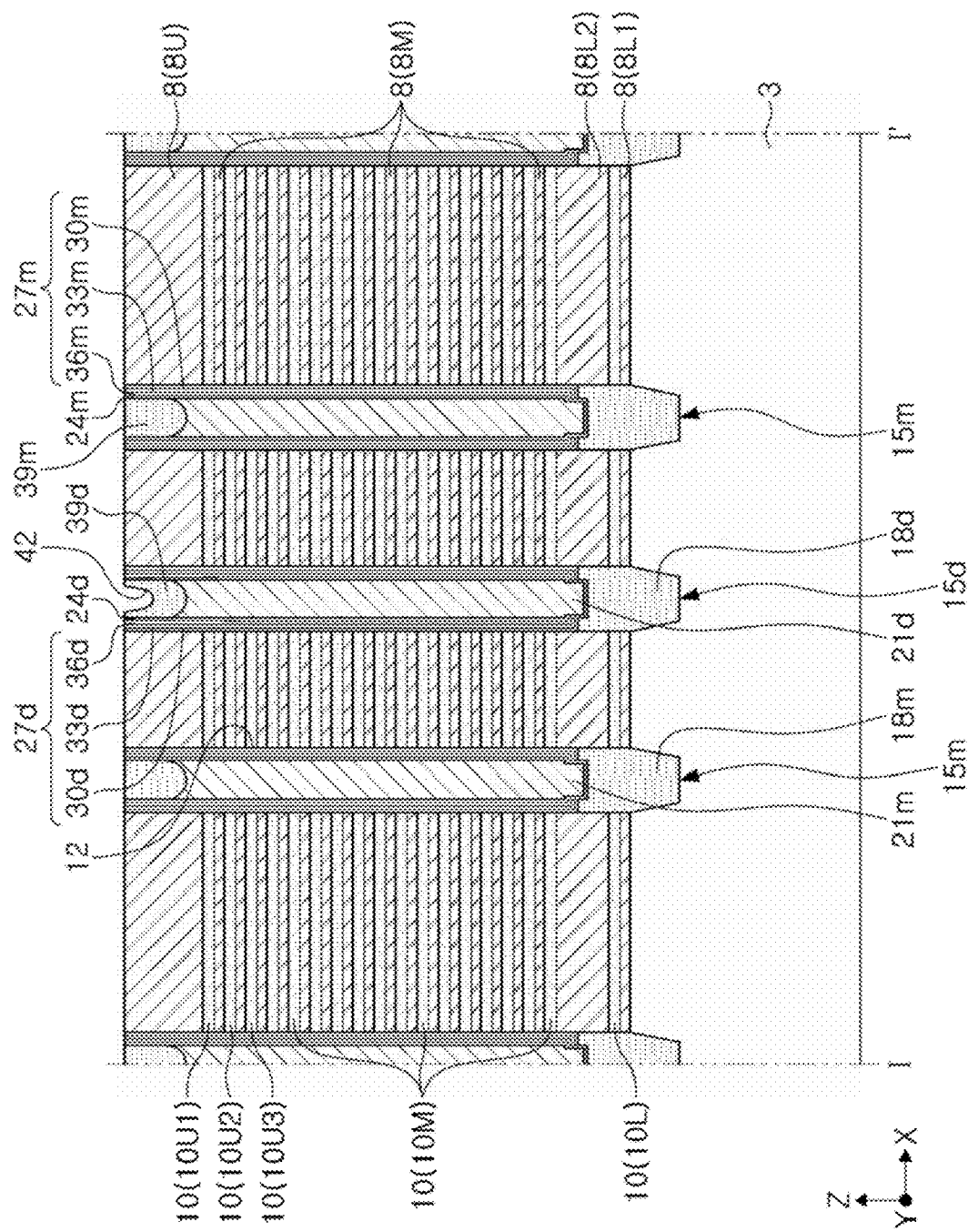
Figure 19B:
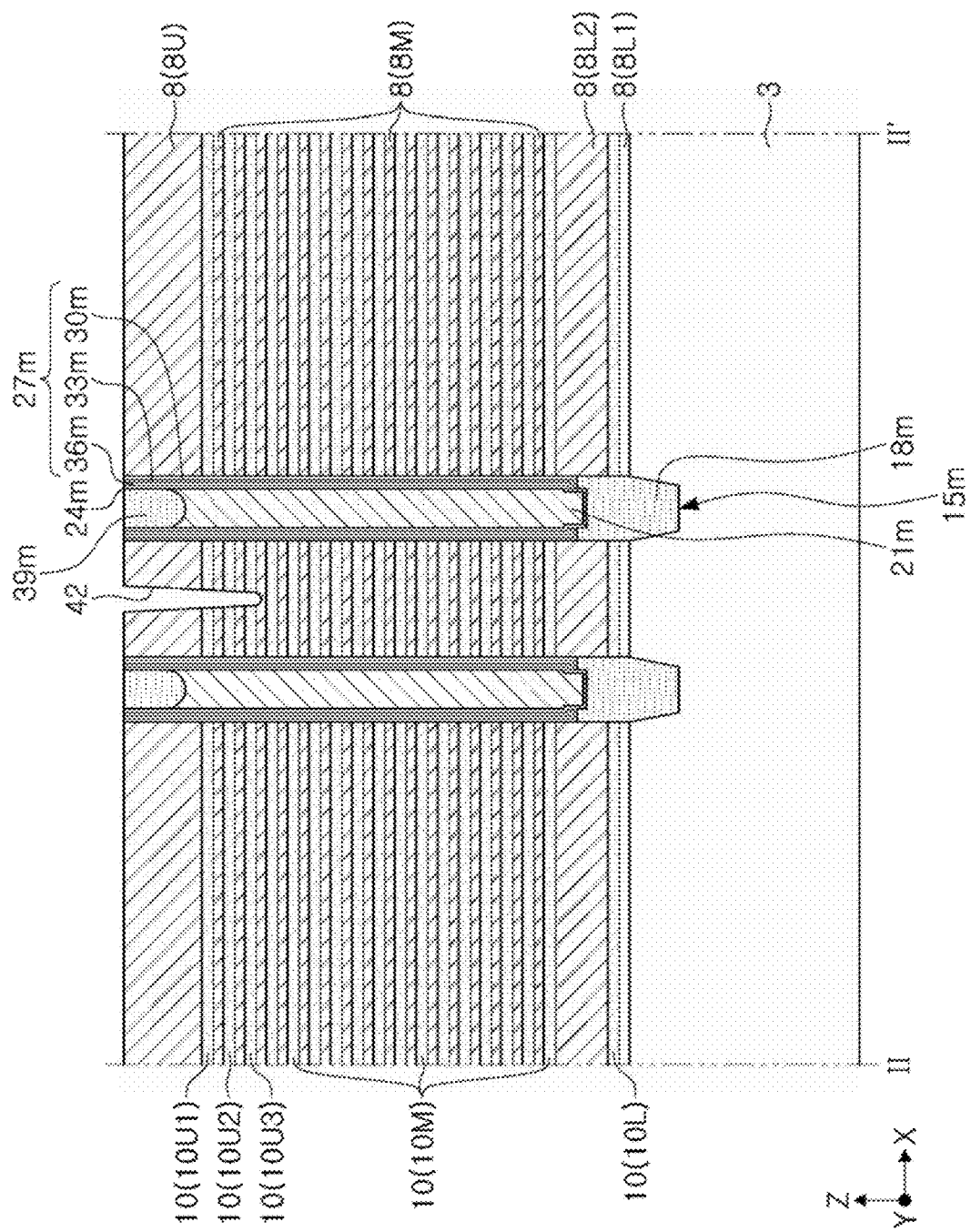
Figure 19C:
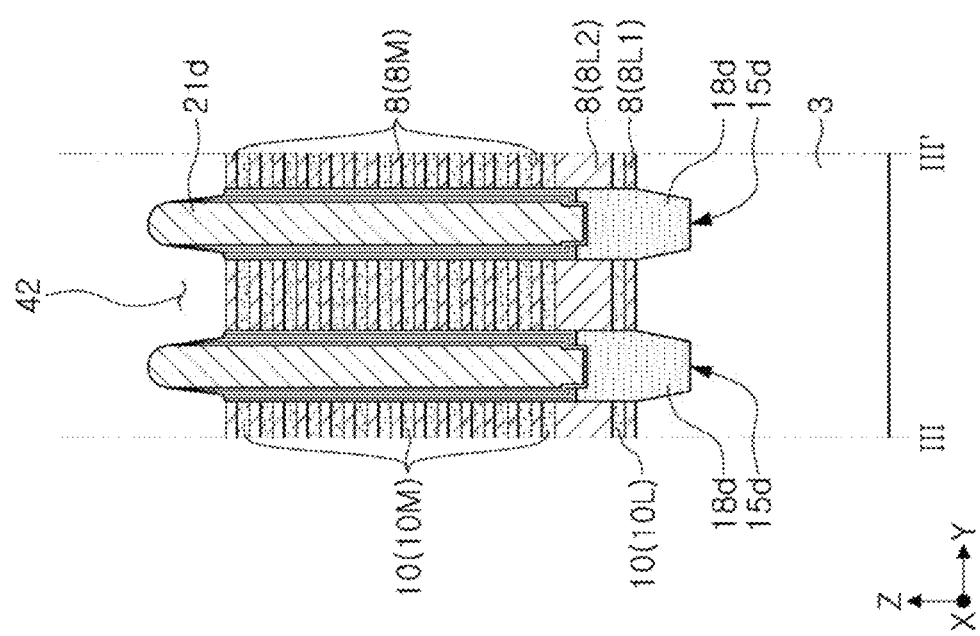
Figure 20B:
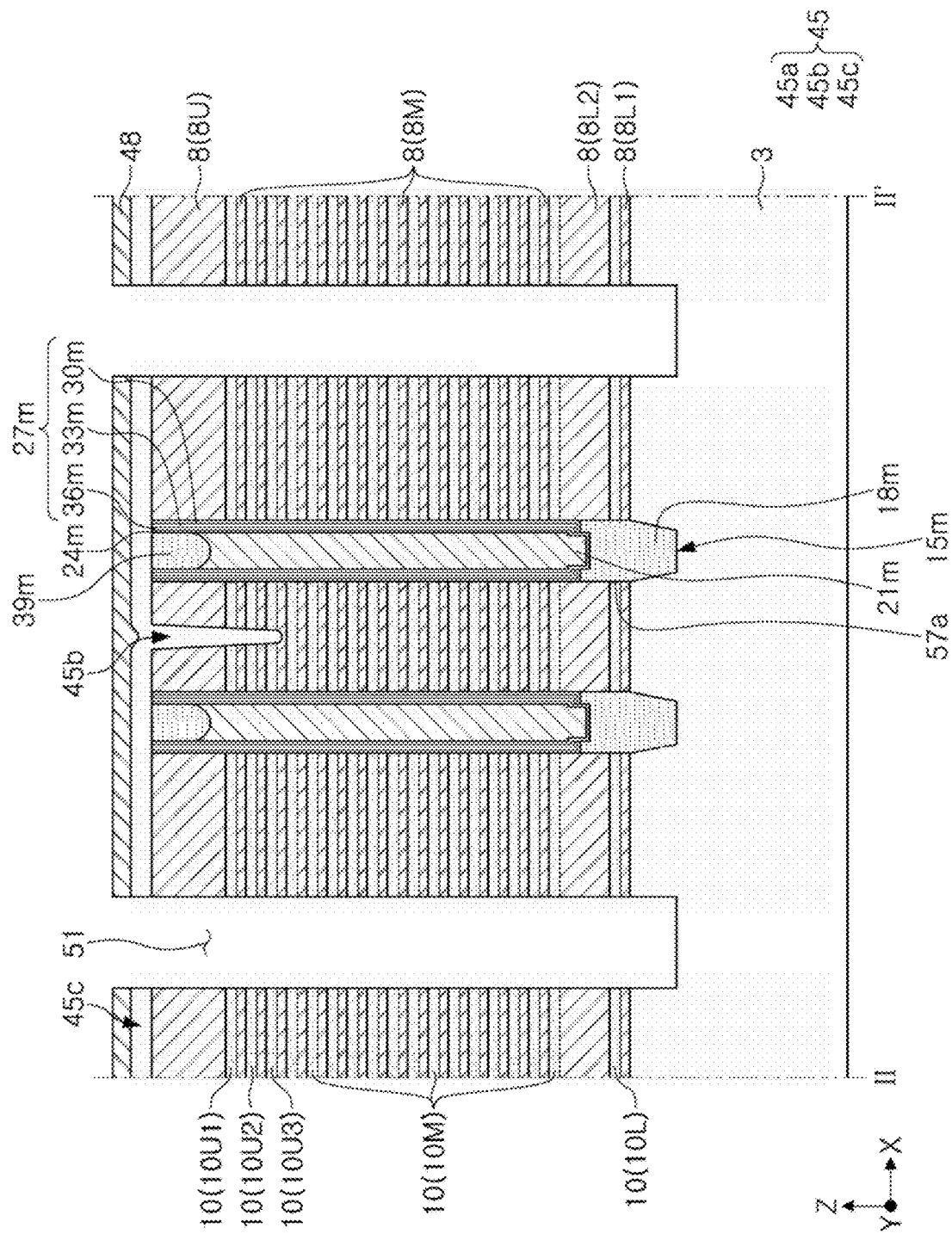
Figure 20C:
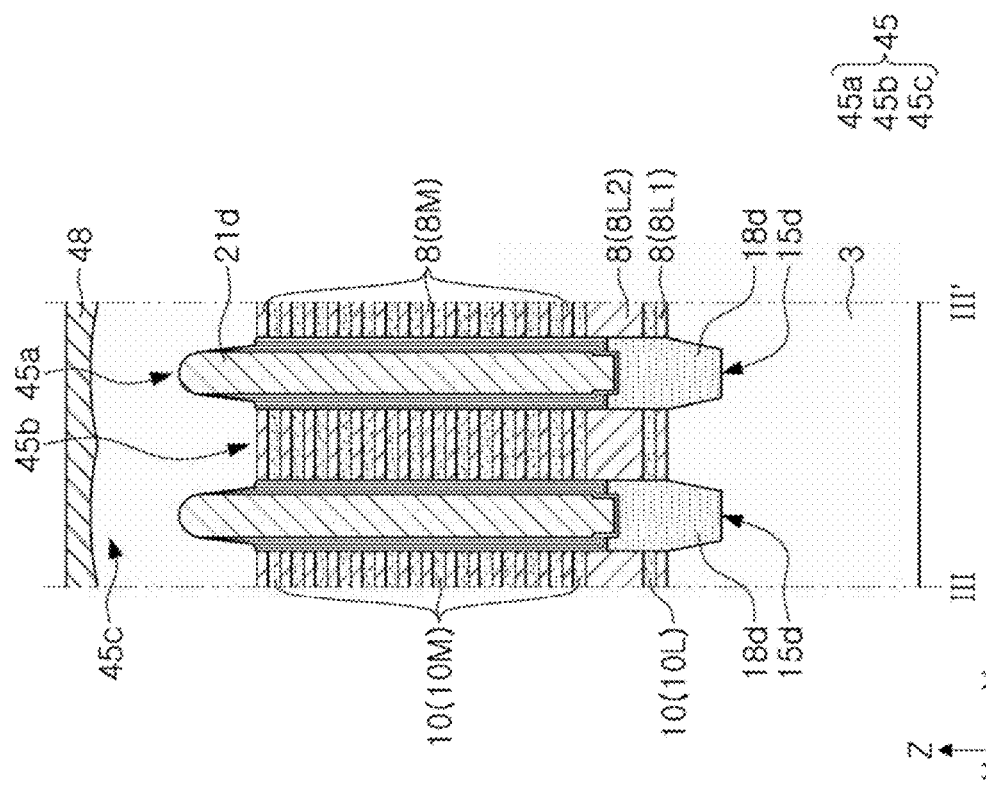
Figure 21A:
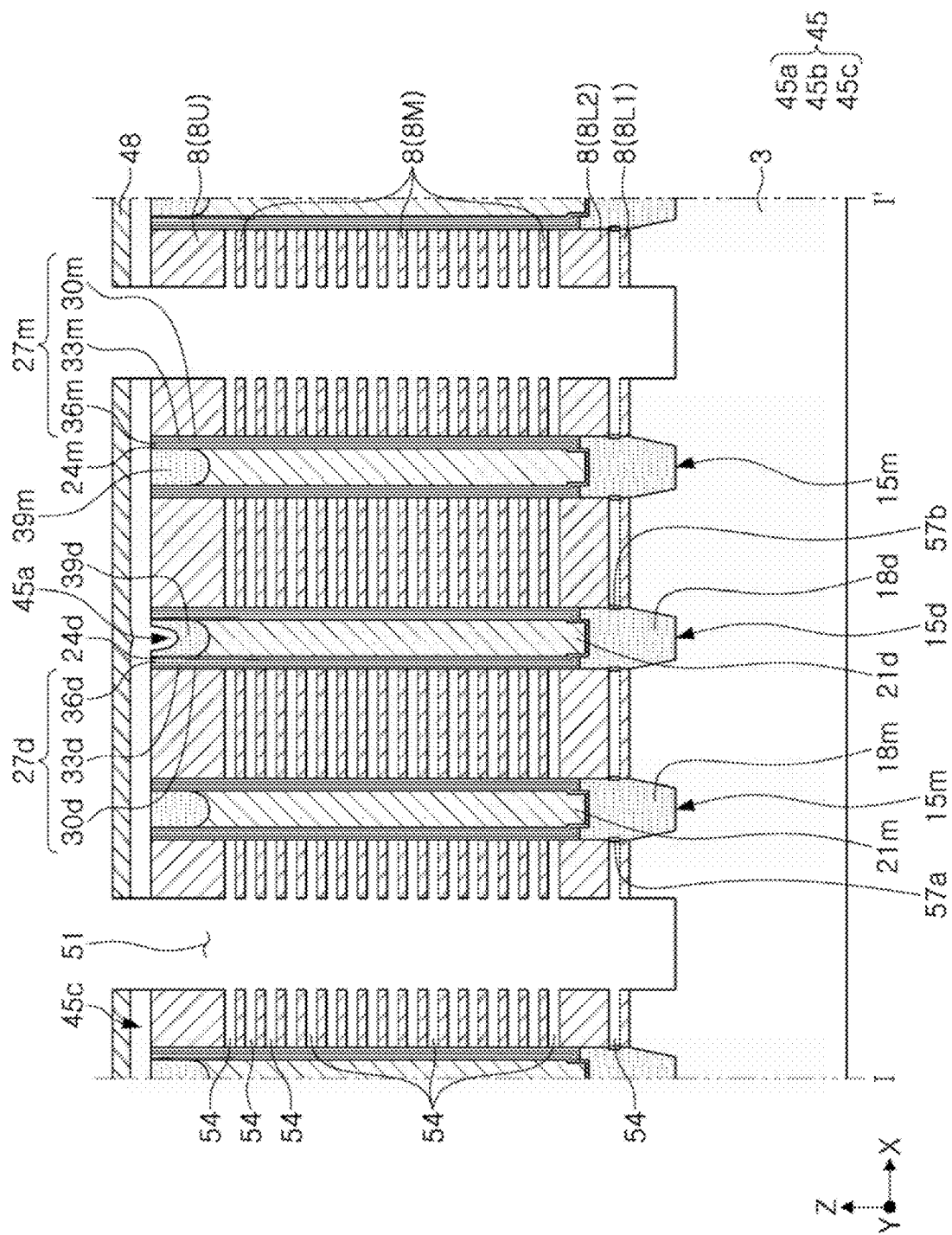
Figure 21B:
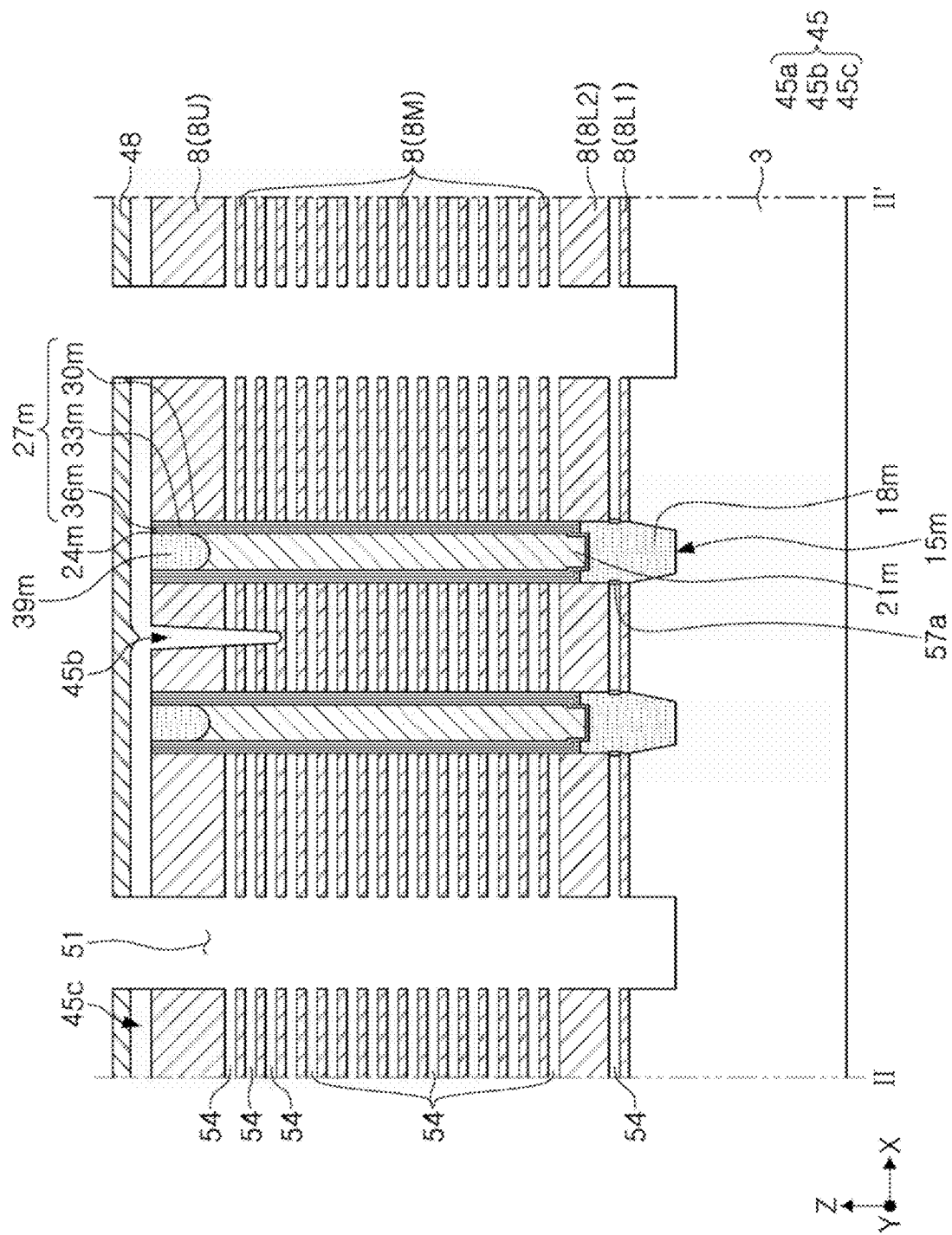
Figure 21C:
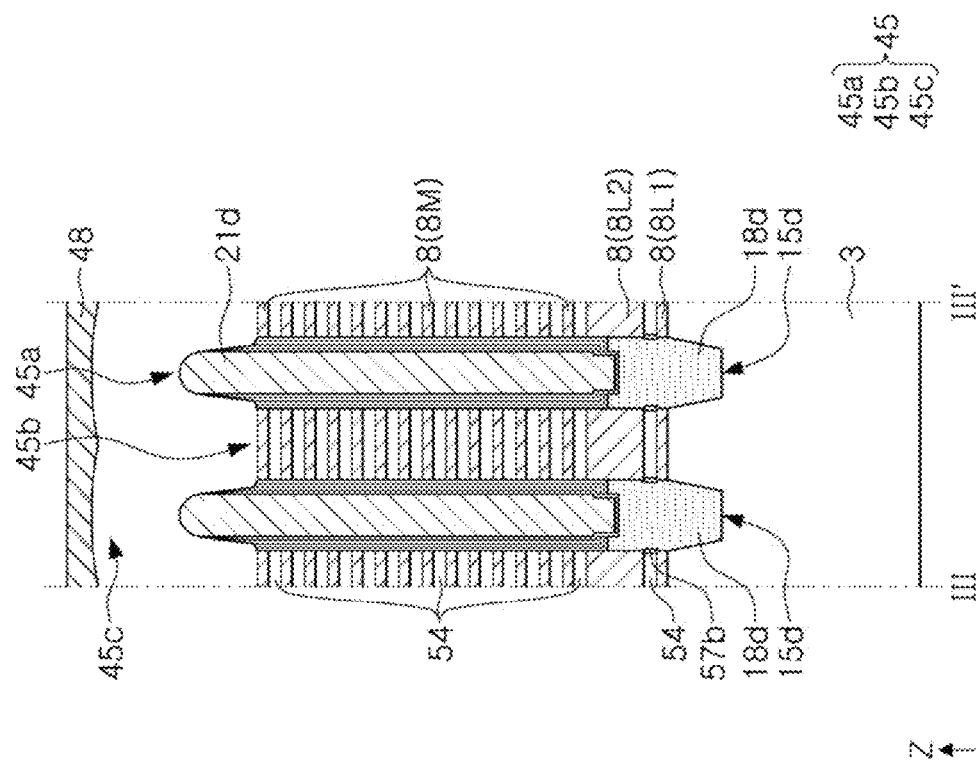
Figure 22A:
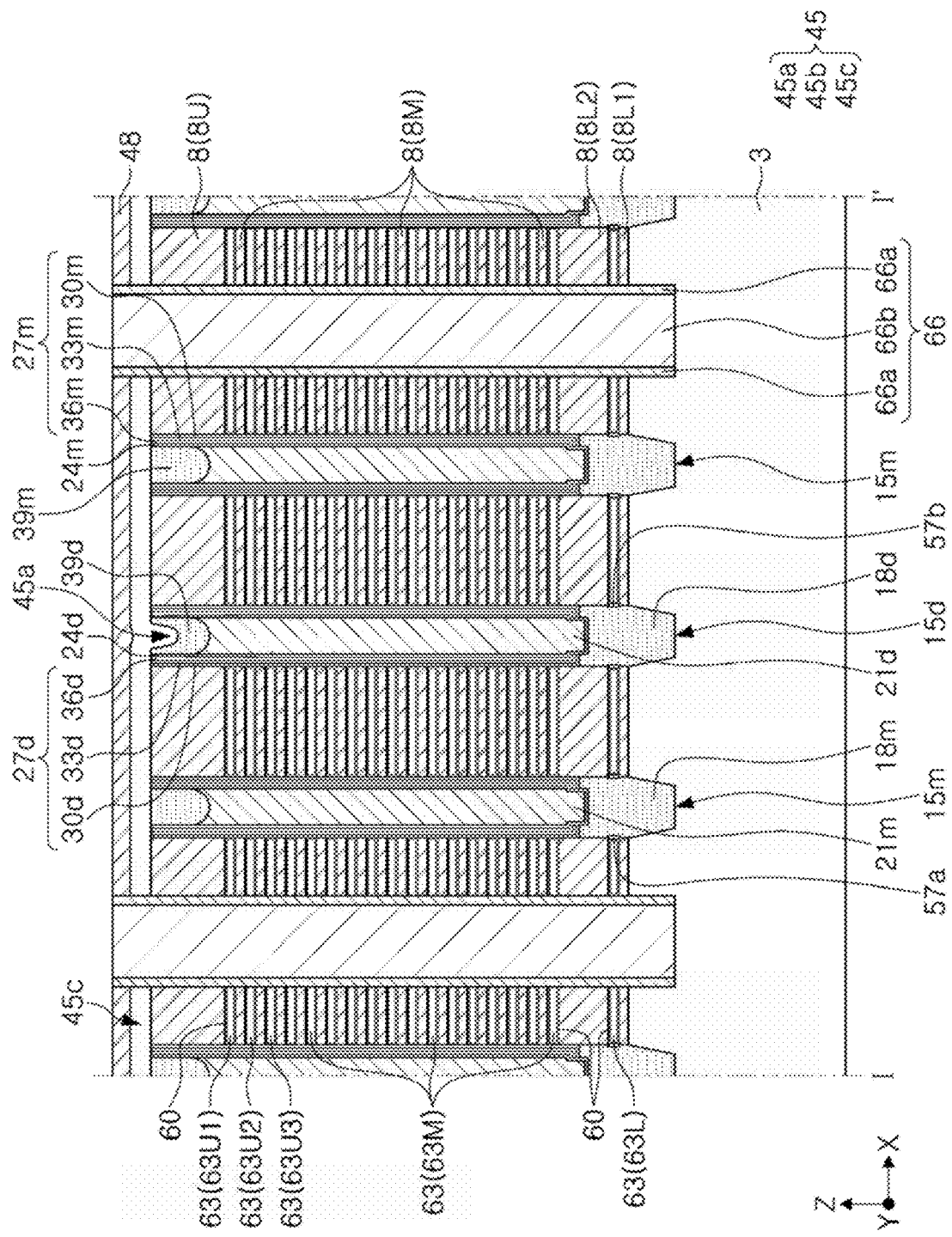
Figure 22B:
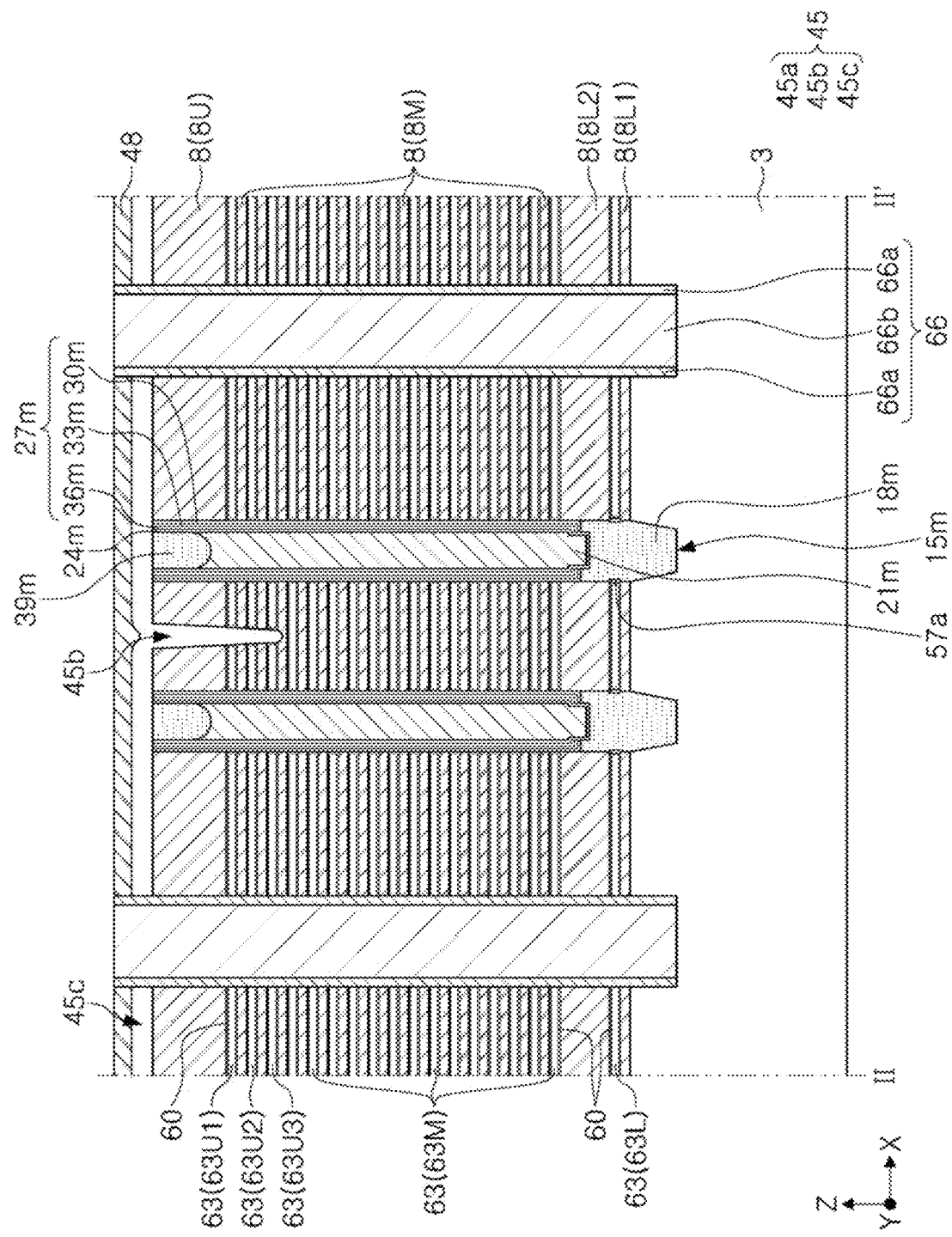
Figure 22C:
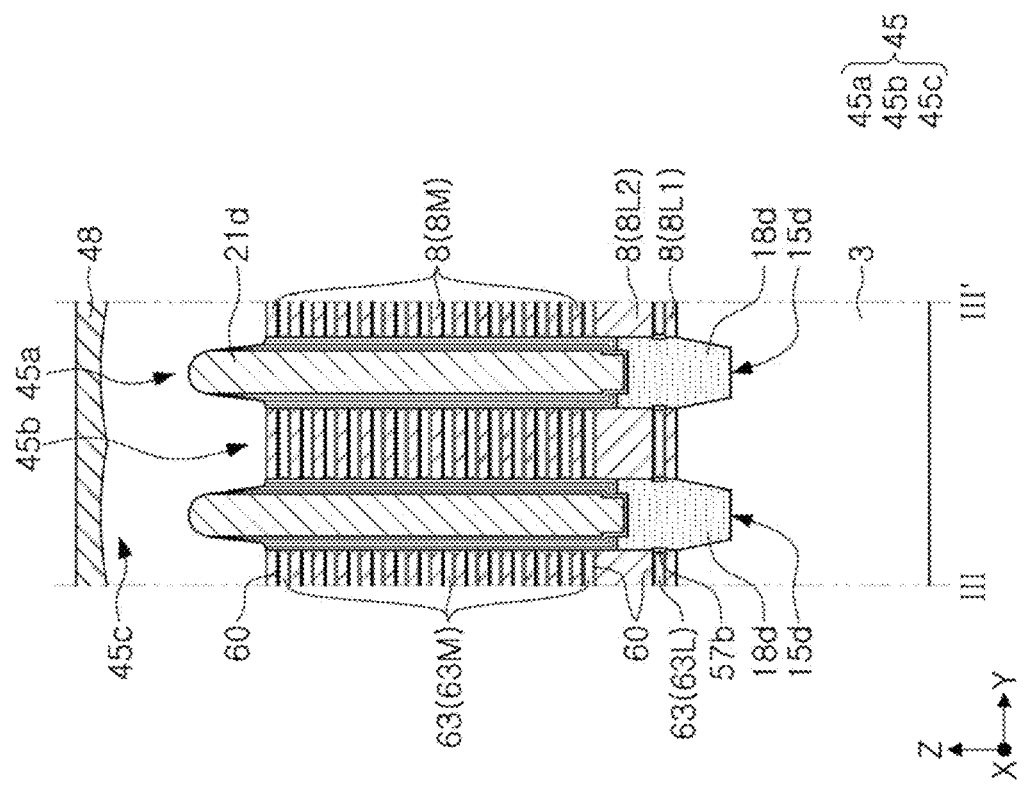

In an implementation, the vertical memory structures 15m and the vertical dummy structures 15d may serve as a support to help prevent the interlayer insulating layers from being bent or deformed by the empty spaces 54 formed while removing the mold layers (10 of FIG. 19A to 19C). Accordingly, the vertical dummy structures 15d may also be referred to as vertical support structures.

In operation S40, an oxidation process may be performed. The oxidation process may be a thermal oxidation process.

An exposed surface of the channel pattern 18m may be oxidized by the oxidation process to form a first oxide layer 57a, and a surface of the dummy channel pattern 18d may be oxidized by the oxidation process to form a second oxide layer 57b.

Oxygen used in the oxidation process may permeate through the upper separation pattern 45 exposed by the empty spaces 54, and a portion of the dummy channel layer 24d of the vertical dummy structures 15d may be oxidized by the oxidation process. Accordingly, the dummy channel layer 24d may be oxidized to have various thicknesses, as described in FIGS. 7A to 7D. The dummy channel layer 24d may be oxidized to have a thickness as in FIG. 8 by the oxidation process.

The oxidation process may cure a surface of the second dielectric layer 36m. In an implementation, as the mold layers (10 of FIGS. 19A to 19C) are removed, the surface of the second dielectric layer 36m could be damaged or the mold layers (10 of FIGS. 19A to 19C) may finely remain. The oxidation process may cure the damaged surface of the second dielectric layer 36m, or may oxidize the finely remaining mold layers (10 of FIGS. 19A to 19C) to completely remove the mold layers (10 of FIGS. 19A to 19C).

The oxidation process may help improve interfacial characteristics between the second dielectric layer 36m and the data storage layer 33m. Accordingly, data storage characteristics of the semiconductor device may be improved.

Referring to FIGS. 17, 22A, 22B, and 22C, in operation S45, gate layers may be formed. The forming of the gate layers may include forming a gate dielectric layer 60 to conformally cover internal walls of the empty spaces 54 and sequentially forming gate electrodes 63 to fill the empty spaces 54.

In operation S50, separation structures 63 may be formed. The forming of the separation structures 63 may include forming separation spacers 66a on side surfaces of the separation trenches 51 and forming separation patterns 66b to fill the separation trenches 51.

Returning to FIGS. 1 to 6 together with FIG. 17, a second upper insulating layer 69 may be formed on the separation structures 63 and the first upper insulating layer 48. In operation S55, contact plugs 72 may be formed. The contact plugs 72 may penetrate through the first and second upper insulating layers 48 and 69 and the upper portion 45c of the upper separation pattern 45, and may be in contact with the pad patterns 39m of the vertical memory structures 15m. In operation S60, an interconnection may be formed. The interconnection may include bitlines 75. The bitlines 75 may be electrically connected to the contact plugs 72.

In the above-described embodiments, to help improve characteristics of the vertical memory structures 15m, the oxidation process (40 in FIG. 17) may be performed immediately after operation S20, in which grooves (42 of FIGS. 19A to 19C) are formed to penetrate a portion of the preliminary stack structure and to intersect the vertical dummy structures 15d.

In the above-described embodiments, to help improve characteristics of the vertical memory structures 15m, the oxidation process (40 in FIG. 17) may be performed immediately after operation S25, in which the upper separation patterns (45 of FIGS. 20A to 20C) are formed to fill the groove (42 of FIGS. 19A to 19C).

Next, data storage systems including a semiconductor device according to an example embodiment will be described with reference to FIGS. 23, 24 and 25, respectively.

Figure 23:
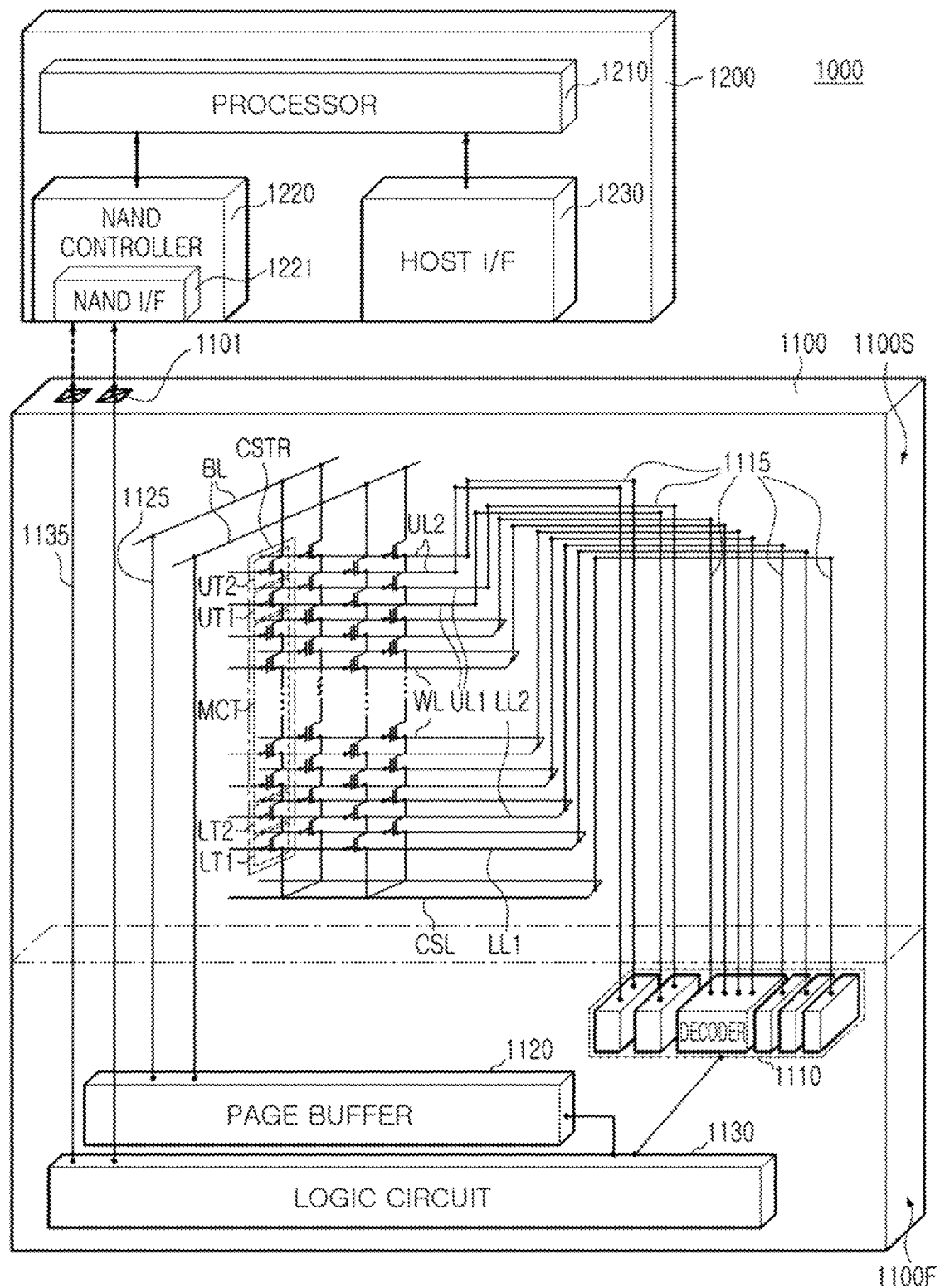
FIG. 23 is a schematic diagram of an electronic system including a semiconductor device according to an example embodiment.

FIG. 23 is a schematic diagram of an electronic system including a semiconductor device according to an example embodiment.

Referring to FIG. 23, a data storage system 1000 according to an example embodiment may include a semiconductor device 1100 and a controller 1200 electrically connected to the semiconductor device 1100. The data storage system 1000 may be implemented by a storage device including the semiconductor device 1100 or an electronic device including a storage device. In an implementation, the data storage system 1000 may be implemented by a solid state drive device (SSD), a universal serial bus (USB), a computing system, a medical device, or a communications device, including the semiconductor device 1100.

In an implementation, the data storage system 1000 may be implemented by an electronic system storing data.

The semiconductor device 1100 may be implemented by a semiconductor device described in the above-described example embodiments with reference to FIGS. 1 to 22C. The semiconductor device 1100 may include a first structure 1100F and a second structure 1100S on the first structure 1100F.

The first structure 1100F may be a peripheral circuit structure including a decoder circuit 1110, a page buffer 1120, and a logic circuit 1130.

The second structure 1100S may be a memory cell structure including a bitline BL, a common source line CSL, wordlines WL, first and second upper gate lines UL1 and UL2, first and second gate lower lines LL1 and LL2, and memory cell strings CSTR disposed between the bitline BL and the common source line CSL.

In the second structure 1100S, each of the memory cell strings CSTR may include lower transistors LT1 and LT2 adjacent to the common source line CSL, upper transistors UT1 and UT2 adjacent to the bitline BL, and a plurality of memory cell transistors MCT between the lower transistors LT1 and LT2 and the upper transistors UT1 and UT2. The number of the lower transistors LT1 and LT2 and the number of the upper transistors UT1 and UT2 may vary according to example embodiments.

In an implementation, the upper transistors UT1 and UT2 may include a string select transistor, and the lower transistors LT1 and LT2 may include a ground select transistor. The lower gate lines LL1 and LL2 may be gate electrodes of lower transistors LT1 and LT2, respectively. The wordlines WL may be gate electrodes of memory cell transistors MCT, and the gate upper lines UL1 and UL2 may be gate electrodes of the upper transistors UT1 and UT2, respectively.

The above-described gate electrodes 63 may constitute the gate lower lines LL1 and LL2, the wordlines WL, and the gate upper lines UL1 and UL2.

In an implementation, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT1 may be used for an erase operation to erase data stored in the memory cell transistors MCT based on gate induced drain leakage (GIDL).

The common source line CSL, the first and second gate lower lines LL1 and LL2, word lines WL, and the first and second gate upper lines UL1 and UL2 may be electrically connected to the decoder circuit 1110 through first connection interconnections 1115 extending from the first structure 1100F to the second structure 1100S.

The bitlines BL may be electrically connected to the page buffer 1120 through second connection interconnections 1125 extending from the first structure 1100F to the second structure 1100S. The bitlines BL may be the above-described bitlines 75.

In the first structure 1100F, the decoder circuit 1110 and the page buffer 1120 may perform a control operation on at least one select memory cell transistor of the plurality of memory cell transistors MCT. The decoder circuit 1110 and the page buffer 1120 may be controlled by a logic circuit 1130.

The semiconductor device 1100 may further include an input/output pad 1101. The semiconductor device 1100 may communicate with the controller 1200 through the input/output pad 1101 electrically connected to the logic circuit 1130. The input/output pad 1101 may be electrically connected to the logic circuit 1130 through an input/output connection line 1135 extending from the first structure 1100F to the second structure 1100S. Accordingly, the controller 1200 may be electrically connected to the semiconductor device 1100 through the input/output pad 1101 and may control the semiconductor device 1100.

The controller 1200 may include a processor 1210, a NAND controller 1220, and a host interface 1230. In an implementation, the data storage system 1000 may include a plurality of semiconductor devices 1100. In this case, the controller 1200 may control the plurality of semiconductor devices 1100.

The processor 1210 may control overall operation of the data storage system 1000 including the controller 1200. The processor 1210 may operate according to predetermined firmware and may control the NAND controller 1220 to access the semiconductor device 1100. The NAND controller 1220 may include a NAND interface 1221 for processing communication with the semiconductor device 1100. A control command for controlling the semiconductor device 1100, data to be written in the memory cell transistors MCT of the semiconductor device 1100, and data to be read from the memory cell transistors MCT of the semiconductor device 1100 may be transmitted through the NAND interface 1221. The host interface 1230 may provide a communications function between the data storage system 1000 and an external host. When a control command is received from an external host through the host interface 1230, the processor 1210 may control the semiconductor device 1100 in response to the control command.

Figure 24:
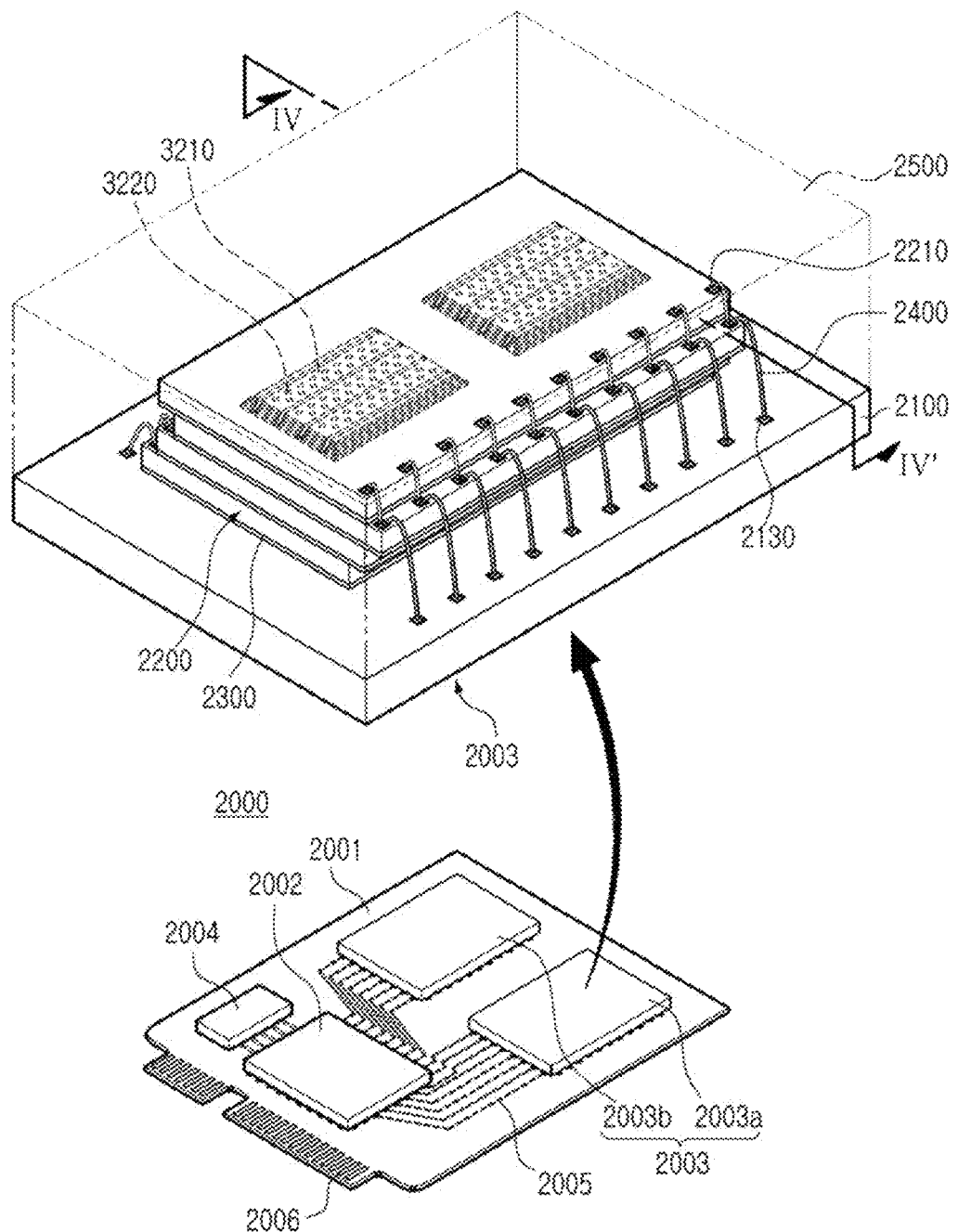
FIG. 24 is a schematic perspective view of a data storage system including a semiconductor device according to an example embodiment.

FIG. 24 is a schematic perspective view of a data storage system including a semiconductor device according to an example embodiment.

Referring to FIG. 24, a data storage system 2000 according to an example embodiment may include a main substrate 2001, a controller 2002 mounted on the main substrate 2001, one or more semiconductor packages 2003, and a DRAM 2004. The semiconductor package 2003 and the DRAM 2004 may be connected to the controller 2002 by interconnection patterns 2005 formed on the main substrate 2001.

The main substrate 2001 may include a connector 2006 including a plurality of pins coupled to an external host. The number and arrangement of the plurality of pins in the connector 2006 may vary according to a communications interface between the data storage system 2000 and the external host. In an implementation, the data storage system 2000 may communicate with an external host according to one of interfaces such as a universal serial bus (USB), peripheral component interconnect express (PCI-Express), serial advanced technology attachment (SATA), and M-PHY for universal flash storage (UFS). In example embodiments, the data storage system 2000 may operate by power supplied from an external host through the connector 2006. The data storage system 2000 may further include a power management integrated circuit (PMIC) for distributing power supplied from the external host to the controller 2002 and the semiconductor package 2003.

The controller 2002 may write data in the semiconductor package 2003 or may read data from the semiconductor package 2003, and may help improve an operation speed of the data storage system 2000.

The DRAM 2004 may be implemented by a buffer memory for reducing a difference in speed between the semiconductor package 2003, a data storage space, and an external host. The DRAM 2004 included in the data storage system 2000 may also operate as a type of cache memory and may provide a space for temporarily storing data in a control operation performed on the semiconductor package 2003. When the DRAM 2004 is included in the data storage system 2000, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200. Each of the semiconductor chips 2200 may include the semiconductor device described in one of the above-described example embodiments with reference to FIGS. 1 to 22C.

Each of the first and second semiconductor packages 2003a and 2003b may include a package substrate 2100, semiconductor chips 2200 on the package substrate 2100, adhesive layers 2300 on a lower surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be implemented by a printed circuit board (PCB) including package upper pads 2130. Each of the semiconductor chips 2200 may include an input/output pad 2210.

In an implementation, the connection structure 2400 may be configured as a bonding wire electrically connecting the input and output pad 2210 to the package upper pads 2130. Accordingly, in each of the first and second semiconductor packages 2003a and 2003b, the semiconductor chips 2200 may be electrically connected to each other by a bonding wire method and may be electrically connected to the package upper pads 2130 of the package substrate 2100. In an implementation, in each of the first and second semiconductor packages 2003a and 2003b, the semiconductor chips 2200 may be electrically connected to each other by a connection structure including a through-silicon via (TSV), rather than the connection structure 2400 of a bonding wire method.

In an implementation, the controller 2002 and the semiconductor chips 2200 may be included in a single package. In an implementation, the controller 2002 and the semiconductor chips 2200 may be mounted on an interposer substrate different from the main substrate 2001, and the controller 2002 may be connected to the semiconductor chips 2200 through an interconnection formed on the interposer substrate.

Figure 25:
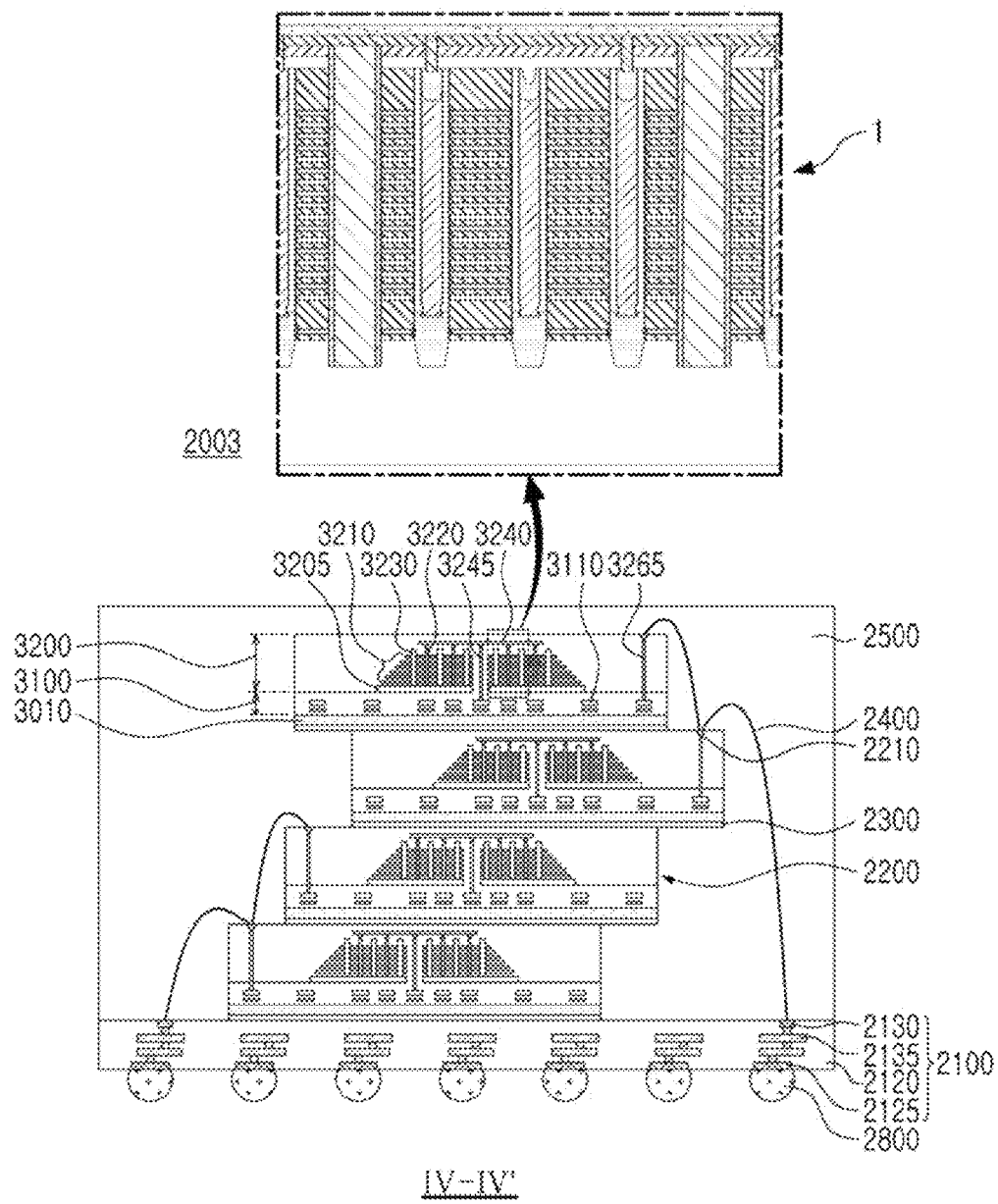
FIG. 25 is a schematic cross-sectional view of a data storage system including a semiconductor device according to an example embodiment.

FIG. 25 is a schematic cross-sectional view of a data storage system including a semiconductor device according to an example embodiment. FIG. 25 illustrates an example embodiment of the semiconductor package 2003 of FIG. 24, and conceptually illustrates a cross-sectional region of the semiconductor package 2003 illustrated in FIG. 24 taken along line III-III'.

Referring to FIG. 25, in the semiconductor package 2003, the package substrate 2100 may be configured as a printed circuit board (PCB). The package substrate 2100 may include a package substrate body portion 2120, package upper pads 2130 disposed on an upper surface of the package substrate body portion 2120, lower pads 2125 disposed on a lower surface of the package substrate body portion 2120 or exposed through the lower surface, and internal interconnections 2135 electrically connecting the package upper pads 2130 to the lower pads 2125 in the package substrate body portion 2120. The package upper pads 2130 may be electrically connected to the connection structures 2400. The lower pads 2125 may be connected to interconnection patterns 2005 of a main substrate 2001 of the data storage system 2000 through conductive connection portions 2800 as illustrated in FIG. 24.

Each of the semiconductor chips 2200 may include a semiconductor substrate 3010 and a first structure 3100 and a second structure 3200 sequentially stacked on the semiconductor substrate 3010. The first structure 3100 may include a peripheral circuit region including peripheral interconnections 3110. The second structure 3200 may include a common source line 3205, a gate stack structure 3210 on the common source line 3205, memory channel structures 3220 and separation structures 3230 penetrating through the gate stack structure 3210, bitlines 3240 electrically connected to the memory channel structures 3220, and gate connection lines electrically connected to wordlines (WL in FIG. 23) of the gate stack structure 3210 (94 of FIG. 2B). The first structure 3100 may include the first structure 1100F of FIG. 23, and the second structure 3200 may include the second structure 1100S of FIG. 23. For example, in FIG. 25, a partially enlarged region denoted by a reference numeral 1 may represent the cross-sectional structure of FIG. 2. Accordingly, each of the semiconductor chips 2200 may include the semiconductor device 1 according to one of the example embodiments described above with reference to FIGS. 1 to 22C.

Each of the semiconductor chips 2200 may include a through-interconnection 3245 electrically connected to the peripheral interconnections 3110 of the first structure 3100 and extending inwardly of the second structure 3200. The through-interconnection 3245 may penetrate through the gate stack structure 3210 and may be further disposed on an external side of the gate stack structure 3210.

Each of the semiconductor chips 2200 may further include an input/output connection line 3265, electrically connected to the peripheral interconnections 3110 of the first structure 3100 and extending inwardly of the second structure 3200, and an input/output pad 2210 electrically connected to the input/output connection line 3265.

As described above, example embodiments may provide a method of fabricating a semiconductor device, including forming vertical memory structures and vertical dummy structures, forming an upper separation pattern, and performing an oxidation process for improving characteristics of the vertical memory structures, a semiconductor device fabricated by the method, and a data storage system including the semiconductor device. The vertical dummy structures may be formed under the same conditions as the vertical memory structures before forming the upper separation pattern, and the vertical dummy structures may be stably formed without defects such as warpage, and the like. Thus, reliability and durability of the semiconductor device may be improved. In addition, after forming the upper separation pattern, the oxidation process for improving characteristics of the vertical memory structures may be performed to help improve data storage characteristics of the semiconductor device, e.g., performance of the semiconductor device.

One or more embodiments may provide a semiconductor device exhibiting improved integration density and reliability.

One or more embodiments may provide a semiconductor device exhibiting improved performance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate structure;
   a stack structure on the substrate structure and including interlayer insulating layers and gate electrodes alternately and repeatedly stacked in a vertical direction that is perpendicular to an upper surface of the substrate structure;
   a vertical memory structure penetrating through the stack structure in the vertical direction;
   a vertical dummy structure penetrating through the stack structure in the vertical direction; and
   an upper separation pattern on the stack structure, the upper separation pattern extending in a first direction parallel to the upper s face of the substrate structure and including a first portion and a second portion, the first portion intersecting the vertical dummy structure and the second portion extending from the first portion in the first direction and penetrating through a portion of the stack structure,
   wherein:
   the second portion of the upper separation pattern penetrates through a plurality of the gate electrodes, the vertical memory structure includes an insulating region, a channel layer on a side surface of the insulating region, a first dielectric layer on an external side surface of the channel layer, a data storage layer on an external side surface of the first dielectric layer, a second dielectric layer on an external side surface of the data storage layer, and a pad pattern on the insulating region, the vertical dummy structure includes a dummy insulating region, a dummy channel layer on a side surface of the dummy insulating region, a first dummy dielectric layer on an external side surface of the dummy channel layer, a dummy data storage layer on an external side surface of the first dummy dielectric layer, a second dummy dielectric layer on an external side surface of the dummy data storage layer, and a dummy pad pattern on the dummy insulating region, and when viewed in a plan view at a first height level, higher than a height level of a lowermost end of the upper separation pattern, the dummy channel layer includes a first dummy channel region facing the dummy data storage layer and a second dummy channel region facing the dummy data storage layer, so that the dummy channel layer at the first dummy channel region has a horizontal thickness different from a horizontal thickness of the dummy channel layer at the second dummy channel region.

2. The semiconductor device as claimed in claim 1, wherein, when viewed in the plan view at the first height level:
the thickness of the dummy channel layer at the first dummy channel region is smaller than the thickness of the dummy channel layer at the second dummy channel region, and
a distance between the first dummy channel region and the upper separation pattern is smaller than a distance between the second dummy channel region and the upper separation pattern.

3. The semiconductor device as claimed in claim 1, wherein, when viewed in the plan view at the first height level, the first dummy dielectric layer includes a first dummy dielectric region and a second dummy dielectric region between the dummy data storage layer and the dummy channel layer, the first dummy dielectric region having a horizontal thickness different from a horizontal thickness of the second dummy dielectric region.

4. The semiconductor device as claimed in claim 3, wherein:
the horizontal thickness of the first dummy dielectric region is greater than the horizontal thickness of the second dummy dielectric region; and
a distance between the first dummy dielectric region and the upper separation pattern is smaller than a distance between the second dummy dielectric region and the upper separation pattern.

5. The semiconductor device as claimed in claim 1, wherein, when viewed in the plan view at the first height level:
the dummy data storage layer is divided into dummy data storage portions spaced apart from each other in a second direction by the upper separation pattern,
the second direction is parallel to the upper surface of the substrate structure and is perpendicular to the first direction, and
the dummy data storage layer has a substantially uniform horizontal thickness.

6. The semiconductor device as claimed in claim 1, wherein, when viewed in the plan view at the first height level, the channel layer of the vertical memory structure has a substantially uniform horizontal thickness.

7. The semiconductor device as claimed in claim 1, wherein, when viewed in the plan view at the first height level:
the horizontal thickness of the dummy channel layer at the second dummy channel region is greater than the horizontal thickness of the dummy channel layer at the first dummy channel region, and
a horizontal thickness of the channel layer of the vertical memory structure is greater than the horizontal thickness of the dummy channel layer at the second dummy channel region.

8. The semiconductor device as claimed in claim 1, wherein, when viewed in the plan view at the first height level:
the first dummy dielectric layer includes regions having different horizontal thicknesses between the dummy data storage layer and the dummy channel layer,
the first dielectric layer of the vertical memory structure has a substantially uniform horizontal thickness, and
a maximum horizontal thickness of the first dummy dielectric layer is greater than a horizontal thickness of the first dielectric layer of the vertical memory structure.

9. The semiconductor device as claimed in claim 1, wherein, when viewed in the plan view at the first height level:
the dummy channel layer includes a first dummy channel portion and a second dummy channel portion spaced apart from each other in a second direction,
the second direction is parallel to the upper surface of the substrate structure and is perpendicular to the first direction, and
at least one of the first dummy channel portion and the second dummy channel portion includes the first dummy channel region and the second dummy channel region.

10. The semiconductor device as claimed in claim 9, wherein, when viewed in the plan view at a second height level, the second height level being higher than the height level of the lowermost end of the upper separation pattern and lower than the first height level:
the dummy channel layer has a ring shape,
the dummy channel layer includes a third dummy channel region disposed in the first direction from a center of the vertical dummy structure and a fourth dummy channel region disposed in a second direction from the center of the vertical dummy structure,
the second direction is perpendicular to the first direction, and
a horizontal thickness of the dummy channel layer at the fourth dummy channel region is greater than a horizontal thickness of the dummy channel layer at the third dummy channel region.

11. The semiconductor device as claimed in claim 1, wherein at least a portion of the dummy pad pattern is divided into pad portions spaced apart from each other in a second direction, perpendicular to the first direction, by the first portion of the upper separation pattern.

12. The semiconductor device as claimed in claim 1, wherein:
the upper separation pattern further includes an upper portion covering an upper surface of the stack structure, and the first portion, the second portion, and the upper portion are integrated with each other.

13. The semiconductor device as claimed in claim 1, further comprising:
a first oxide layer;
a second oxide layer;
separation structures;
a bitline contact plug;
a bitline; and
a gate dielectric layer covering an upper surface and a lower surface of each of the gate electrodes and interposed between the vertical memory structure and the gate electrodes, between the vertical dummy structure and the gate electrodes, and between the upper separation pattern and the gate electrodes,
wherein:
the substrate structure is a semiconductor substrate,
the vertical memory structure further includes a channel pattern in contact with the semiconductor substrate, extending upwardly, and in contact with the channel layer,
the vertical dummy structure further includes a dummy channel pattern in contact with the semiconductor substrate, extending upwardly, and in contact with the dummy channel layer,
upper surfaces of the channel pattern and the dummy channel pattern are at a first height level higher than a height level of a lowermost gate electrode,
the first oxide layer is in contact with the channel pattern and between the lowermost gate electrode and the channel pattern,
the second oxide layer is in contact with the dummy channel pattern and between the lowermost gate electrode and the dummy channel pattern,
the separation structures penetrate through the stack structure and extend in the first direction,
the upper separation pattern, the vertical memory structure, and the vertical dummy structure are between the separation structures,
the bitline contact plug is in contact with the pad pattern of the vertical memory structure, and
the bitline is electrically connected to the bitline contact plug.

14. The semiconductor device as claimed in claim 1, wherein:
the substrate structure includes a semiconductor substrate, a peripheral circuit region on the semiconductor substrate, and an upper substrate on the peripheral circuit region;
the upper substrate includes at least one silicon layer; and
the vertical memory structure and the vertical dummy structure are in contact with the at least one silicon layer.

15. The semiconductor device as claimed in claim 1, further comprising an upper semiconductor chip on the stack structure,
wherein:
the upper semiconductor chip includes a semiconductor substrate and a peripheral circuit region below the semiconductor substrate; and
the peripheral circuit region is between the semiconductor substrate and the stack structure.

16. A semiconductor device, comprising:
a substrate structure;
a stack structure on the substrate structure and including interlayer insulating layers and gate electrodes alternately and repeatedly stacked in a vertical direction that is perpendicular to an upper surface of the substrate structure;
a vertical memory structure penetrating through the stack structure in the vertical direction;
a vertical dummy structure penetrating through the stack structure in the vertical direction;
an upper separation pattern on the stack structure, the upper separation pattern including a first portion and a second portion extending in a first direction, parallel to the upper surface of the substrate structure, the first portion intersecting the vertical dummy structure and the second portion extending from the first portion and penetrating through a portion of the stack structure;
a contact plug in contact with the vertical memory structure and on the vertical memory structure; and
a bitline electrically connected to the contact plug and on the contact plug,
wherein:
the second portion of the upper separation pattern penetrates through each of a plurality of upper gate electrodes of the gate electrodes,
the vertical memory structure includes an insulating region, a channel layer contacting a side surface of the insulating region, a first dielectric layer on-contacting an external side surface of the channel layer, a data storage layer on an external side surface of the first dielectric layer, a second dielectric layer on an external side surface of the data storage layer, and a pad pattern on the insulating region,
the vertical dummy structure includes a dummy insulating region, a dummy channel layer contacting a side surface of the dummy insulating region, a first dummy dielectric layer contacting an external side surface of the dummy channel layer, a dummy data storage layer on an external side surface of the first dummy dielectric layer, a second dummy dielectric layer on an external side surface of the dummy data storage layer, and a dummy pad pattern on the dummy insulating region, and
when viewed in a plan view at a first height level higher than a height level of a lowermost surface of a lowermost one of the plurality of upper gate electrodes, and lower than a height level of a lowermost surface of the pad pattern, a horizontal thickness of the dummy channel layer of the vertical dummy structure is smaller than a horizontal thickness of the channel layer of the vertical memory structure.

17. The semiconductor device as claimed in claim 16, wherein, when viewed in the plan view at the first height level:
the dummy data storage layer includes dummy data storage portions spaced apart from each other in a second direction, perpendicular to the first direction,
the dummy channel layer includes dummy channel portions spaced apart from each other in the second direction, and
at least one of the dummy channel portions includes a dummy channel region having a gradually increased width.

18. The semiconductor device as claimed in claim 16, wherein, when viewed e plan view at the first height level:
the dummy channel layer of the vertical dummy structure includes a first dummy channel region having a first minimum horizontal thickness and a second dummy channel region having a first maximum horizontal thickness, the channel layer has a substantially uniform horizontal thickness, and the first maximum horizontal thickness of the second dummy channel region is smaller than the horizontal thickness of the channel layer of the vertical memory structure.

19. The semiconductor device as claimed in claim 18, wherein, at a second height level that is higher than a height level of a lowermost surface of a lowermost one of the upper gate electrodes, and that is higher than the first height level:

the dummy channel layer has a ring shape, the dummy channel layer includes a third dummy channel region having a second minimum horizontal thickness and a fourth dummy channel region having a second maximum horizontal thickness, and the second minimum horizontal thickness of the third dummy channel region is greater than the first minimum horizontal thickness of the first dummy channel region.

20. A data storage system, comprising:

a semiconductor device including an input/output pad; and a controller electrically connected to the semiconductor device through the input/output pad and configured to control the semiconductor device, wherein:

the semiconductor device includes:

a substrate structure, a stack structure on the substrate structure and including interlayer insulating layers and gate electrodes alternately and repeatedly stacked in a vertical direction, perpendicular to an upper surface of the substrate structure, a vertical memory structure penetrating through the stack structure in the vertical direction, a vertical dummy structure penetrating through the stack structure in the vertical direction, an upper separation pattern on the stack structure, the upper separation pattern extending in a first direction parallel to the sort of the substrate structure and including a first portion and a second portion, the first portion intersecting the vertical dummy structure and the second portion extending in the first direction from the first portion and penetrating through a portion of the stack structure, a contact plug in contact with the vertical memory structure and on the vertical memory structure, and a bitline electrically connected to the contact plug and on the contact plug, the second portion of the upper separation pattern penetrates through each of a plurality of upper gate electrodes of the gate electrodes, the vertical memory structure includes an insulating region, a channel layer on a side surface of the insulating region, a first dielectric layer on an external side surface of the channel layer, a data storage layer on an external side surface of the first dielectric layer, a second dielectric layer on an external side surface of the data storage layer, and a pad pattern on the insulating region, the vertical dummy structure includes a dummy insulating region, a dummy channel layer on a side surface of the dummy insulating region, a first dummy dielectric layer on an external side surface of the dummy channel layer, a dummy data storage layer on an external side surface of the first dummy dielectric layer, a second dummy dielectric layer on an external side surface of the dummy data storage layer, and a dummy pad pattern on the dummy insulating region, when viewed in a plan view at a first height level that is higher than a height level of a lowermost surface of a lowermost one of the plurality of upper gate electrodes, and lower than a height level of a lowermost surface of the pad pattern, the dummy channel layer of the vertical dummy structure includes a first dummy channel region having a first minimum horizontal thickness and a second dummy channel region having a first maximum horizontal thickness, when viewed in the plan view at the first height level, the channel layer has a substantially uniform horizontal thickness, and the first maximum horizontal thickness of the dummy channel layer at the second dummy channel region is smaller than the horizontal thickness of the channel layer of the vertical memory structure.

* * * * *